United States Patent
Matsumoto

(10) Patent No.: US 11,545,339 B2
(45) Date of Patent: Jan. 3, 2023

(54) MULTI-CHARGED PARTICLE BEAM WRITING APPARATUS, AND MULTI-CHARGED PARTICLE BEAM WRITING METHOD

(71) Applicant: NuFlare Technology, Inc., Yokohama (JP)

(72) Inventor: Hiroshi Matsumoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 351 days.

(21) Appl. No.: 16/654,155

(22) Filed: Oct. 16, 2019

(65) Prior Publication Data
US 2020/0135428 A1    Apr. 30, 2020

(30) Foreign Application Priority Data
Oct. 30, 2018  (JP) .............................. JP2018-204059

(51) Int. Cl.
*H01J 37/317*  (2006.01)
*H01L 21/027*  (2006.01)
(Continued)

(52) U.S. Cl.
CPC ...... *H01J 37/3177* (2013.01); *G03F 7/70016* (2013.01); *H01J 37/141* (2013.01);
(Continued)

(58) Field of Classification Search
CPC ...... H01J 37/3023; H01J 37/141; H01J 37/24; H01J 37/3177; H01J 2237/14;
(Continued)

(56) References Cited

U.S. PATENT DOCUMENTS

2005/0072941 A1    4/2005  Tanimoto et al.
2013/0137044 A1*   5/2013  Ito ........................ B82Y 40/00
                                                          250/397
(Continued)

FOREIGN PATENT DOCUMENTS

JP    2005-116743 A    4/2005
JP    2005-311393 A    11/2005
(Continued)

OTHER PUBLICATIONS

Korean Office Action dated Jan. 7, 2021 in Korean Patent Application No. 10-2019-0134486 (with English translation), 14 pages.
(Continued)

*Primary Examiner* — David E Smith
(74) *Attorney, Agent, or Firm* — Oblon, McClelland, Maier & Neustadt, L.L.P.

(57) ABSTRACT

A multi-charged particle beam writing apparatus according to one aspect of the present invention includes a region setting unit configured to set, as an irradiation region for a beam array to be used, the region of the central portion of an irradiation region for all of multiple beams of charged particle beams implemented to be emittable by a multiple beam irradiation mechanism, and a writing mechanism, including the multiple beam irradiation mechanism, configured to write a pattern on a target object with the beam array in the region of the central portion having been set in the multiple beams implemented.

4 Claims, 29 Drawing Sheets

(51) Int. Cl.
*H01J 37/302* (2006.01)
*H01J 37/141* (2006.01)
*H01J 37/24* (2006.01)
*G03F 7/20* (2006.01)

(52) U.S. Cl.
CPC .......... *H01J 37/24* (2013.01); *H01J 37/3023* (2013.01); *H01L 21/0277* (2013.01); *H01J 2237/14* (2013.01); *H01J 2237/30472* (2013.01); *H01J 2237/31754* (2013.01); *H01J 2237/31762* (2013.01); *H01J 2237/31774* (2013.01)

(58) Field of Classification Search
CPC ... H01J 2237/30472; H01J 2237/31754; H01J 2237/31762; H01J 2237/31774; G03F 7/70016; H01L 21/0277
See application file for complete search history.

(56) References Cited

U.S. PATENT DOCUMENTS

| | | | |
|---|---|---|---|
| 2015/0155138 A1* | 6/2015 | Yoshikawa | H01J 37/3023 250/492.3 |
| 2017/0047194 A1* | 2/2017 | Yoshikawa | H01J 37/243 |
| 2017/0301506 A1 | 10/2017 | Matsumoto | |

FOREIGN PATENT DOCUMENTS

| | | |
|---|---|---|
| JP | 2001-168014 A | 6/2011 |
| JP | 2014-49545 A | 3/2014 |
| JP | 2015-35489 A | 2/2015 |
| JP | 2016-207780 A | 12/2016 |
| JP | 2017-191900 A | 10/2017 |
| KR | 10-2015-0001632 | 1/2015 |
| KR | 10-2015-0087812 A | 7/2015 |
| KR | 10-2017-0032208 A | 3/2017 |
| TW | 201810341 A | 3/2018 |

OTHER PUBLICATIONS

Combined Taiwanese Office Action and Search Report dated Dec. 23, 2020 in Patent Application No. 108136223 (with English machine translation), 19 pages.

Notification of Reason for Refusal dated Jan. 4, 2022 in Korean Patent Application No. 10-2021-0135833 (with English machine translation), 11 pages.

Japanese Office Action dated Jun. 14, 2022 in Japanese Patent Application No. 2018-204059 (with unedited computer generated English translation), 8 pages.

Office Action dated Jun. 29, 2022 in Korean Application No. 10-2021-0135833, along with a machine English translation.

Office Action dated Oct. 28, 2022 in Korean Application No. 10-2021-0135833, along with an English translation.

* cited by examiner

Use Region

Use Region

Restrict Region

| The Number of Beams | Lens Control Value 1 | Lens Control Value 2 |
|---|---|---|
| 1 | F11 | F21 |
| 2 | F12 | F22 |
| ⋮ | ⋮ | ⋮ |
| N | F1n | F2n |

FIG.16

| No. | k' | tk' |
|---|---|---|
| 1 | 9 | 512Δ |
| 2 | 8 | 256Δ |
| 3 | 7 | 128Δ |
| 4 | 6 | 64Δ |
| 5 | 5 | 32Δ |
| 6 | 4 | 16Δ |
| 7 | 3 | 8Δ |
| 8 | 2 | 4Δ |
| 9 | 1 | 2Δ |
| 10 | 0 | Δ |

FIG.20

MULTI-CHARGED PARTICLE BEAM WRITING APPARATUS, AND MULTI-CHARGED PARTICLE BEAM WRITING METHOD

CROSS-REFERENCE TO RELATED APPLICATION

This application is based upon and claims the benefit of priority from prior Japanese Patent Application No. 2018-204059 filed on Oct. 30, 2018 in Japan, the entire contents of which are incorporated herein by reference.

BACKGROUND OF THE INVENTION

Field of the Invention

Embodiments of the present invention relate to a multi-charged particle beam writing apparatus and a multi-charged particle beam writing method, and, for example, relate to a beam irradiation method in multi-beam writing.

Description of Related Art

The lithography technique which advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. The electron beam writing technique, which intrinsically has excellent resolution, is used for writing or "drawing" patterns on a wafer and the like with electron beams.

For example, as a known example of employing the electron beam writing technique, there is a writing apparatus using multiple beams. Since it is possible for multi-beam writing to apply multiple beams at a time, the writing throughput can be greatly increased in comparison with single electron beam writing. For example, a writing apparatus employing the multi-beam system forms multiple beams by letting portions of an electron beam emitted from an electron gun individually pass through a corresponding one of a plurality of holes in a mask, performs blanking control for each beam, reduces each unblocked beam by an optical system, and deflects it by a deflector to irradiate a desired position on a target object or "sample".

In multi-beam writing, the dose of each beam is individually controlled based on the irradiation time. The control circuit which performs such an individual control is included in a blanking aperture array apparatus mounted in the body of the writing apparatus. In multi-beam writing, for further improving the throughput, it is assumed to be necessary to increase the current density so as to reduce the irradiation time of each beam. However, when the total current amount of multiple beams applied by simultaneous irradiation increases, there is a problem that so-called blurring and/or positional deviation of an image of the multiple beams occurs due to the Coulomb effect, thereby degrading the writing accuracy.

Thus, there is a trade-off relation between the throughput and the writing accuracy. In the writing apparatus, processing for increasing the throughput, required even at the cost of the writing accuracy, and processing for increasing the writing accuracy, required even at the cost of the throughput, are intermingled.

Here, a method is proposed that groups the beam arrays, and shifts the beam irradiation timing of each group while collectively transmitting exposure time control signals for the whole beam arrays to a blanking aperture array apparatus including a control circuit to control the dose of an individual beam (e.g., refer to Japanese Patent Application Laid-open (JP-A) No. 2017-191900). According to this method, since the transmission time is not long, it is possible to suppress the current amount per shot while reducing the decrease of the throughput. However, with the recent tendency to form micropatterns, it is required to develop a method for higher writing accuracy than the accuracy currently obtained.

BRIEF SUMMARY OF THE INVENTION

According to one aspect of the present invention, a multi-charged particle beam writing apparatus includes a region setting circuit configured to set, as an irradiation region for a beam array to be used, a region of a central portion of an irradiation region for all of multiple beams of charged particle beams implemented to be emittable by a multiple beam irradiation mechanism; and a writing mechanism that includes the multiple beam irradiation mechanism, configured to write a pattern on a target object with the beam array in the region of the central portion having been set in the multiple beams implemented.

According to another aspect of the present invention, a multi-charged particle beam writing apparatus includes a shot data generation circuit, provided relating to a first beam array of charged particle beams implemented to be emittable by a multiple beam irradiation mechanism, configured to generate shot data for a second beam array whose number of beams is smaller than that of the first beam array implemented;

a transfer circuit configured to transfer, in order of shot, the shot data for the second beam array whose number of beams is smaller than that of the first beam array implemented;

a plurality of registers, each arranged for a corresponding beam of the first beam array, each configured to store shot data of the corresponding beam; and a writing mechanism that includes the multiple beam irradiation mechanism, configured to write a pattern on a target object by performing shots of the second beam array, wherein each register of registers, in the plurality of registers, for the second beam array stores shot data for an n-th shot of the second beam array, and simultaneously, each register of registers, in the plurality of registers, for a third beam array, which is other than the second beam array in the first beam array, stores at least a part of shot data for an (n+1)th shot of the second beam array, and in a case of the n-th shot having been completed, the shot data for the (n+1)th shot is shifted at least from the each register for the third beam array to the each register for the second beam array.

According to yet another aspect of the present invention, a multi-charged particle beam writing apparatus includes a region dividing circuit configured to divide an irradiation region for all of multiple beams of charged particle beams implemented to be emittable by a multiple beam irradiation mechanism into a plurality of regions;

a lens control circuit configured to change a lens control value of an electromagnetic lens for refracting the multiple beams, based on a number of beams in a divided region of the plurality of regions; and a writing mechanism that includes the multiple beam irradiation mechanism and the electromagnetic lens, configured to write a pattern on a target object by performing irradiation with a beam array in a divided region, using the electromagnetic lens whose lens control value has been changed based on the number of beams, while shifting an irradiation timing for each divided region.

According to yet another aspect of the present invention, a multi-charged particle beam writing method includes setting, as an irradiation region of a beam array to be used, a region of a central portion of an irradiation region of all of multiple beams of charged particle beams implemented to be emittable by a multiple beam irradiation mechanism; and writing a pattern on a target object with the beam array in the region of the central portion having been set in the multiple beams implemented.

According to yet another aspect of the present invention, a multi-charged particle beam writing method includes generating, relating to a first beam array of charged particle beams implemented to be emittable by a multiple beam irradiation mechanism, shot data for a second beam array whose number of beams is smaller than that of the first beam array implemented to emit charged particle beams by the multiple beam irradiation mechanism; transferring, in order of shot, the shot data for the second beam array whose number of beams is smaller than that of the first beam array implemented;

storing shot data for an n-th shot having been transferred in each register of registers for the second beam array in a plurality of registers each arranged for a corresponding beam of the first beam array, and simultaneously, storing at least a part of shot data for an (n+1)th shot in each register of registers, in the plurality of registers, for a third beam array which is other than the second beam array in the first beam array;

writing a pattern on a target object by performing the n-th shot of the second beam array; and shifting, in a case of the n-th shot having been completed, the shot data for the (n+1)th shot at least from the each register for the third beam array to the each register for the second beam array.

BRIEF DESCRIPTION OF THE DRAWINGS

FIG. 16 shows an example of a lens control value table according to the first embodiment;

FIG. 20 shows an example of digit numbers of a plurality of divided shots and their corresponding irradiation time according to the second embodiment;

DETAILED DESCRIPTION OF THE INVENTION

Embodiments below describe a writing apparatus and method that can suppress degradation of writing accuracy due to the Coulomb effect, while suppressing throughput degradation.

Embodiments below describe a configuration in which an electron beam is used as an example of a charged particle beam. The charged particle beam is not limited to the electron beam, and other charged particle beam such as an ion beam may also be used.

First Embodiment

Figure 1:
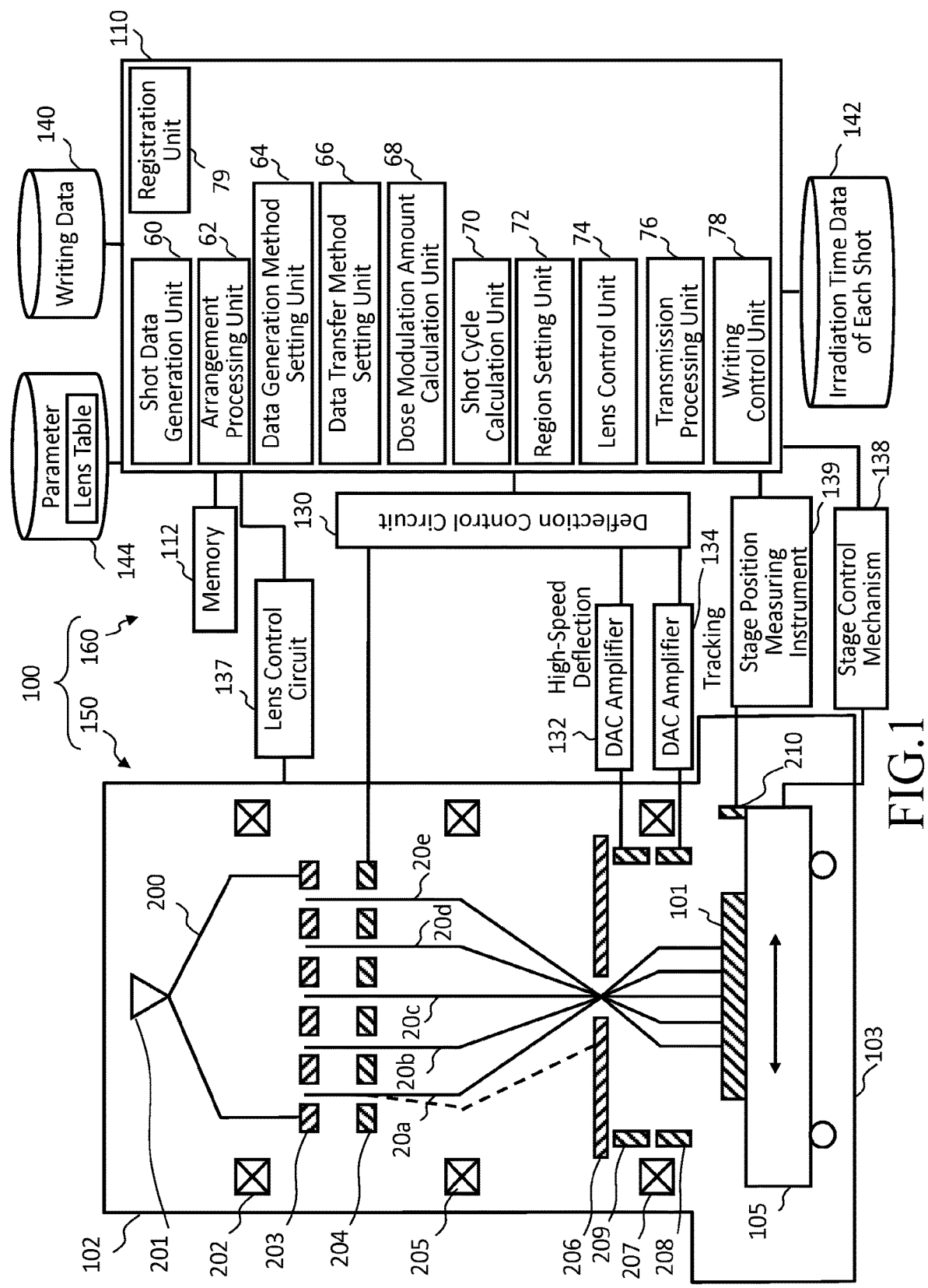
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 (multi-beam irradiation mechanism) and a control system circuit 160. The writing apparatus 100 is an example of a multi-charged particle beam writing apparatus. The writing mechanism 150 includes an electron optical column 102 and a writing chamber 103. In the electron optical column 102, there are disposed an electron gun 201, an illumination lens 202, a shaping aperture array substrate 203, a blanking aperture array mechanism 204, a reducing lens 205, a limiting aperture substrate 206, an objective lens 207, and deflectors 208 and 209. In the writing chamber 103, an XY stage 105 is disposed. On the XY stage 105, a target object or "sample" 101 such as a mask serving as a writing target substrate is placed when writing (exposure) is performed. The target object 101 is, for example, an exposure mask used when fabricating semiconductor devices, or a semiconductor substrate (silicon wafer) for fabricating semiconductor devices. Moreover, the target object 101 may be, for example, a mask blank on which resist has been applied and nothing has yet been written. Further, on the XY stage 105, a mirror 210 for measuring the position of the XY stage 105 is placed. An electromagnetic lens is used as the illumination lens 202, the reducing lens 205, and the objective lens 207. Each electromagnetic lens refracts multiple beams (electron beams).

The control system circuit 160 includes a control computer 110, a memory 112, a deflection control circuit 130, DAC (digital-analog converter) amplifier units 132 and 134, a lens control circuit 137, a stage control mechanism 138, a stage position measuring instrument 139, and storage devices 140, 142, and 144 such as magnetic disk drives. The control computer 110, the memory 112, the deflection control circuit 130, the lens control circuit 137, the stage control mechanism 138, the stage position measuring instrument 139, and the storage devices 140, 142, and 144 are connected with each other through a bus (not shown). Writing data is input from the outside of the writing apparatus 100 into the storage device 140 (storage unit) and stored therein. The deflection control circuit 130 is connected to the DAC amplifier circuits 132 and 134, and the blanking aperture array mechanism 204 through a bus (not shown). The stage position measuring instrument 139 irradiates the mirror 210 on the XY stage 105 with a laser beam, and receives a reflected light from the mirror 210. Then, using information of the reflected light, the stage position measuring instrument 139 measures the position of the XY stage 105. The lens control circuit 137 controls each electromagnetic lens, using a lens control value.

In the control computer 110, there are arranged a shot data generation unit 60, an array processing unit 62, a data generation method setting step 64, a data transfer method setting unit 66, a dose modulation amount calculation unit 68, a shot cycle calculation unit 70, a region setting unit 72, a lens control unit 74, a transfer processing unit 76, a writing control unit 78, and a registration unit 79. Each of the " . . . units" such as the shot data generation unit 60, the array processing unit 62, the data generation method setting step 64, the data transfer method setting unit 66, the dose modulation amount calculation unit 68, the shot cycle calculation unit 70, the region setting unit 72, the lens control unit 74, the transfer processing unit 76, the writing control unit 78, and the registration unit 79 includes processing circuitry. As the processing circuitry, for example, an electric circuit, computer, processor, circuit board, quantum circuit, or semiconductor device is used. Each " . . . unit" may use common processing circuitry (the same processing circuitry), or different processing circuitry (separate processing circuitry).

Information input/output to/from the shot data generation unit 60, the array processing unit 62, the data generation method setting step 64, the data transfer method setting unit 66, the dose modulation amount calculation unit 68, the shot cycle calculation unit 70, the region setting unit 72, the lens control unit 74, the transfer processing unit 76, the writing control unit 78, and the registration unit 79, and information being operated are stored in the memory 112 each time.

FIG. 1 shows a configuration necessary for describing the first embodiment. Other configuration elements generally necessary for the writing apparatus 100 may also be included therein.

Figure 2:
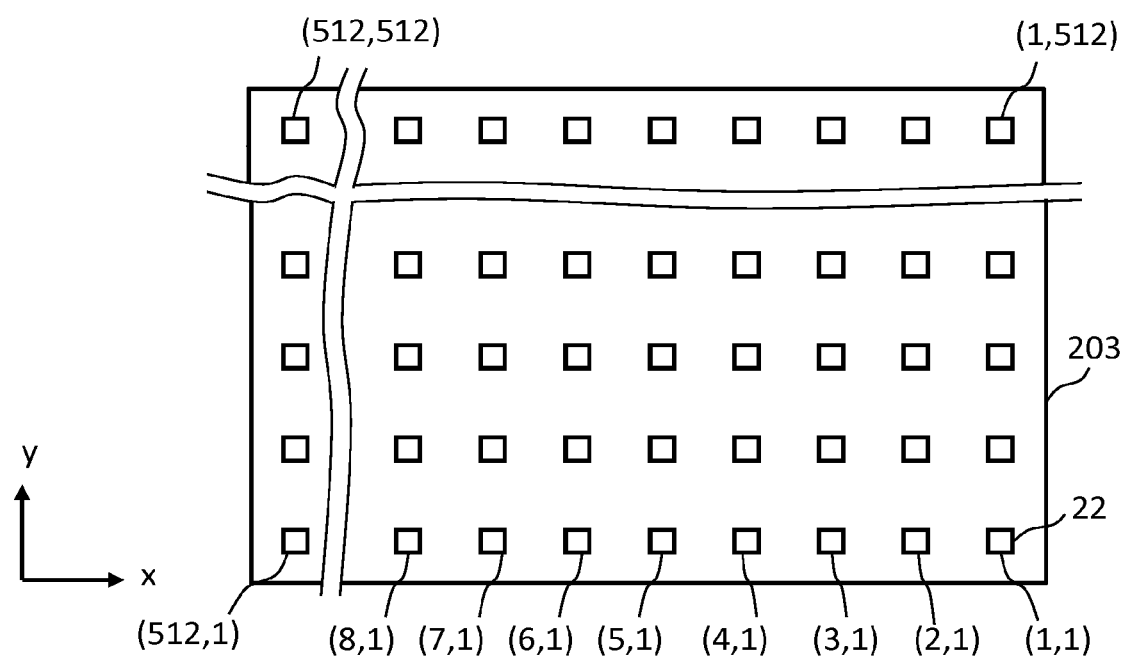
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of p rows long (length in the y direction) and q columns wide (width in the x direction) ($p \geq 2$, $q \geq 2$) are formed, like a matrix, at a predetermined arrangement pitch in the shaping aperture array substrate 203. In the case of FIG. 2, for example, holes (openings) 22 of 512×512, that is 512 (rows of holes arrayed in the y direction)×512 (columns of holes arrayed in the x direction), are formed. Each of the holes 22 is a rectangle (including a square) having the same dimension and shape. Alternatively, each of the holes 22 may be a circle with the same diameter. Multiple beams 20 are formed by letting portions of an electron beam 200 individually pass through a corresponding one of a plurality of holes 22. Although the holes 22 are arranged in a grid in the x and y directions in FIG. 2, the arrangement is not limited thereto. For example, with respect to the kth and the (k+1)th rows which are arrayed (accumulated) in the length direction (in the y direction) and each of which is in the x direction, each hole in the kth row and each hole in the (k+1)th row may be mutually displaced in the width direction (in the x direction) by a dimension "a". Similarly, with respect to the (k+1)th and the (k+2)th rows which are arrayed (accumulated) in the length direction (in the y direction) and each of which is in the x direction, each hole in the (k+1)th row and each hole in the (k+2)th row may be mutually displaced in the width direction (in the x direction) by a dimension "b", for example.

Figure 3:
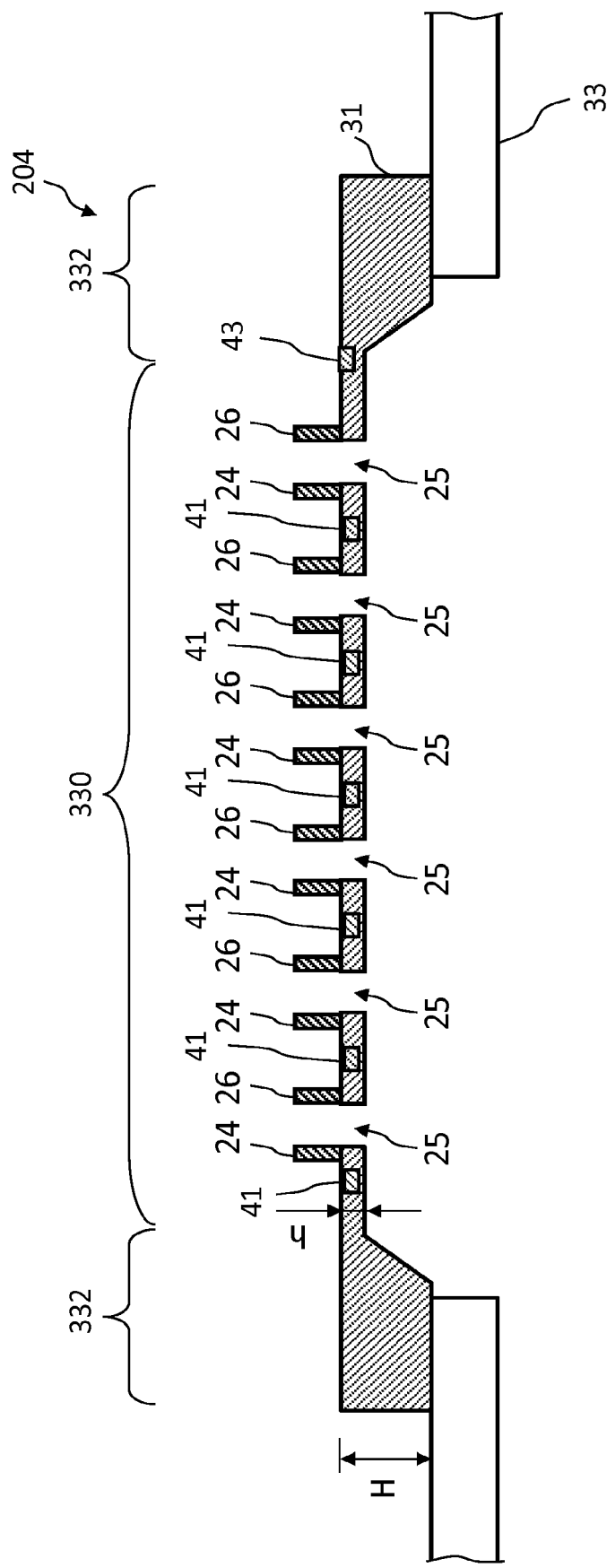
FIG. 3 is a sectional view showing a configuration of a blanking aperture array mechanism according to the first embodiment.

FIG. 3 is a sectional view showing a configuration of a blanking aperture array mechanism according to the first embodiment.

Figure 4:
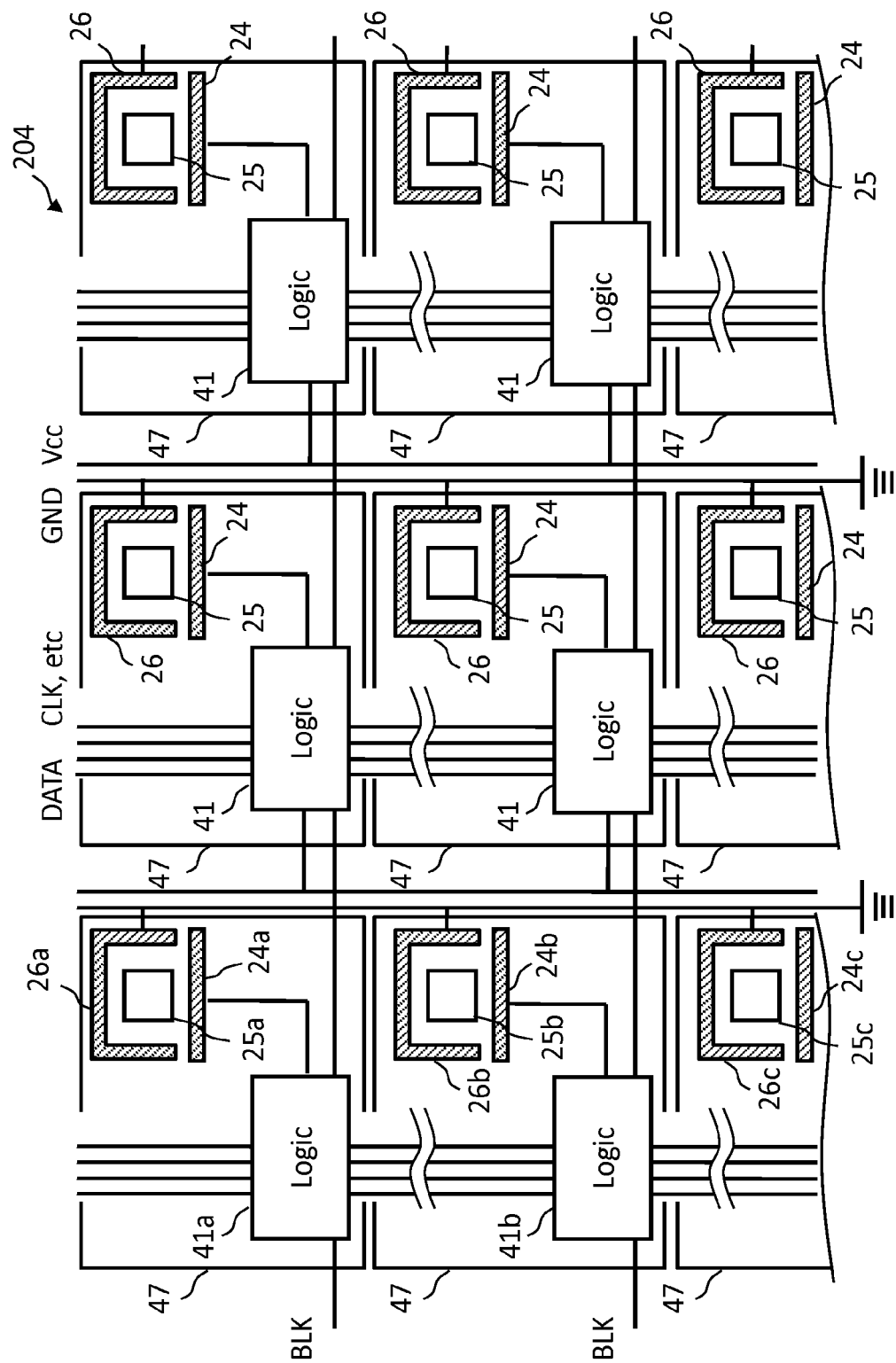
FIG. 4 is a top view conceptual diagram showing a portion of the structure in a membrane region of a blanking aperture array mechanism according to the first embodiment.

FIG. 4 is a top view conceptual diagram showing a portion of the structure in a membrane region of a blanking aperture array mechanism according to the first embodiment. The position relation of a control electrode 24, a counter electrode 26, a control circuit 41, and a pad 43 in FIG. 3 is not in accordance with that of FIG. 4. With regard to the structure of the blanking aperture array mechanism 204, a semiconductor substrate 31 made of silicon, etc. is placed on a support table 33 as shown in FIG. 3. The central part of the substrate 31 is shaved from the back side, and made into a membrane region 330 (first region) having a thin film thickness h. The periphery surrounding the membrane region 330 is an outer peripheral region 332 (second region) having a thick film thickness H. The upper surface of the membrane region 330 and the upper surface of the outer peripheral region 332 are formed to be flush or substantially flush in height with each other. At the back side of the outer peripheral region 332, the substrate 31 is supported on the support table 33. The central part of the support table 33 is open, and the membrane region 330 is located at this opening region.

In the membrane region 330, passage holes 25 (openings) through each of which a corresponding one of multiple beams passes are formed at positions each corresponding to each hole 22 of the shaping aperture array substrate 203 shown in FIG. 2. In other words, in the membrane region 330 of the substrate 31, there are formed a plurality of passage holes 25 in an array through each of which a corresponding beam of electron multiple beams passes. Moreover, in the membrane region 330 of the substrate 31, there are arranged a plurality of electrode pairs each composed of two electrodes being opposite to each other with respect to a corresponding one of a plurality of passage holes 25. Specifically, in the membrane region 330, as shown in FIGS. 3 and 4, each pair (blanker: blanking deflector) of the control electrode 24 and the counter electrode 26 for blanking deflection is arranged close to a corresponding passage hole 25 in a manner such that the electrodes 24 and 26 are opposite to each other across the passage hole 25 concerned. Moreover, close to each passage hole 25 in the membrane region 330 of the substrate 31, there is arranged the control circuit 41 (logic circuit) which applies a deflection voltage to the control electrode 24 for the passage hole 25 concerned. The counter electrode 26 for each beam is grounded (earthed).

As shown in FIG. 4, n bit (e.g., ten bit) parallel lines for control signals are connected to each control circuit 41. In addition to the n-bit parallel lines for control signals, lines for a clock signal, a power supply, and the like are connected to each control circuit 41. Alternatively, a part of the parallel lines may be used as the lines for a clock signal, a power supply, and the like. An individual blanking mechanism 47 composed of the control electrode 24, the counter electrode 26, and the control circuit 41 is configured for each of the multiple beams. In the case of FIG. 3, the control electrode 24, the counter electrode 26, and the control circuit 41 are arranged in the membrane region 330 having a thin film thickness of the substrate 31. However, it is not limited thereto. For example, a plurality of control circuits 41 formed in an array in the membrane region 330 are grouped into two (e.g., left half and right half) per row (in the x direction), and the control circuits 41 in the same group are connected in series as shown in FIG. 4. The pad 43 arranged for each group sends a signal to the control circuits 41 in the group concerned. Specifically, a shift register (to be described later) is arranged in each control circuit 41. Then, with respect to beams in the same row in p×q multiple beams, shift registers in the control circuits in the left-half group are connected in series, for example. Similarly, with respect to beams in the same row, shift registers in the control circuits in the right-half group are connected in series, for example.

In the first embodiment, it is configured such that a high-speed writing mode emphasizing the throughput even at the cost of the writing accuracy, or a high-accuracy writing mode emphasizing the writing accuracy even at the cost of the throughput can be selected. When performing writing in a high-speed writing mode, all of the p×q multiple beams implemented (mounted) in the writing apparatus 100 are used for the writing. In that case, as described above, so-called blurring and/or positional deviation of an image of the multiple beams may occur due to the Coulomb effect. On the other hand, when performing writing in a high-accuracy writing mode, a part of the p×q multiple beams implemented/mounted in the writing apparatus 100, which is obtained by restricting usable beam arrays, are used for the writing. It should be understood that the term "all of the multiple beams" herein does not include defective beams whose dose is difficult to control because of failure of the control circuit 41, etc., and, thus, indicates all of usable beam arrays.

When performing writing in the high-speed writing mode which uses all the p×q multiple beams, control signals for beams in the left half of the same row of the p×q multiple beams are transmitted in series, and control signals for beams in the right half of the same row are also transmitted in series. In the case where p beams are arranged per row, a control signal for each beam is stored in a corresponding control circuit 41 by clock signals performed p/2 times, for example.

Moreover, a blanking (BLK) line, which directs each column to be an effective (valid) column or an ineffective (invalid) column, is connected in series in the y direction to the control circuits 41 in each column, to be orthogonal to the arrangement direction of the control circuits 41 in each group. In the high-accuracy writing mode that restricts beam arrays to be used, a signal from the BLK line restricts effective (valid) columns, and performs writing using a part of the effective (valid) columns as will be described later.

Figure 5:
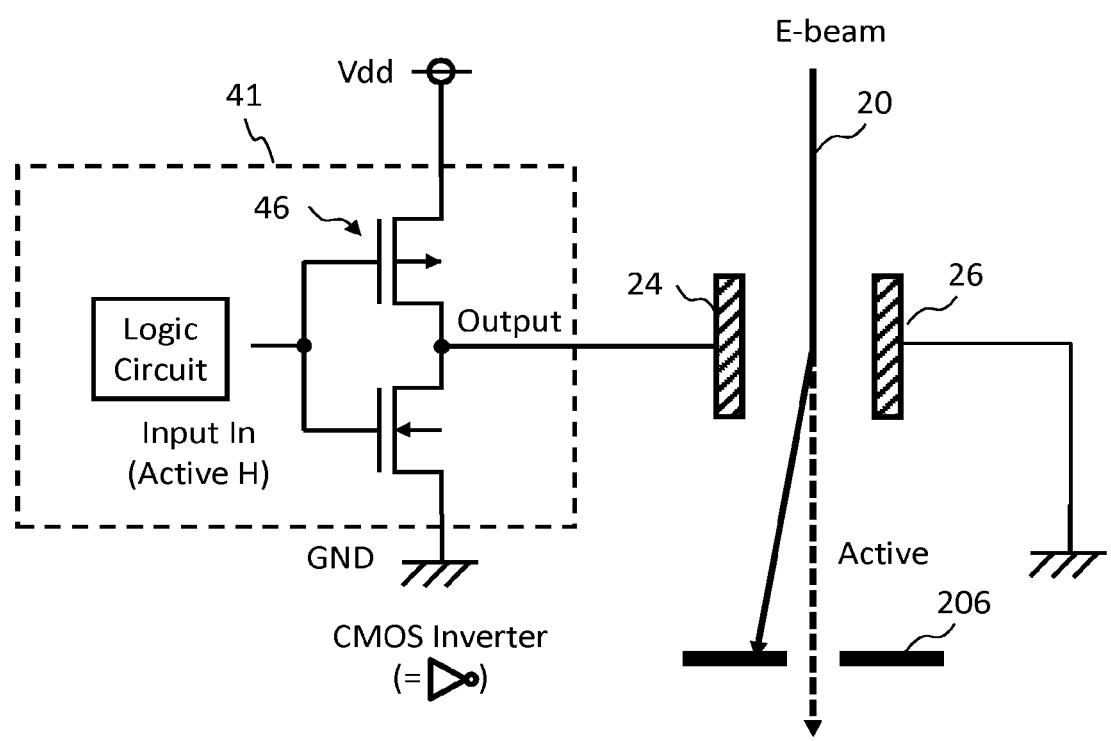
FIG. 5 shows an example of an individual blanking mechanism according to the first embodiment.

FIG. 5 shows an example of an individual blanking mechanism according to the first embodiment. As shown in FIG. 5, an amplifier 46 (an example of a switching circuit) is arranged in the control circuit 41. In the case of FIG. 5, a CMOS (complementary MOS) inverter circuit is arranged as an example of the amplifier 46. The CMOS inverter circuit is connected to a positive potential (Vdd: blanking electric potential: first electric potential) (e.g., 5 V) and to a ground potential (GND: second electric potential). The output line (OUT) of the CMOS inverter circuit is connected to the control electrode 24. On the other hand, the counter electrode 26 is applied with a ground electric potential. A plurality of control electrodes 24, each of which is applied with a blanking electric potential and a ground electric potential in a switchable manner, are arranged on the substrate 31 such that each control electrode 24 and the corresponding counter electrode 26 are opposite to each other with respect to a corresponding one of a plurality of passage holes 25.

As an input (IN) of each CMOS inverter circuit, either an L (low) electric potential (e.g., ground potential) lower than a threshold voltage, or an H (high) electric potential (e.g., 1.5 V) higher than or equal to the threshold voltage is applied as a control signal. According to the first embodiment, in a state where an L electric potential is applied to the input (IN) of the CMOS inverter circuit, the output (OUT) of the CMOS inverter circuit becomes a positive potential (Vdd), and then, a corresponding electron beam 20 is deflected by an electric field due to a potential difference from the ground potential of the counter electrode 26 so as to be blocked by the limiting aperture substrate 206, thereby being controlled to be in a beam OFF condition. On the other hand, in a state (active state) where an H electric potential is applied to the input (IN) of the CMOS inverter circuit, the output (OUT) of the CMOS inverter circuit becomes a ground potential, and therefore, since there is no potential difference from the ground potential of the counter electrode 26, a corresponding electron beam 20 is not deflected, thereby being controlled to be in a beam ON condition by making the beam concerned pass through the limiting aperture substrate 206.

The electron beam 20 passing through a corresponding passage hole is deflected by a voltage independently applied to a pair of the control electrode 24 and the counter electrode 26. Blanking control is provided by this deflection. Specifically, a pair of the control electrode 24 and the counter electrode 26 individually provides blanking deflection of a corresponding electron beam of multiple beams by an electric potential switchable by the CMOS inverter circuit which serves as a corresponding switching circuit. Thus, each of a plurality of blankers performs blanking deflection of a corresponding beam in the multiple beams having passed through a plurality of holes 22 (openings) in the shaping aperture array substrate 203.

Next, operations of the writing mechanism 150 will be described. The electron beam 200 emitted from the electron gun 201 (emission source) almost perpendicularly (e.g., vertically) illuminates the whole of the shaping aperture array substrate 203 by the illumination lens 202. A plurality of rectangular (including square, etc.) holes 22 (openings) are formed in the shaping aperture array substrate 203. The region including all the plurality of holes 22 is irradiated with the electron beam 200. For example, a plurality of rectangular, including a square, electron beams (multiple beams) 20a to 20e are formed by letting portions of the electron beam 200, which irradiates the positions of a plurality of holes 22, individually pass through a corresponding hole of the plurality of holes 22 of the shaping aperture array substrate 203. The multiple beams 20a to 20e individually pass through corresponding blankers (a pair of the control electrode 24 and the counter electrode 26) (first deflector: individual blanking mechanism 47) of the blanking aperture array mechanism 204. The blanker provides blanking control such that at least an electron beam 20 individually passing through the blanker becomes in an ON condition during a writing time (irradiation time) having been set.

The multiple beams 20a to 20e having passed through the blanking aperture array mechanism 204 are reduced by the reducing lens 205, and go toward the hole in the center of the limiting aperture substrate 206. Then, the electron beam 20 which was deflected by the blanker of the blanking aperture array mechanism 204 deviates (shifts) from the hole in the center of the limiting aperture substrate 206 (blanking aperture member), and is blocked by the limiting aperture substrate 206. On the other hand, the electron beams 20 which was not deflected by the blanker of the blanking aperture array mechanism 204 passes through the hole in the center of the limiting aperture substrate 206 as shown in FIG. 1. Thus, the limiting aperture substrate 206 blocks each beam which was deflected to be in the OFF condition by the individual blanking mechanism 47. Then, for each beam, one shot beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, respective beams (all the multiple beams 20) having passed through the limiting aperture substrate 206 are collectively deflected in the same direction by the deflectors 208 and 209 to irradiate respective beam irradiation positions on the target object 101. Moreover, while the XY stage 105 is continuously moving, controlling is performed by the deflector 208 so that the irradiation positions of the beams may follow the movement of the XY stage 105. Ideally, the multiple beams 20 irradiating at a time are aligned at the pitch obtained by multiplying the arrangement pitch of a plurality of holes 22 in the shaping aperture array substrate 203 by the desired reduction ratio described above.

Figure 6:
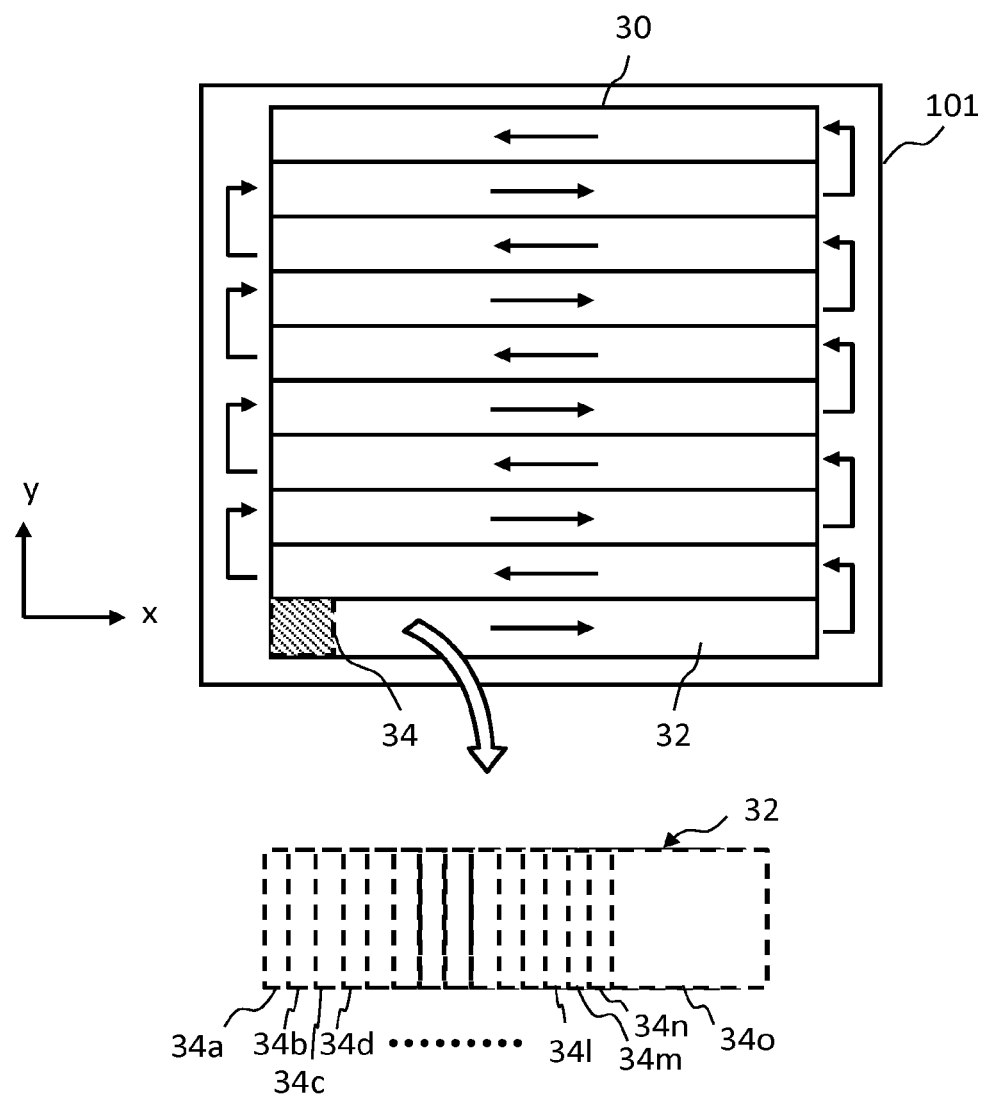
FIG. 6 is a conceptual diagram describing an example of a writing operation according to the first embodiment.

FIG. 6 is a conceptual diagram describing an example of a writing operation according to the first embodiment. As shown in FIG. 6, a writing region 30 of the target object 101 is virtually divided, by a predetermined width in the y direction, into a plurality of stripe regions 32 in a strip form, for example. First, the XY stage 105 is moved to make an adjustment such that an irradiation region 34 which can be irradiated with one shot of the multiple beams 20 is located at the left end of the first stripe region 32 or at a position further left than the left end, and then writing is started. When writing the first stripe region 32, the XY stage 105 is moved, for example, in the −x direction, so that the writing may relatively proceed in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end to be thus located relatively in the y direction. Then, by moving the XY stage 105 in the x direction, for example, writing proceeds in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns up to as many as the number of the holes 22 are formed at a time by one shot (total of irradiation steps to be described later) of multiple beams having been formed by passing through the holes 22 in the shaping aperture array substrate 203.

The irradiation region 34 described above can be defined as a rectangular (including square) region whose x-direction dimension is a value obtained by multiplying the pitch between beams in the x direction by the number of beams in the x direction, and y-direction dimension is a value obtained by multiplying the pitch between beams in the y direction by the number of beams in the y direction. According to the first embodiment, in the high-speed writing mode, all of the multiple beams 20 implemented/mounted in the writing apparatus are used for the writing. On the other hand, in the high-accuracy writing mode, the region of the beam array to be used is restricted as will be described later. Accordingly, the size of the irradiation region 34 is different between the high-speed writing mode and the high-accuracy writing mode.

Figure 7:
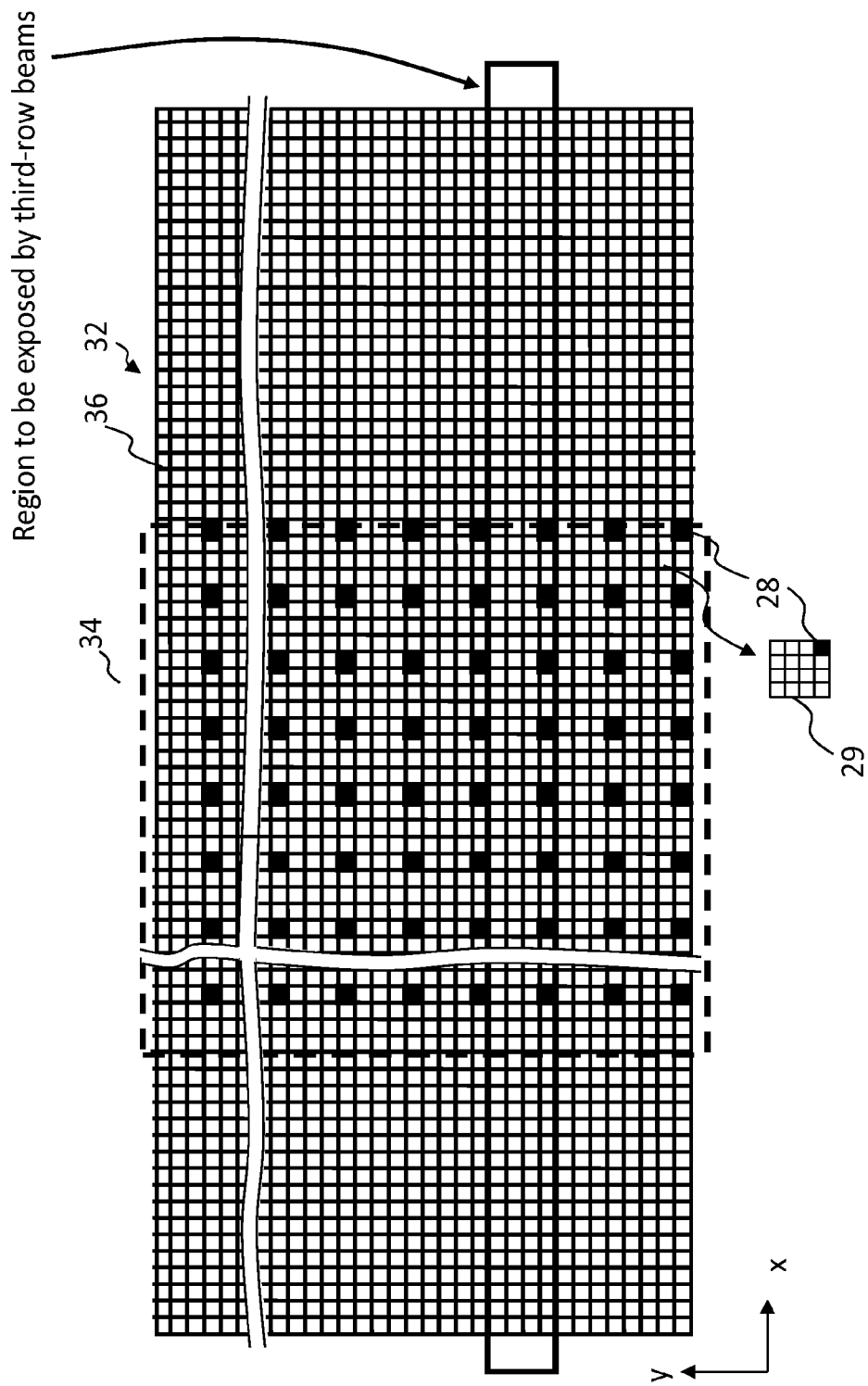
FIG. 7 shows an example of an irradiation region of multiple beams and a pixel to be written (writing pixel) according to the first embodiment.

FIG. 7 shows an example of an irradiation region of multiple beams and a pixel to be written (writing pixel) according to the first embodiment. In FIG. 7, the stripe region 32 is divided into a plurality of mesh regions by the beam size of each of the multiple beams, for example. Each mesh region serves as a writing pixel 36 (unit irradiation region, or writing position). The size of the writing pixel 36 is not limited to the beam size, and may be an arbitrary size regardless of the beam size. For example, it may be 1/n (n being an integer of 1 or more) of the beam size. FIG. 7 shows the case where the writing region of the target object 101 is divided, for example, in the y direction, into a plurality of stripe regions 32 by the width size being substantially the same as the size of the irradiation region 34 (writing field) which can be irradiated by one irradiation with the multiple beams 20. The width of the stripe region 32 is not limited to this. Preferably, the width of the stripe region 32 is n times (n being an integer of 1 or more) the size of the irradiation region 34. FIG. 7 shows the case of multiple beams of 512 (rows)×512 (columns). In the irradiation region 34, there are shown a plurality of pixels 28 (beam writing positions) which can be irradiated with one shot of the multiple beams 20. In other words, the pitch between adjacent pixels 28 is the pitch between beams of the multiple beams. In the example of FIG. 7, one sub-irradiation region 29 is a square region surrounded by four adjacent pixels 28 at four corners but including just one of the four pixels 28. In the case of FIG. 7, each sub-irradiation region 29 is composed of 4×4 pixels including one pixel 28.

Figure 8:
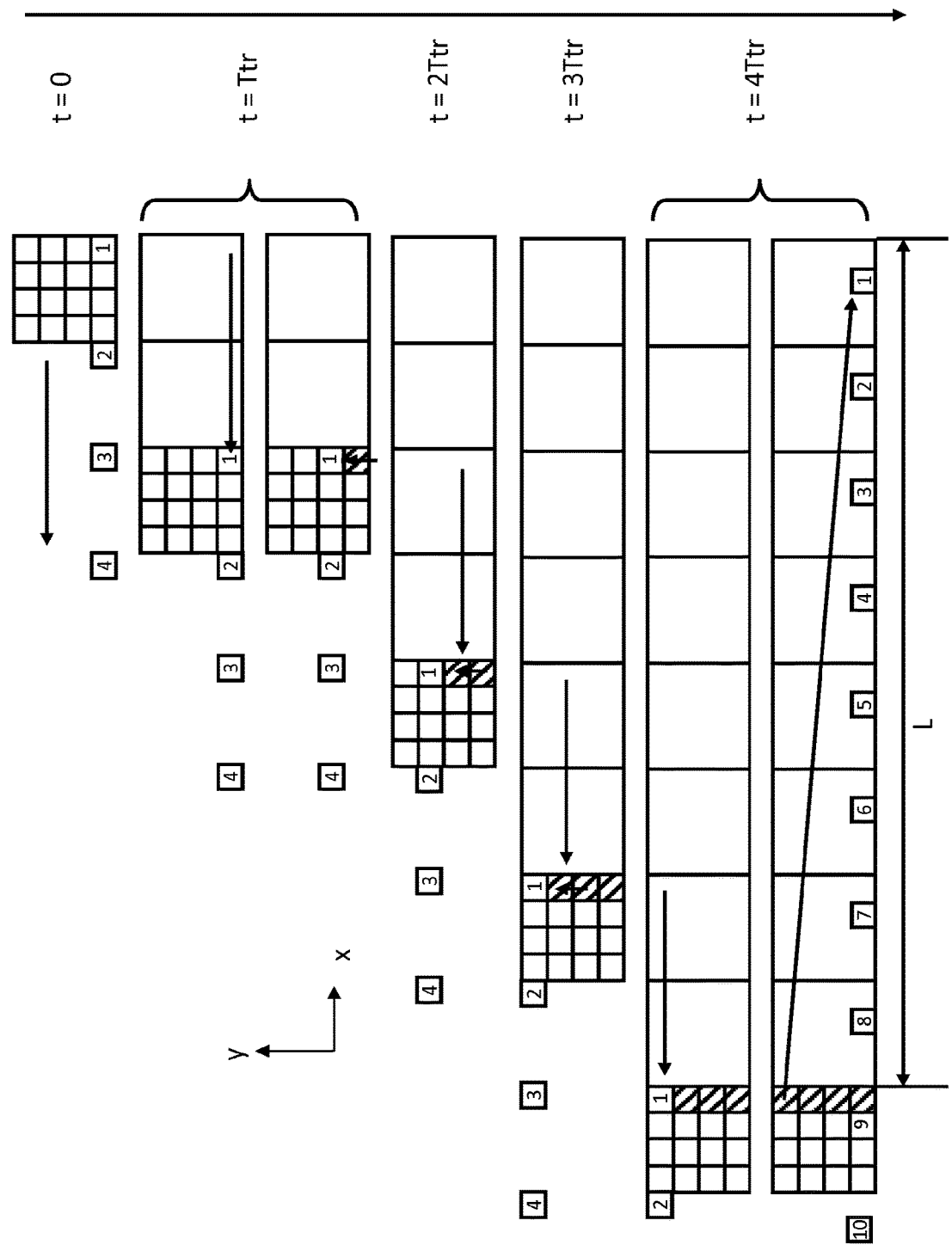
FIG. 8 illustrates an example of a writing method of multiple beams according to the first embodiment.

FIG. 8 illustrates an example of a writing method of multiple beams according to the first embodiment. FIG. 8 shows a portion of the sub-irradiation region 29 to be written by each of beams at the coordinates (1, 3), (2, 3), (3, 3), . . . , (512, 3) in the third row from the bottom in the multiple beams for writing the stripe region 32 shown in FIG. 7. In the example of FIG. 8, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 by collective deflection of all the multiple beams 20 by the deflector 208. In other words, tracking control is performed. In the case of FIG. 8, one tracking cycle is executed by writing (exposing) four pixels while moving the distance of eight beam pitches.

Specifically, the stage position measuring instrument 139 measures the position of the XY stage 105 by irradiating the mirror 210 with a laser and receiving a reflected light from the mirror 210. The measured position of the XY stage 105 is output to the control computer 110. In the control computer 110, the writing control unit 78 outputs the position information on the XY stage 105 to the deflection control circuit 130. While being in accordance with the movement of the XY stage 105, the deflection control circuit 130 calculates deflection amount data (tracking deflection data) for deflecting beams to follow the movement of the XY stage 105. The tracking deflection data being a digital signal is output to the DAC amplifier unit 134. The DAC amplifier unit 134 converts the digital signal to an analog signal and amplifies it to be applied as a tracking deflection voltage to the deflector 208.

The writing mechanism 150 irradiates each pixel 36 with a corresponding one of ON beams of the multiple beams 20 during a writing time (irradiation time or exposure time) corresponding to the pixel 36 concerned within a maximum irradiation time Ttr of the irradiation time of each of the multiple beams in the shot concerned.

In the example of FIG. 8, the first pixel from the right in the bottom row of the sub-irradiation region 29 concerned is irradiated with a beam of the first shot using the beam (1) at coordinates (1, 3) during the time from t=0 to t=maximum irradiationtime Ttr. The XY stage 105 moves two beam pitches in the −x direction during the time from t=0 to t=Ttr, for example. During this time period, the tracking operation is continuously performed.

After the maximum irradiation time Ttr of the shot concerned has elapsed since the start of beam irradiation with the shot concerned, while the beam deflection for tracking control is continuously performed by the deflector 208, the writing position (previous writing position) of each beam is shifted to a next writing position (current writing position) of each beam by collective deflection of the multiple beams 20 by the deflector 209, which is performed in addition to the beam deflection for tracking control. In the example of FIG. 8, when the time becomes t=Ttr, the target pixel to be written is shifted from the first pixel from the right in the bottom row of the sub-irradiation region 29 concerned to the first pixel from the right in the second row from the bottom. Since the XY stage 105 is moving at a fixed speed also during this time period, the tracking operation is continuously performed.

Then, while the tracking control is continuously performed, each corresponding one of ON beams in the multiple beams 20 is applied to the shifted writing position corresponding to the each beam during a writing time corresponding to each beam within the maximum irradiation time Ttr of the shot concerned. In the example of FIG. 8, the first pixel from the right in the second row from the bottom of the sub-irradiation region 29 concerned is irradiated with the second shot of the beam (1) at the coordinates (1, 3) during the time from t=Ttr to t=2 Ttr. The XY stage 105 moves, for example, two beam pitches in the −x direction during the time from t=Ttr to t=2 Ttr. During this time period, the tracking operation is continuously performed.

In the example of FIG. 8, when the time becomes t=2 Ttr, the target pixel to be written is shifted from the first pixel from the right in the second row from the bottom of the sub-irradiation region 29 concerned to the first pixel from the right in the third row from the bottom by collective deflection of the multiple beams by the deflector 209. Since the XY stage 105 is moving also during this time period, the tracking operation is continuously performed. Then, the first pixel from the right in the third row from the bottom of the sub-irradiation region 29 concerned is irradiated with the third shot of the beam (1) at the coordinates (1, 3) during the time from t=2 Ttr to t=3 Ttr, for example. The XY stage 105 moves, for example, two beam pitches in the −x direction during the time from t=2 Ttr to t=3 Ttr. During this time period, the tracking operation is continuously performed. When the time becomes t=3 Ttr, the target pixel to be written is shifted from the first pixel from the right in the third row from the bottom of the sub-irradiation region 29 concerned to the first pixel from the right in the fourth row from the bottom by collective deflection of the multiple beams by the deflector 209. Since the XY stage 105 is moving also during this time period, the tracking operation is continuously performed. Then, the first pixel from the right in the fourth row from the bottom of the sub-irradiation region 29 concerned is irradiated with the fourth shot of the beam (1) at the coordinates (1, 3) during the time from t=3 Ttr to t=4 Ttr, for example. The XY stage 105 moves, for example, two beam pitches in the −x direction during the time from t=3 Ttr to t=4 Ttr. During this time period, the tracking operation is continuously performed. In this manner, writing of the pixels in the first column from the right of the sub-irradiation region 29 concerned has been completed.

In the example of FIG. 8, after applying a corresponding beam to the writing position of each beam which has been shifted three times from the initial position, the DAC amplifier unit 134 returns the tracking position to the start position of tracking where the tracking control was started, by resetting the beam deflection for tracking control. In other words, the tracking position is returned in the opposite direction to the direction of the stage movement. In the example of FIG. 8, when the time becomes t=4 Ttr, tracking of the sub-irradiation region 29 concerned is cancelled, and the beam is swung back to a next target sub-irradiation region 29 shifted by eight beam pitches in the x direction. Although the beam (1) at the coordinates (1, 3) has been described in the example of FIG. 8, writing is also similarly performed for each sub-irradiation region 29 corresponding to a beam at other coordinates. That is, when the time becomes t=4 Ttr, the beam at coordinates (n, m) completes writing of pixels in the first column from the right in a corresponding sub-irradiation region 29. For example, the beam (2) at coordinates (2, 3) of FIG. 7 completes writing of pixels in the first column from the right in the sub-irradiation region 29 adjacent in the −x direction to the sub-irradiation region 29 for the beam (1).

Since writing of the pixels in the first column from the right of each sub-irradiation region 29 has been completed, in a next tracking cycle after resetting the tracking, the deflector 209 performs deflection such that the writing position of each corresponding beam is adjusted (shifted) to the second pixel from the right in the first row from the bottom of each sub-irradiation region 29.

As described above, in the state where the relative position of the irradiation region 34 to the target object 101 is controlled by the deflector 208 to be the same (unchanged) position during the same tracking cycle, each shot is carries out while performing shifting from one pixel to another pixel by the deflector 209. Then, after finishing one tracking cycle and returning the tracking position of the irradiation region 34, the first shot position is adjusted to the position shifted by, for example, one pixel as shown in the lower part of FIG. 6, and each shot is performed shifting from one pixel to another pixel by the deflector 209 while executing a next tracking control. By repeating this operation during writing the stripe region 32, the position of the irradiation region 34 is shifted consecutively, such as from 34a to 34o, to perform writing of the stripe region concerned.

Figure 9:
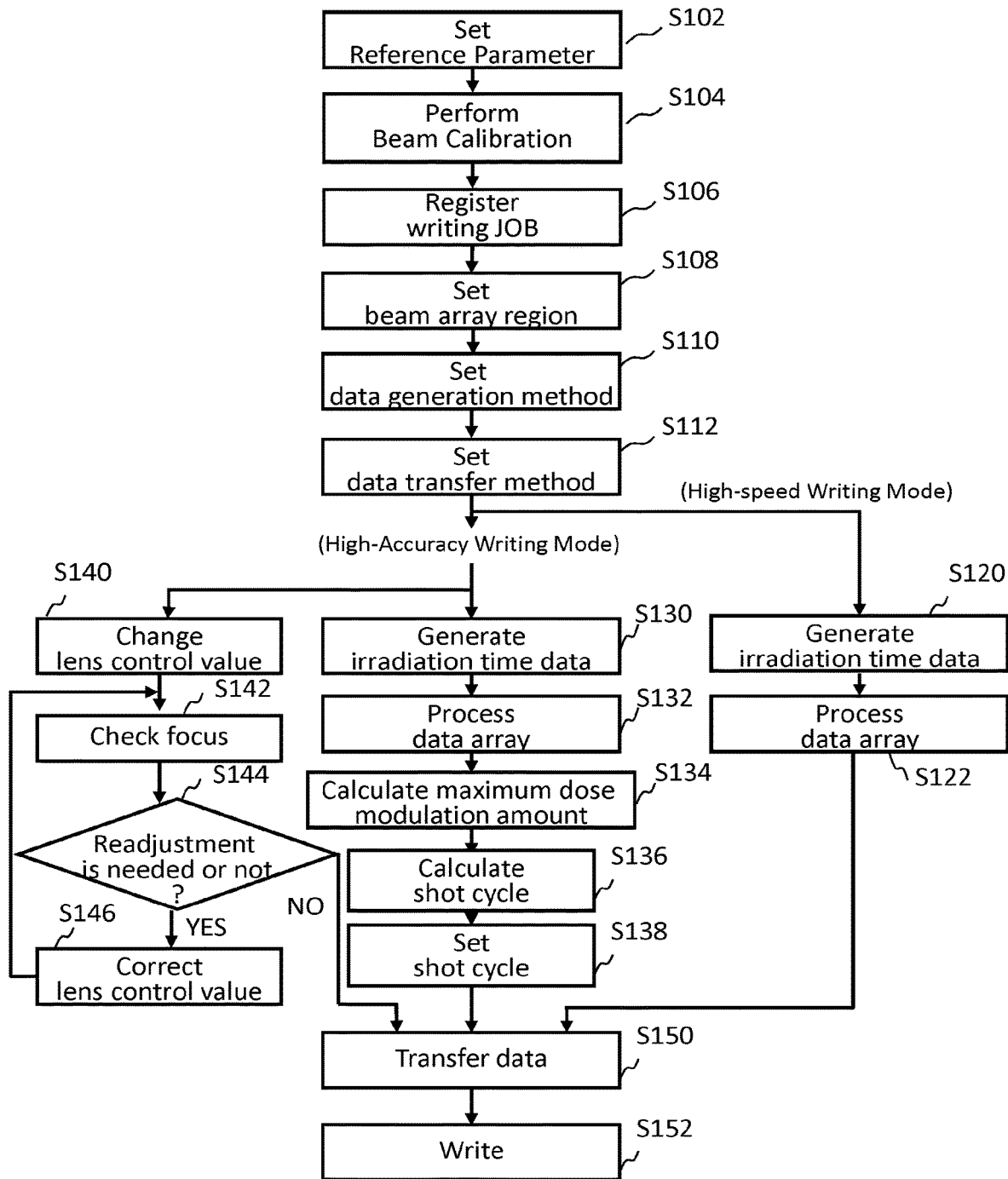
FIG. 9 is a flowchart showing main steps of a writing method according to the first embodiment.

FIG. 9 is a flowchart showing main steps of a writing method according to the first embodiment. In FIG. 9, the writing method of the first embodiment executes a series of steps: a reference parameter setting step (S102), a beam calibration step (S104), a writing job registration step (S106), a beam array region setting step (S108), a data generation method setting step (S110), a data transfer method setting step (S112), an irradiation time data generating step (S120), a data array processing step (S122), an irradiation time data generating step (S130), a data array processing step (S132), a maximum dose modulation amount calculating step (S134), a shot cycle calculating step (S136), a shot cycle setting step (S138), a lens control value changing step (S140), a focus checking step (S142), a determining step (S144), a lens control value correcting step (S146), a data transfer step (S150), and a writing step (S152).

In the reference parameter setting step (S102), the writing control unit 78 sets a reference parameter which is applied when used are all of p×q multiple beams 20 implemented to be emittable by the writing mechanism 150, for example. For example, there are set a dose correction coefficient $D_{m(k)}$ for correcting the amount of positional deviation of the irradiation position of each beam of the multiple beams 20, and a dose correction coefficient $D_{J(k)}$ for correcting a current density in accordance with a current density distribution. Each data of a positional deviation map defining the amount of positional deviation of the irradiation position of each beam, and a current density distribution is input from the outside of the writing apparatus 100, and stored in the storage device 144, for example. The dose D of each beam to irradiate can be obtained by multiplying the reference dose $D_{base}$ by the area density of a pattern in the pixel 36, a proximity effect correction irradiation coefficient $D_p$ for correcting a proximity effect, a dose correction coefficient $D_m$, and a dose correction coefficient $D_J$. Moreover, there is a need to set, as a reference parameter, a shot cycle (time) which enables to make a shot of the maximum dose of the dose D in the case of using all of the multiple beams 20. For example, a shot cycle (time) is set up in consideration of the maximum irradiation time and the data transfer time for each shot which are used in the case of the maximum dose modulation such as around three to five times the reference dose $D_{base}$.

In the beam calibration step (S104), the lens control unit 74 adjusts lens control values for exciting the illumination lens 202, the reducing lens 205, and the objective lens 207, which are used to refract the multiple beams 20, employed in the case of using all of p×q multiple beams 20 implemented to be emittable by the writing mechanism 150. Then, the lens control unit 74 sets the adjusted lens control values in the lens control circuit 137. The lens control circuit 137 flows a current in accordance with a corresponding lens control value in each electromagnetic lens in order to excite it. When all of the p×q multiple beams 20 implemented to be emittable by the writing mechanism 150 are used, the total current amount per shot is large. Then, based on the beam with the large total amount of current, the focus position is adjusted by the objective lens 207, and a corresponding lens control value is set.

As described above, preparation proceeds for the high-speed writing mode in which used are all of the p×q multiple beams implemented to be emittable by the writing mechanism 150, for example.

In the writing job registration step (S106), the registration unit 79 registers a writing JOB.

In the beam array region setting step (S108), the region setting unit 72 sets the region of the beam array to be used, for example, in the whole region of the p×q multiple beams 20 implemented to be emittable by the writing mechanism 150.

Figure 10A:
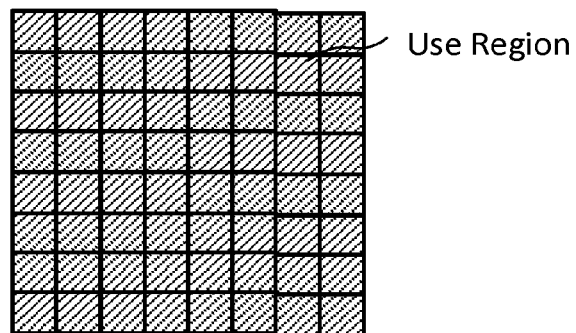
FIGS. 10A and 10B each illustrates a beam array region according to the first embodiment.
Figure 10B:
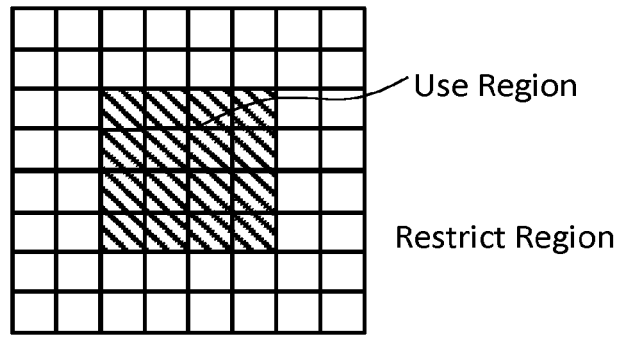
Figure 10B:
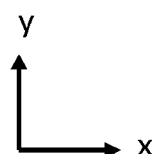

FIGS. 10A and 10B each illustrates a beam array region according to the first embodiment. FIGS. 10A and 10B show the case of 8×8 multiple beams 20 implemented to be emittable by the writing mechanism 150. When using the high-speed writing mode, as shown in FIG. 10A, the region setting unit 72 sets the region of all the multiple beams 20 implemented to be emittable by the writing mechanism 150, as an irradiation region (use region) of the beam array to be used. In the example of FIG. 10A, the region setting unit 72 sets the region of all the 8×8 multiple beams 20. In contrast, in the case of using the high-accuracy writing mode, as shown in FIG. 10B, the region setting unit 72 sets a region of the central portion of the whole region of p×q multiple beams 20 implemented to be emittable by the writing mechanism 150, as an irradiation region of the beam array to be used, for example. The region is set such that a half of the number of beams in the x direction in the central portion of the region for all the multiple beams 20 is equal to the number of beams in the x direction in each end side portion in the x direction of the region for all the multiple beams 20. In the example of FIG. 10B, the region setting unit 72 sets the region of the beam array of 4×4 beams at the central portion of the whole region of the multiple beams 20. Thus, the use region of the beam array is restricted. Thereby, the total current amount per shot can be made small. As a result, it is possible to suppress degradation of writing accuracy due to the Coulomb effect. In the example of FIG. 10B, since the beam array of 8×8 multiple beams 20 has been restricted to that of 4×4 beams, the amount of current can be reduced to around ¼ in a simple calculation.

In the data generation method setting step (S110), the data generation method setting step 64 sets up a method for generating irradiation time data (shot data) depending on the use region of the beam array. In the case of using the high-speed writing mode, the data generation method setting step 64 performs setting, for each shot, to generate data for all the multiple beams 20 implemented to be emittable by the writing mechanism 150. In contrast, in the case of using the high-accuracy writing mode, the data generation method setting step 64 performs setting to generate data for beam rows including the use region having been restricted. In the example of FIG. 10B, the data generation method setting step 64 performs setting to generate data not only for the use region being the beam array of 4×4 beams in the central portion but also for the beam array of 2×4 beams located upper part (in the y direction) of the use region, and the beam array of 2×4 beams located lower part (in the y direction) of the use region. However, the data generation method setting step 64 performs setting to always generate irradiation time data of beam OFF (irradiation time zero) for the beam array of 2×4 beams located upper part (in the y direction) of the use region, and the beam array of 2×4 beams located lower part (in the y direction) of the use region.

In the data transfer method setting step (S112), the data transfer method setting unit 66 sets up a data transfer method depending on the use region of the beam array.

Figure 11:
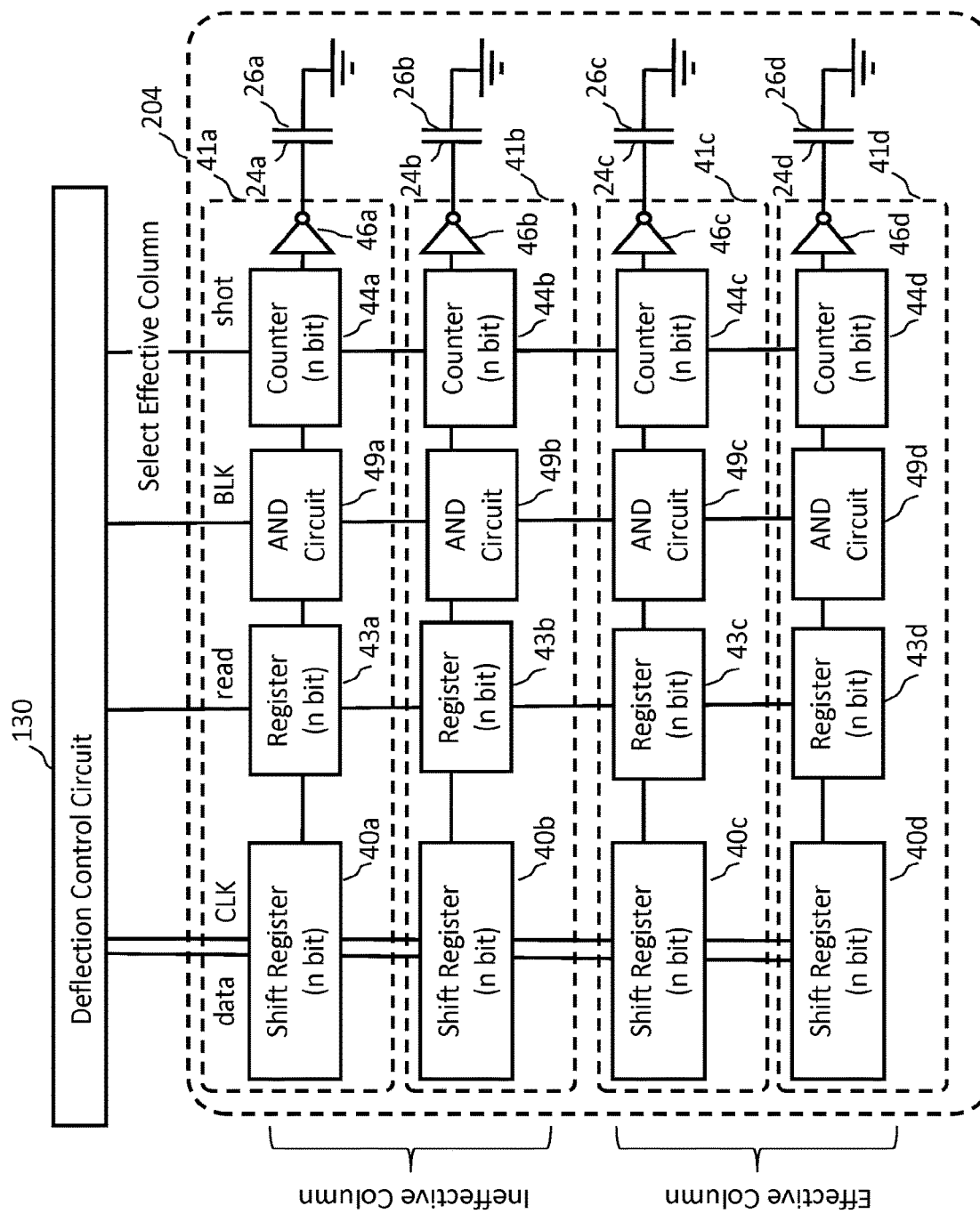
FIG. 11 is a schematic diagram showing the internal configuration of an individual blanking control circuit according to the first embodiment.

FIG. 11 is a schematic diagram showing the internal configuration of an individual blanking control circuit according to the first embodiment. As shown in FIG. 11, in each control circuit 41 for individual blanking control disposed in the blanking aperture array mechanism 204 inside the body of the writing apparatus 100, there are arranged a shift register 40, a register 43, an AND circuit 49, a counter 44, and an amplifier 46. Thus, a plurality of shift registers 40 and a plurality of registers 43 each of which stores shot data of a corresponding beam are arranged for each beam of the multiple beams 20 (the first beam array) implemented to be emittable by the writing mechanism 150. According to the first embodiment, individual blanking control for each beam is performed by an n-bit (e.g., 10-bit) control signal. Here, for example, with respect to the multiple beams 20 composed of p×q beams in an array (matrix), the shift registers 40 in the control circuits 41 for the left half (first to p/2th beams in the x direction) of p beams in the x direction and in the same row are connected in series from the peripheral side toward the center side (in the x direction), for example. The example of FIG. 11 shows the case where shift registers 40a, 40b, 40c, and 40d of the control circuits 41 for four beams arrayed in the left half in the same row are connected in series. Similarly, the shift registers 40 in the control circuits 41 for the right half ((p/2+1)th to pth beams in the x direction) of p beams in the x direction and in the same row are connected in series from the peripheral side toward the center side (in the −x direction), for example.

When irradiating with all the multiple beams 20 implemented to be emittable by the writing mechanism 150, there exist, for one shot of multiple beams, n-bit control signals for controlling ON/OFF of multiple beams grouped per left half of each row of the multiple beams, where the number of the grouped ON/OFF control signals is the same as the number of rows of the multiple beams, and n-bit control signals for controlling ON/OFF of multiple beams grouped per right half of each row of the multiple beams, where the number of the grouped ON/OFF control signals is also the same as the number of rows of the multiple beams. Therefore, in the case of using the high-speed writing mode, the data transfer method setting unit 66 performs setting to transfer the n-bit control signals for controlling ON/OFF of multiple beams grouped per left half of each row of the multiple beams 20, and the n-bit control signals for controlling ON/OFF of multiple beams grouped per right half of each row of the multiple beams 20. Such data groups are transmitted in a batch from the deflection control circuit 130 to the blanking aperture array mechanism 204, for each shot of the multiple beams. For example, such data groups are collectively transmitted in parallel. The ON/OFF control signal for each beam is stored in a corresponding shift register 40 by clock signals performed p/2 times, for example. In the case of FIG. 11, ON/OFF control signals for four beams are stored in the corresponding shift registers 40a, 40b, 40c, and 40d by clock signals performed four times.

In contrast, when irradiating with beams in the beam array in the central portion, there are needed, for one shot of multiple beams, n-bit control signals for controlling ON/OFF of multiple beams grouped per half on the central portion side in the left half of each row of the multiple beams, where the number of the grouped ON/OFF control signals is the same as the number of rows of the multiple beams, and n-bit control signals for controlling ON/OFF of multiple beams grouped per half on the central portion side in the right half of each row of the multiple beams, where the number of the grouped ON/OFF control signals is also the same as the number of rows of the multiple beams. Therefore, in the case of using the high-speed writing mode, the data transfer method setting unit 66 performs setting to transfer the n-bit control signals for controlling ON/OFF of multiple beams grouped per half on the central portion side in the left half of each row of the multiple beams, and the n-bit control signals for controlling ON/OFF of multiple beams grouped per half on the central portion side in the right half of each row of the multiple beams. Such data groups are transmitted in a batch from the deflection control circuit 130 to the blanking aperture array mechanism 204, for each shot of the multiple beams. For example, such data groups are collectively transmitted in parallel. Then, the ON/OFF control signal for each beam in the use region is stored in a corresponding shift register 40 by clock signals performed p/4 times, for example. In the case of FIG. 11, ON/OFF control signals for two beams in the use region out of four beams are stored in the corresponding shift registers 40c and 40d by clock signals performed four times in the first shot, and by those performed twice in the second and subsequent shots.

Figure 12A:
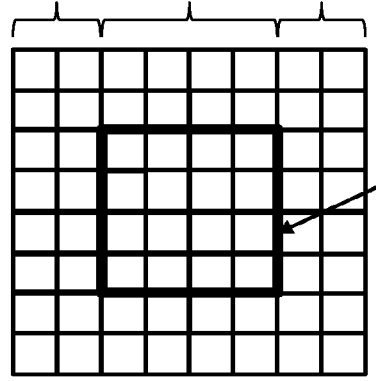
FIGS. 12A to 12D illustrate a data transfer method in a high-accuracy writing mode according to the first embodiment.
Figure 12B:
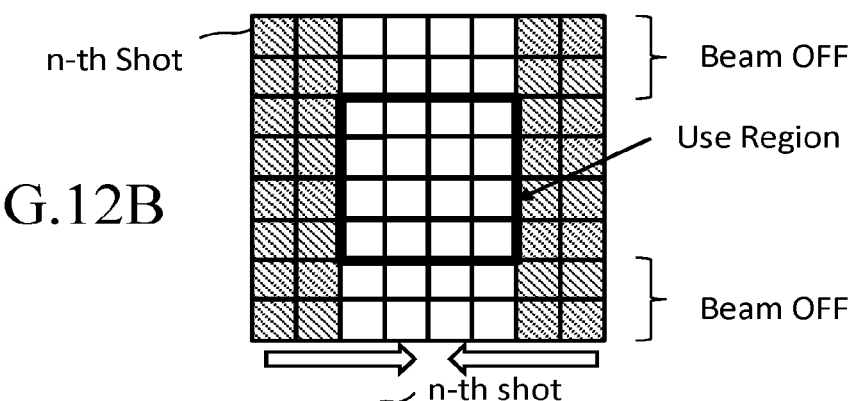
Figure 12C:
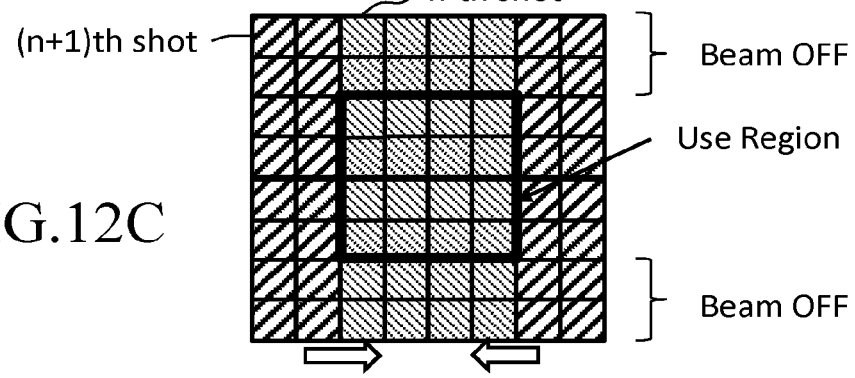

FIGS. 12A to 12D illustrate a data transfer method in a high-accuracy writing mode according to the first embodiment. FIG. 12A shows the state where data has not been transferred yet to the shift registers 40 for 8×8 multiple beams 20 (the first beam array) implemented to be emittable by the writing mechanism 150, for example. Here, the beam array region of 4×4 beams in the central portion is set as the use region in the 8×8 multiple beams 20 which are mounted to be emittable, for example. ON/OFF control signals for the beam array of beam columns including the use region of the first shot are transmitted in a batch, for each shot, to the blanking aperture array mechanism 204 from the deflection control circuit 130. Then, data is sequentially shifted from both the left and right ends, and, as shown in FIG. 12B, ON/OFF control signals for the beam array (the second beam array) of the beam columns (effective columns) including the use region of the first shot (n-th shot) are stored, by clock signals performed twice, in the shift registers 40a and 40b for the beam array (the third beam array) in the unused region (ineffective columns) on the upstream side of the use region. Moreover, as shown in FIG. 12C, ON/OFF control signals (shot data) for the n-th shot of the beam array of the beam columns including the use region are stored, by clock signals performed twice, in the shift registers 40c and 40d (examples of the register) for the beam array (the second beam array) of the beam columns (effective columns) including the use region. Simultaneously, each of the shift registers 40a and 40b (registers) for the beam array (the third beam array) in the unused region (ineffective columns) on the upstream side of the use region, which is other than the beam array (the second beam array) of the beam columns including the use region, in the 8×8 multiple beams 20 (the first beam array) implemented to be emittable by the writing mechanism 150 stores an ON/OFF control signal (shot data) for the (n+1)th shot of the beam array (the second beam array) of beam columns including the use region. Then, receiving a read signal from the deflection control circuit 130, each of the registers 43c and 43d for the beam array (the second beam array) of the beam columns (effective columns) including the use region reads the ON/OFF control signal (shot data) for the n-th shot. Then, responsive to an effective-column-signal from the deflection control circuit 130, the AND circuits 49c and 49d for the beam array (the second beam array) of the beam columns (effective columns) including the use region output ON/OFF control signals to the counters 44c and 44d. Based on a shot signal from the deflection control circuit 130, each of the counters 44c and 44d outputs an H potential to the amplifier 46 during the irradiation time corresponding to the ON/OFF control signal. Thereby, the beam array (the second beam array) of the beam columns (effective columns) including the use region becomes beam ON during the irradiation time corresponding to the ON/OFF control signal. Since irradiation time data of beam OFF (irradiation time zero) is always generated for the beam array of 2×4 beams located upper part (in the y direction) of the use region, and the beam array of 2×4 beams located lower part (in the y direction) of the use region, they keep the beam OFF condition. In other words, irradiation time data of beam OFF is always generated as the irradiation time data of partial beams in the beam array (the second beam array) of the effective columns. Furthermore, in other words, the beam array (the second beam array) of the effective columns is composed of a plurality of beam columns in the central portion of the 8×8 multiple beams 20 (the first beam array) being emittable, and then, irradiation time data of beam OFF is always generated as the irradiation time data of beams located on both end sides (in the y direction) of each beam column of the plurality of beam columns in the effective column in the central portion. Accordingly, writing processing is performed by the beam array of 4×4 beams in the central portion, which is applied as the use region, without the beams located (in the y direction) at the both end sides of the effective columns. In addition, the shift registers 40a and 40b (registers) for the beam array (the third beam array) of the ineffective columns may store at least a part of the ON/OFF control signals (shot data) for the (n+1)th shot of the beam array (the second beam array) of the beam columns including the use region.

When receiving a read signal from the deflection control circuit 130, each of the registers 43c and 43d reads the ON/OFF control signal (shot data) for the n-th shot, and simultaneously, each of the registers 43a and 43b for the beam array (the third beam array) of ineffective columns reads the ON/OFF control signal (shot data) for the (n+1)th shot. However, the AND circuits 49a and 49b intercept the ON/OFF control signals from the registers 43a and 43b to the counters 44a and 44b, in responsive to an ineffective-column-signal (BLK) from the deflection control circuit 130. Therefore, the state of the beam array (the third beam array) of ineffective columns is maintained to be beam OFF.

Figure 12D:
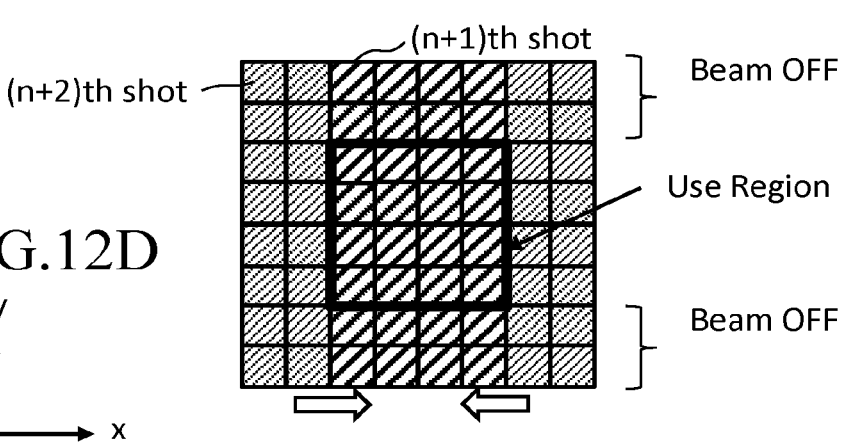

Then, when the n-th shot is completed, as shown in FIG. 12D, shot data for the (n+1)th shot is individually shifted, by clock signals performed twice, from each of the shift registers 40a and 40b for the beam array (the third beam array) of ineffective columns to each of the shift registers 40c and 40d for the beam array (the second beam array) of the beam columns (effective columns) including the use region. Simultaneously, each of the shift registers 40a and 40b (registers) for the beam array (the third beam array) of ineffective columns stores an ON/OFF control signal (shot data) for the (n+2)th shot of the beam array (the second beam array) of effective columns. When each of the shift register 40a and 40b (registers) for the beam array (the third beam array) of ineffective columns stores at least a part of the ON/OFF control signal (shot data) for the (n+1)th shot of the beam array (the second beam array) of beam columns including the use region, shot data for the (n+1)th shot is shifted at least from each of the shift registers 40a and 40b to each of the shift registers 40c and 40d.

As described above, by making the ON/OFF control signal (shot data) for each shot of the beam array of effective columns including the use region stand ready in each of the shift registers 40a and 40b for the beam array (the third beam array) of ineffective columns, it is possible to transfer shot data by clock signals performed smaller number of times compared to those performed in the case of emitting all the beams mounted. Therefore, the transfer time can be shortened.

Next, steps after the data transfer method setting step (S112) in the high-speed writing mode will be described below.

In the irradiation time data generating step (S120), the shot data generation unit 60 generates an ON/OFF control signal (shot data) for each shot of all the multiple beams 20 implemented to be emittable by the writing mechanism 150. First, the shot data generation unit 60 virtually divides the writing region (here, for example, stripe region 32) into a plurality of proximity mesh regions (mesh regions for proximity effect correction calculation) by a predetermined size. The size of the proximity mesh region is preferably about 1/10 of the influence range of the proximity effect, such as about 1 μm. The shot data generation unit 60 reads writing data from the storage device 140, and calculates, for each proximity mesh region, a pattern area density p of a pattern arranged in the proximity mesh region concerned.

Next, the shot data generation unit 60 calculates, for each proximity mesh region, a proximity effect correction irradiation coefficient $D_p$ for correcting a proximity effect. Here, the size of the mesh region to calculate the proximity effect correction irradiation coefficient $D_p$ does not need to be the same as that of the mesh region to calculate the pattern area density ρ. Moreover, the correction model of the proximity effect correction irradiation coefficient $D_p$ and its calculation method may be the same as those used in the conventional single beam writing method.

Then, the shot data generation unit 60 calculates, for each pixel 36, a pattern area density ρ' in the pixel 36 concerned. The mesh size of ρ' is set to be the same as the size of the pixel 28.

The shot data generation unit 60 calculates, for each pixel (writing pixel) 36, a dose D with which the pixel 36 concerned is irradiated. The dose D can be calculated, for example, by multiplying a pre-set reference dose $D_{base}$ by a pattern area density ρ' of a pattern in the pixel 36, a proximity effect correction irradiation coefficient $D_p$ for correcting a proximity effect, a dose correction coefficient $D_m$ for correcting the amount of positional deviation of the irradiation position of each beam of the multiple beams 20, and a dose correction coefficient $D_J$ for correcting a current density in accordance with a current density distribution. The dose correction coefficient $D_m$ and the dose correction coefficient $D_J$ are various depending on each beam of the multiple beams 20. Which pixel 36 is irradiated with which beam is determined based on a writing sequence.

Next, the shot data generation unit 60 calculates, for each pixel 36, an electron beam irradiation time t for making the calculated dose D incident on the pixel 36 concerned. The irradiation time t can be calculated by dividing the dose D by a current density J. Then, an irradiation time t map which defines the irradiation time t acquired for each pixel 36 is generated. The generated t map is stored in the storage device 142. According to the first embodiment, for example, a signal of the irradiation time t of each pixel 36 becomes the ON/OFF control signal of the pixel 36 concerned. Alternatively, a signal of a count value obtained by dividing the irradiation time t of each pixel 36 by a clock period becomes the ON/OFF control signal for the pixel 36 concerned.

In the data array processing step (S122), the array processing unit 62 rearranges the ON/OFF control signal for each pixel 36 in order of shot and in order of beam transfer.

In the data transfer step (S150), based on the data transfer method having been set, the transfer processing unit 76 transfers, in order of shot, n-bit ON/OFF control signals for controlling ON/OFF of multiple beams 20 grouped per left half of each row of the multiple beams 20, and n-bit ON/OFF control signals for controlling ON/OFF of multiple beams 20 grouped per right half of each row of the multiple beams 20.

In the writing step (S152), the writing mechanism 150 writes a pattern on the target object 101 with the multiple beams 20 implemented to be emittable by the writing mechanism 150. Operations of the writing mechanism 150 and the method of writing have been described above. In the beam calibration step (S104), has been set a lens control value for each electromagnetic lens which is applied when using all of p×q multiple beams 20 implemented to be emittable by the writing mechanism 150. Therefore, the objective lens 207 provides focusing in accordance with the total amount of current used when using all the multiple beams 20. Thus, although the writing accuracy is degraded because of the Coulomb effect, it is possible to perform writing processing with increased throughput.

Next, steps after the data transfer method setting step (S112) in the high-accuracy writing mode will be described below.

In the irradiation time data generating step (S130), the shot data generation unit 60 generates ON/OFF control signals (shot data) for the beam array (the second beam array) whose number of beams is smaller than that of the multiple beams 20 (the first beam array) implemented to be emittable by the writing mechanism 150. Specifically, the shot data generation unit 60 generates an ON/OFF control signal (shot data) for each shot of the beam array (the second beam array) of the effective columns including the use region shown in FIG. 12A, etc. As described above, irradiation time data of beam OFF (irradiation time zero) is always generated for the beam array of 2×4 beams located upper part (in the y direction) of the use region, and the beam array of 2×4 beams located lower part (in the y direction) of the use region. The method of generating shot data of each pixel 36 is what has been described above. As for the method of setting the stripe region 32, its size can be set according to the beam array being the use region. Which pixel 36 is irradiated with which beam in the use region is determined based on a writing sequence.

In the data array processing step (S132), the array processing unit 62 rearranges the ON/OFF control signal for each pixel 36 in order of shot and in order of beam transfer.

In the maximum dose modulation amount calculating step (S134), the dose modulation amount calculation unit 68 calculates the maximum dose modulation amount according to the region having been set.

Figure 13:
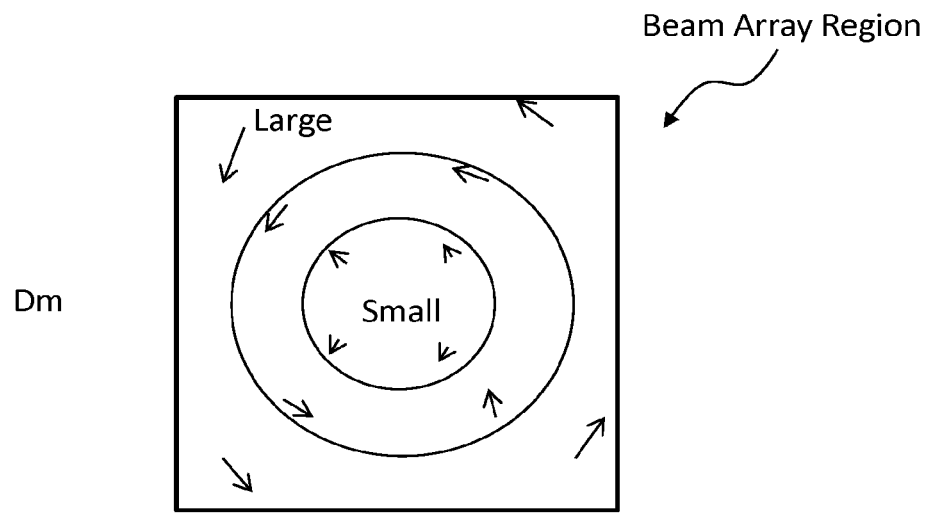
FIG. 13 illustrates an example of a positional deviation map defining the amount of positional deviation of each beam according to the first embodiment.

FIG. 13 illustrates an example of a positional deviation map defining the amount of positional deviation of each beam according to the first embodiment. FIG. 13 shows an example of the tendency of the amount of positional deviation of each beam in the irradiation region 34 (beam array region) of all the multiple beams 20 implemented to be emittable by the writing mechanism 150. When performing irradiation with the multiple beams 20, distortion occurs in an exposure field due to optical system characteristics, and therefore, the irradiation position of each beam deviates from an ideal grid because of the distortion. However, in the optical system of the multiple beams 20, it is difficult to deflect each beam individually, thereby being difficult to individually control the position of each beam on the target object surface. Accordingly, the positional deviation of each beam is corrected by dose modulation. For example, dose modulation of each beam can be performed such that the gravity center of the dose is located in an ideal grid by distributing some or all of the dose to peripheral beams. Therefore, in many cases, the distributed beam dose amount becomes larger than the amount of the design dose itself. For performing such dose modulation, the dose correction coefficient $D_{m(k)}$ is set to correct the amount of positional deviation of the irradiation position of each beam of the multiple beams 20. k indicates the index of each beam. As shown in FIG. 13, while the beam positional deviation amount is small in the central portion, there is a tendency that the beam positional deviation amount becomes larger as it goes to the peripheral side. The larger the beam positional deviation amount is, the larger the dose correction coefficient $D_{m(k)}$ is. In the first embodiment, since the use region is restricted to the central portion where the amount of beam positional deviation is small, the dose correction coefficient $D_{m(k)}$ of each beam in this region can be made small. Therefore, the amplitude of the dose correction coefficient $D_{m(k)}$ of the beam array in the region of the central portion can be made smaller than that of the dose correction coefficient $D_{m(k)}$ of each beam in the region of all the multiple beams 20. In other words, the maximum value of the dose correction coefficient $D_{m(k)}$ of the beam array in the region of the central portion can be made smaller than that of the dose correction coefficient $D_{m(k)}$ of each beam in the region of all the multiple beams 20.

Figure 14:
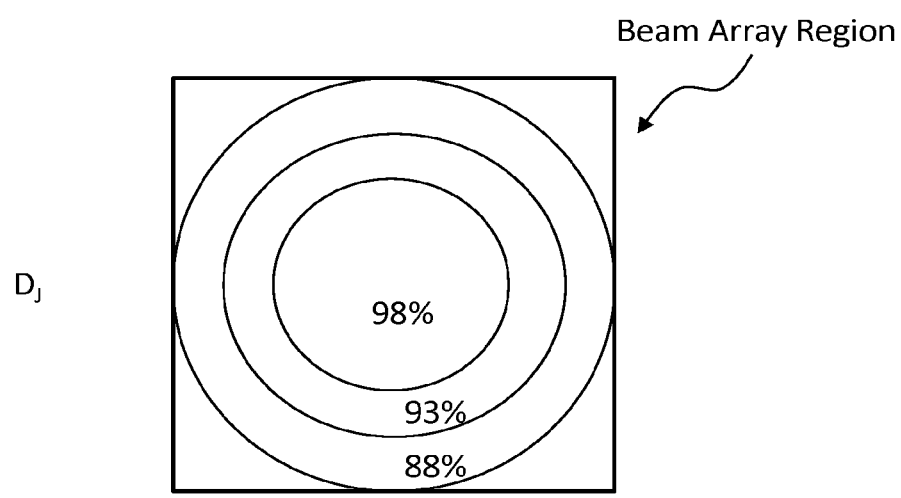
FIG. 14 illustrates an example of a current density distribution of multiple beams according to the first embodiment.

FIG. 14 illustrates an example of a current density distribution of multiple beams according to the first embodiment. FIG. 14 shows an example of the tendency of a current density distribution of each beam in the irradiation region 34 (beam array region) of all the multiple beams 20 implemented to be emittable by the writing mechanism 150. As described above, the multiple beams 20 are formed, for example, by letting one electron beam 200 pass through the shaping aperture array substrate 203. The current density distribution of the electron beam 200 decreases on the peripheral side while it is approximately uniform in the central portion. Therefore, with respect to the formed multiple beams 20, as shown in FIG. 14, there is a tendency that the current density distribution of the beam becomes lower as it goes to the peripheral side while it is approximately uniformly high, such as 98% or more, in the central portion. Therefore, even when performing beam irradiation during a desired irradiation time, the dose incident on target object 101 of a beam in the central portion, and that of a beam at the outer peripheral part are different from each other. Accordingly, current density deviation of each beam is corrected by dose modulation. That is, dose modulation is performed with a ratio (1 or more) for compensating an insufficient current density. Thus, a dose correction coefficient $D_{J(k)}$ for correcting a current density is set to be in accordance with a current density distribution of the multiple beams 20. According to the first embodiment, since the use region is restricted to the central portion where the current density is high and approximately uniform, the dose correction coefficient $D_{J(k)}$ of each beam in this region can be made small. Therefore, the amplitude of the dose correction coefficient $D_{J(k)}$ of the beam array in the region of the central portion can be made smaller than that of each beam in the region of all the multiple beams 20. In other words, the maximum value of the dose correction coefficient $D_{J(k)}$ of the beam array in the region of the central portion can be made smaller than that of each beam in the region of all the multiple beams 20.

As described above, the dose D of each beam can be obtained by multiplying the reference dose $D_{base}$ by the area density of a pattern in the pixel 36, the proximity effect correction irradiation coefficient $D_p$ for correcting a proximity effect, the dose correction coefficient $D_m$, and the dose correction coefficient $D_J$. The maximum dose modulation amount can be obtained by multiplying the proximity effect correction irradiation coefficient $D_p$, the dose correction coefficient $D_m$, and the dose correction coefficient $D_J$. In the first embodiment, since the use region is restricted to the central portion, the product between the maximum value of the dose correction coefficient $D_m$ of each beam in the central portion and the maximum value of the dose correction coefficient $D_J$ can be made smaller than the product between the maximum value of the dose correction coefficient $D_m$ of each beam in the region of all the multiple beams 20 and the maximum value of the dose correction coefficient $D_{J(k)}$. Therefore, it is possible to make the maximum dose modulation amount smaller by the amount of the product difference In the shot cycle calculating step (S136), the shot cycle calculation unit 70 calculates a shot cycle time based on the region having been set.

Figure 15A:
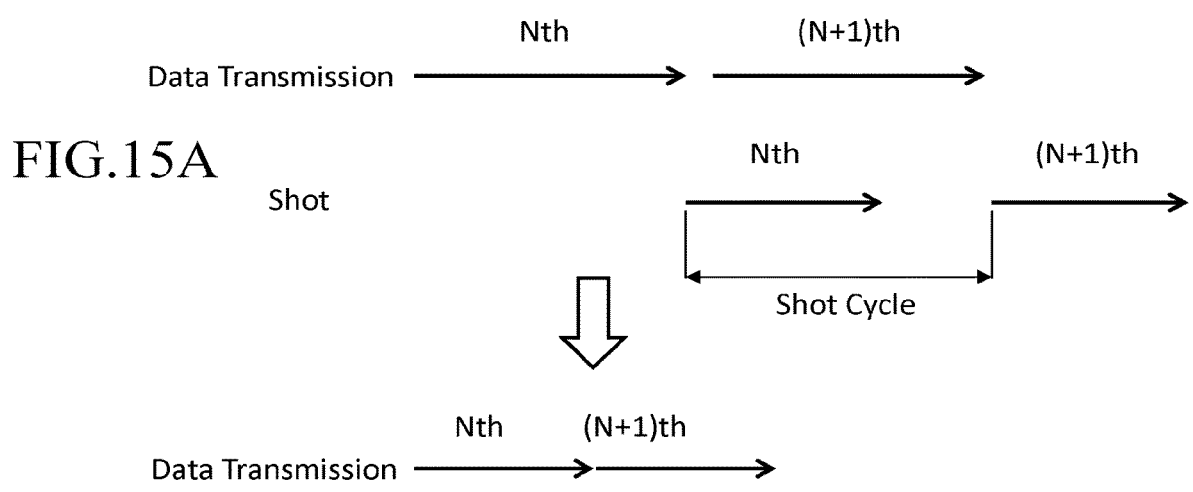
FIGS. 15A and 15B show examples of a time chart according to the first embodiment.
Figure 15B:
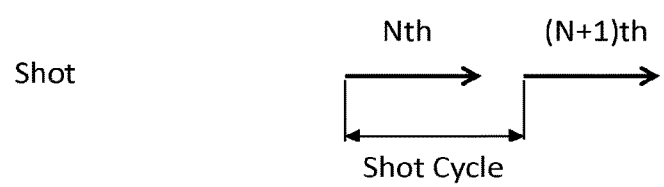

FIGS. 15A and 15B show examples of a time chart according to the first embodiment. FIG. 15A shows an example of a data transfer time and a shot time in the high-speed writing mode using all the beams of the multiple beams 20 implemented to be emittable by the writing mechanism 150. In the high-speed writing mode, it is necessary to transfer ON/OFF control signals (shot data) for all the beams of the multiple beams 20 implemented to be emittable by the writing mechanism 150. Moreover, with respect to each shot time, the maximum irradiation time corresponding to the maximum dose modulated based on the maximum dose modulation amount is needed. A shot cycle (time) is set in consideration of the maximum irradiation time and the data transfer time for each shot. FIG. 15A shows the case where the data transfer time is longer than the maximum irradiation time. In that case, the shot cycle is determined based on the data transfer time. On the other hand, in the high-accuracy writing mode, as described above, by restricting the use region to the central portion, and making the ON/OFF control signal (shot data) for each shot of the beam array of effective columns including the use region stand ready in each of the shift registers 40a and 40b for the beam array (the third beam array) of ineffective columns on the peripheral side, it is possible to transfer the shot data by clock signals performed smaller number of times compared to those performed in the case of emitting all the beams mounted. Therefore, the transfer time can be shortened as shown in FIG. 15B. Further, as described above, since the use region is restricted to the central portion, the product between the maximum value of the dose correction coefficient $D_m$ of each beam in the central portion and the maximum value of the dose correction coefficient $D_J$ can be made smaller than the product between the maximum value of the dose correction coefficient $D_m$ of each beam in the region of all the multiple beams 20 and the maximum value of the dose correction coefficient $D_{J(k)}$. Therefore, it is possible to make the maximum dose modulation amount smaller by the amount of the product difference. Accordingly, as shown in FIG. 15B, the maximum irradiation time corresponding to the maximum dose modulated based on the maximum dose modulation amount can be shortened. Thus, as shown in FIG. 15B, it is possible to make the shot cycle (time) shorter than that in the case of writing using all of the multiple beams 20.

In the shot cycle setting step (S138), the writing control unit 78 sets the calculated shot cycle (time). Since, in the high-accuracy writing mode, the number of beams is smaller than that used in the high-speed writing mode using all of the multiple beams 20 implemented to be emittable by the writing mechanism 150, the region which can be written at a time is smaller by the amount of difference between the number of the beams.

Therefore, if the writing processing is performed in the same shot cycle as that of the high-speed writing mode, the writing time becomes longer in accordance with the reduction of the number of beams. However, according to the first embodiment, by recalculating the shot cycle used in the case of restricting the use region to the central portion of the region of all the multiple beams 20 implemented to be emittable by the writing mechanism 150, the shot cycle can be shortened and degradation of the throughput can be inhibited.

In the lens control value changing step (S140), the lens control unit 74 outputs, to the lens control circuit 137, a lens control value for exciting the reducing lens 205 and the objective lens 207, which are used to refract the multiple beams 20, employed in the case of using the beam array in the use range having been set. The lens control circuit 137 switches (changes) the lens control value currently set to the one newly input.

FIG. 16 shows an example of a lens control value table according to the first embodiment. In FIG. 16, the lens control value table (lens table) defines the lens control value related to the number of beams to be used in the multiple beams 20. In the case of FIG. 16, it is defined that when the number of beams is one, the lens control value 1 of the reducing lens 205 is F11, and the lens control value 2 of the objective lens 207 is F21. Further, it is defined that when the number of beams is two, the lens control value 1 of the reducing lens 205 is F12, and the lens control value 2 of the objective lens 207 is F22. That is, it is defined that when the number of beams is N, the lens control value 1 of the reducing lens 205 is F1n, and the lens control value 2 of the objective lens 207 is F2n. The lens control value table is input in advance from the outside of the writing apparatus 100, and stored in the storage device 144. The focusing position of each electromagnetic lens varies depending on the amount of beam current. Therefore, if the same controlling of the electromagnetic lens as that performed in the high-speed writing mode is performed, since the beam current amount has become small in accordance with reduction of the number of beams, the focusing position of each electromagnetic lens may vary. Then, according to the first embodiment, referring to the lens control value table, the lens control unit 74 reads each lens control value in accordance with the number of beams of the beam array in the use range having been set. Then, the lens control unit 74 outputs the read lens control value to the lens control circuit 137. The lens control circuit 137 changes (switches) the lens control values to the ones obtained with reference to the table and based on the number of beams of the beam array in the region having been set. Thereby, deviation of the focus position due to restriction of the beam array region can be corrected.

In the focus checking step (S142), it is checked whether the focus position of the beam array focused (converged) by the objective lens 207 which is excited corresponding to the changed lens control value matches the height position of the surface of the target object 101.

In the determining step (S144), the lens control unit 74 determines whether the focus position based on the set (changed) lens control value is within an acceptable value (that is, whether readjustment is needed or not). When readjustment is unnecessary, it proceeds to the data transfer step (S150). When readjustment is needed, it proceeds to the lens control value correcting step (S146).

In the lens control value correcting step (S146), the lens control unit 74 corrects the set (changed) lens control value, and outputs it to the lens control circuit 137. The lens control circuit 137 changes the set value to the corrected lens control value. For example, the lens control value can be corrected by adding or subtracting a predetermined value to/from the set (changed) lens control value. Then, it returns to the focus checking step (S142), and repeats from the focus checking step (S142) to the lens control value correcting step (S146) until readjustment becomes unnecessary.

Thereby, lens controlling can be performed in accordance with the total current amount of the beams to be used. Therefore, focal deviation resulting from having changed the number of beams can be suppressed, and higher writing accuracy can be acquired.

In the data transfer step (S150), the transfer processing unit 76 transfers, in order of shot, ON/OFF control signals (shot data) for the beam array (the second beam array) of effective columns whose number of beams is smaller than that of the multiple beams 20 (the first beam array) implemented to be emittable by the writing mechanism 150. Specifically, based on the data transfer method having been set, the transfer processing unit 76 transfers, in order of shot, n-bit control signals for controlling ON/OFF of multiple beams grouped per half on the central portion side in the left half of each row of the multiple beams, and n-bit control signals for controlling ON/OFF of multiple beams grouped per half on the central portion side in the right half of each row of the multiple beams. Then, the ON/OFF control signal for each shot is transferred to a desired register, and more specifically, ON/OFF control signals for the first shot are transferred by clock signals performed the same times as those performed in the high-speed writing mode, and ON/OFF control signals for the second and subsequent shots are transferred by clock signals performed ½ times of those in the high-speed writing. With respect to a plurality of shift registers 40 (registers) individually disposed for each beam of the multiple beams 20 (the first beam array) implemented to be emittable by the writing mechanism 150, as shown in FIG. 12C, the transferred shot data for the n-th shot is stored in each of the shift registers 40 (registers) for the beam array (the second beam array) of effective columns, and simultaneously, shot data for the (n+1)th shot is stored in each of the shift registers 40 (registers) for the beam array (the third beam array) of ineffective columns, which are other than the beam array (the second beam array) of effective columns in the first beam array. Since the use region has been restricted to the central portion, the data amount itself can also be suppressed to about ½ of the data amount for all of the multiple beams 20 implemented to be emittable by the writing mechanism 150, thereby reducing the transfer time.

In the writing step (S152), the writing mechanism 150 writes a pattern on the target object 101 with the beam array in the region of the central portion having been set, in the multiple beams 20 implemented to be emittable by the writing mechanism 150. Moreover, the writing mechanism 150 writes a pattern on the target object 101 based on the calculated shot cycle (time). Specifically, the writing mechanism 150 writes a pattern on the target object 101 by performing shots of the beam array (the second beam array) of effective columns including the use region in the central portion. For example, the writing mechanism 150 writes a pattern on the target object 101 by performing the n-th shot of the beam array (the second beam array) of effective columns. As described above, irradiation time data of beam OFF (irradiation time zero) is always generated for the beam array of 2×4 beams located upper part (in the y direction) of the use region, and the beam array of 2×4 beams located lower part (in the y direction) of the use region. Therefore, the beam OFF condition is maintained. Operations of the writing mechanism 150 and the method of writing are the same as those described above except that, due to the restriction of the use region, the size of the irradiation region 34 has become smaller, the beam array to be used is restricted, the shot cycle has become shorter, and the lens control value has been changed.

Thus, when the n-th shot of the beam array (the second beam array) of effective columns including the use region in the central portion is completed, in the data transfer step (S150), shot data for the (n+1)th shot is shifted from each of the shift registers 40 (registers) for the beam array (the third beam array) of ineffective columns to each of the shift registers 40 (registers) for the beam array (the second beam array) of effective columns. Then, receiving a read signal and a shot signal from the deflection control circuit 130, the writing mechanism 150 writes a pattern on the target object 101 by performing the (n+1)th shot of the beam array (the second beam array) of effective columns including the use region of the central portion.

Figure 17:
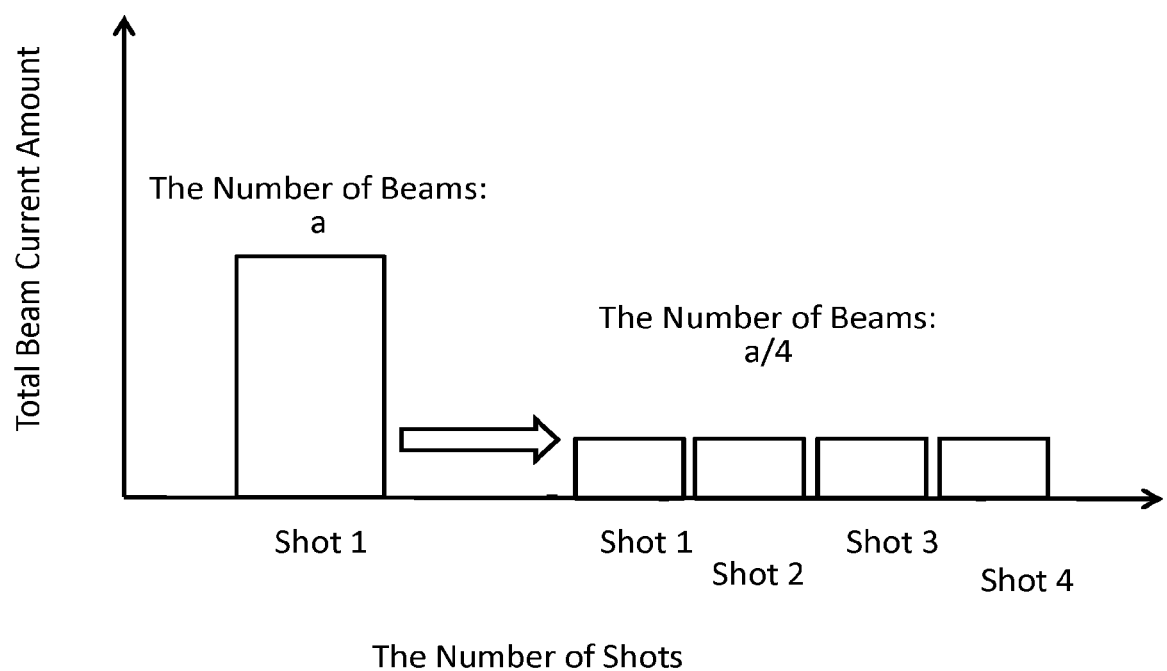
FIG. 17 shows an example of a relation between a total beam current amount and the number of times of shots according to the first embodiment.

FIG. 17 shows an example of a relation between a total beam current amount and the number of times of shots according to the first embodiment. In the high-speed writing mode, since all of the multiple beams 20 implemented to be emittable by the writing mechanism 150 are used, the total beam current amount of one shot is large, which gives influence such as blurring due to the Coulomb effect. In contrast, in the high-accuracy writing mode, since the use region is restricted to the beam array in the region of the central portion, although the number of times of shots for writing the same area increases, it is possible to make the total beam current amount of one shot small, and the influence such as blurring due to the Coulomb effect can be inhibited. In the example of FIG. 17, since the use region is restricted such that the beam array of 8×8 beams is restricted to ¼, that is the beam array of 4×4 beams, the number of times of shots for writing the same area increases four times.

As described above, according to the first embodiment, the high-speed writing mode having a high throughput and the high-accuracy writing mode suppressing writing accuracy degradation due to the Coulomb effect can be selectively used. Moreover, according to the first embodiment, writing accuracy degradation due to the Coulomb effect can be inhibited while suppressing degradation the throughput.

Second Embodiment

Although the first embodiment describes the case where the counter 44 is mounted in the blanking aperture array mechanism 204, and the irradiation time of an individual beam is controlled by the counter 44 of the individual blanking mechanism 47 in the blanking aperture array mechanism 204, it is not limited thereto. A second embodiment describes the case where the irradiation time of an individual beam is controlled by a common blanking mechanism.

Figure 18:
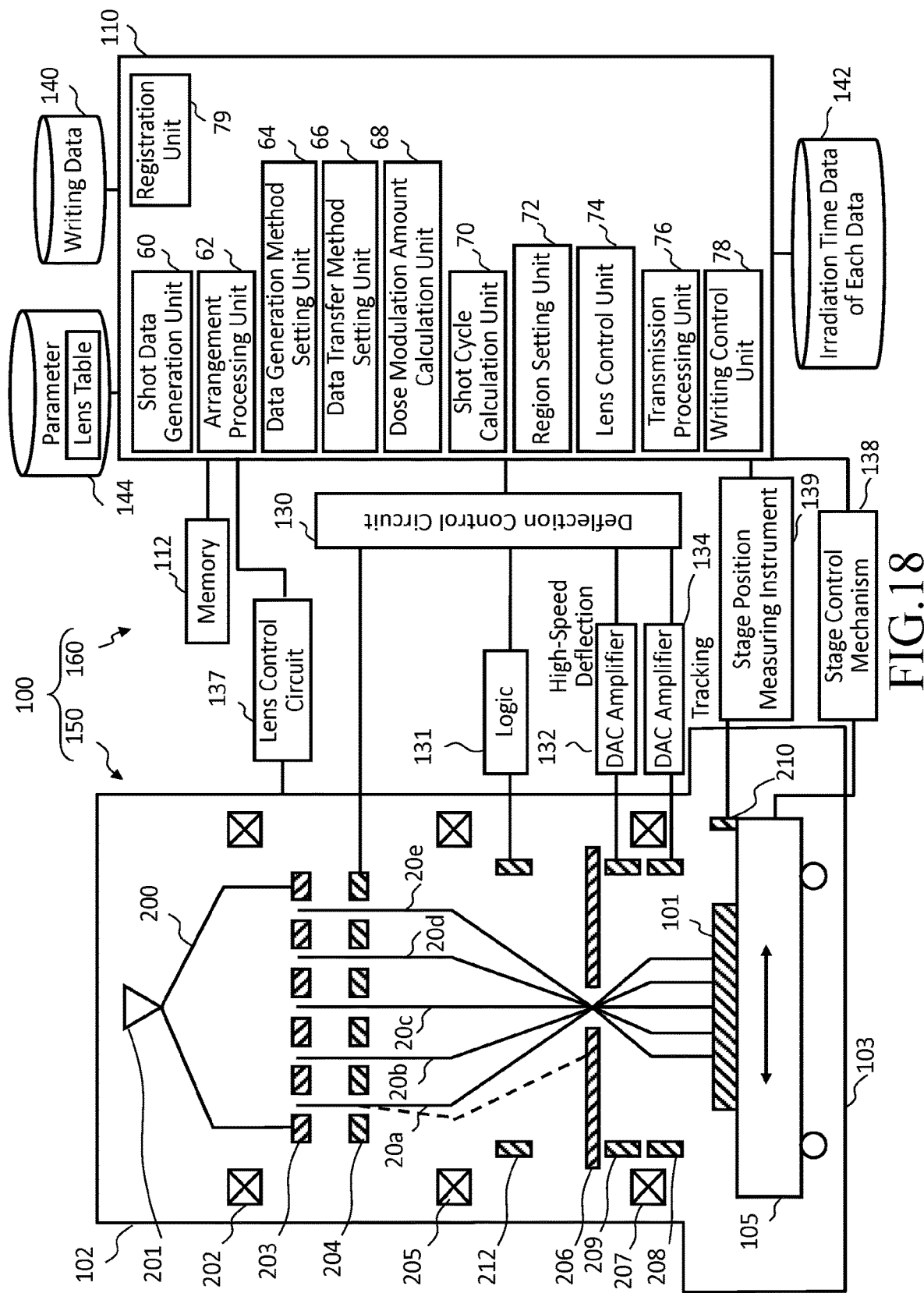
FIG. 18 is a conceptual diagram showing a configuration of a writing apparatus according to a second embodiment.

FIG. 18 is a conceptual diagram showing a configuration of a writing apparatus according to the second embodiment. The contents of FIG. 18 are the same as those of FIG. 1 except that a deflector 212 capable of deflecting all the multiple beams 20 is disposed in the electron optical column 102, and a logic circuit 131 is further included in the control system 160. To the deflection control circuit 130, further the logic circuit 131 is connected through a bus (not shown). The logic circuit 131 is connected to the deflector 212.

The contents of the flowchart showing main steps of a writing method according to the second embodiment is the same as those of FIG. 9. The contents of the second embodiment is the same as those of the first embodiment except what is particularly described below.

Figure 19:
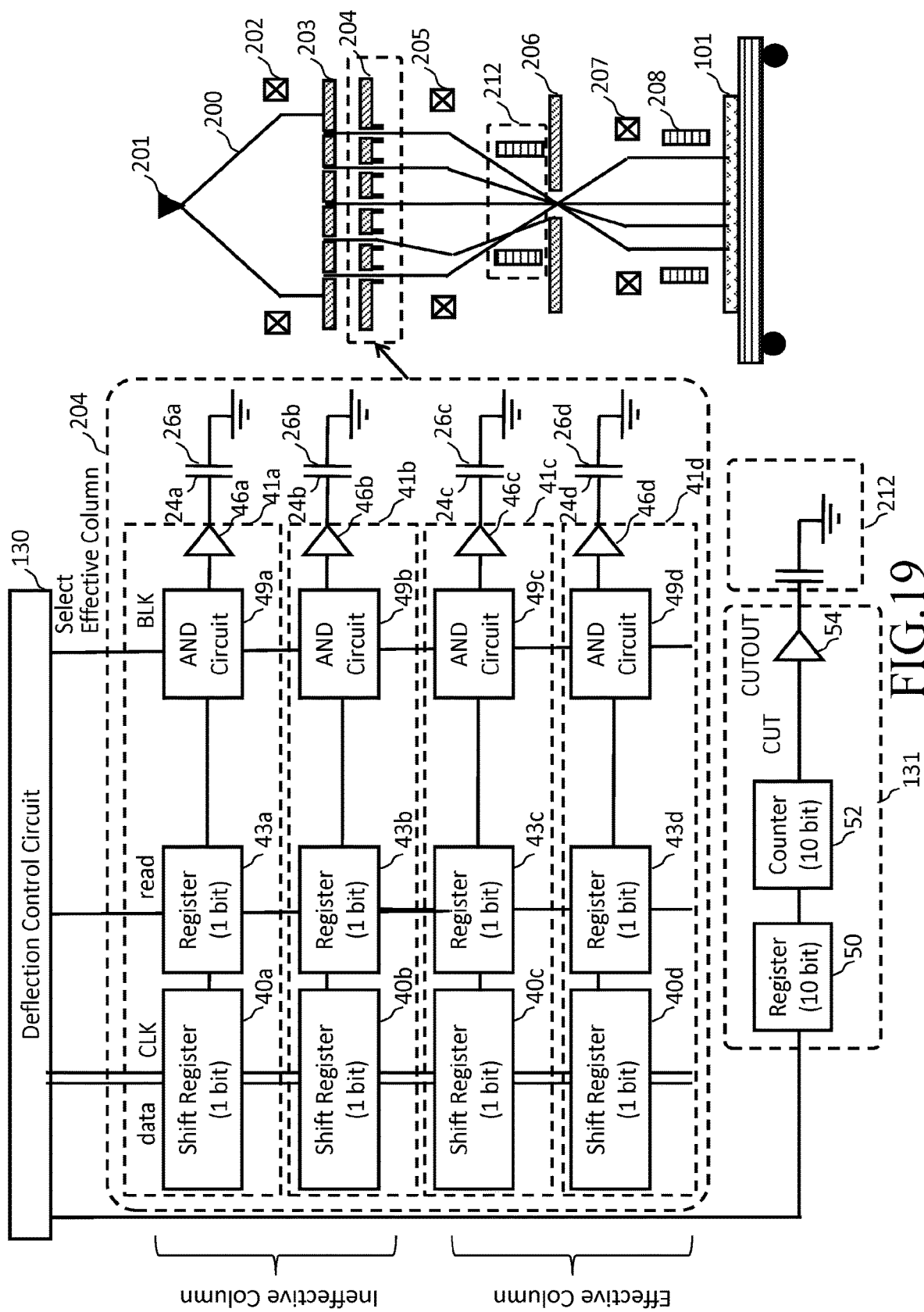
FIG. 19 is a schematic diagram showing the internal configuration of an individual blanking control circuit and a common blanking control circuit according to the second embodiment.

FIG. 19 is a schematic diagram showing the internal configuration of an individual blanking control circuit and a common blanking control circuit according to the second embodiment. As shown in FIG. 19, in each control circuit 41 for individual blanking control disposed in the blanking aperture array mechanism 204 inside the body of the writing apparatus 100, there are arranged the shift register 40, the register 43, the AND circuit 49, and the amplifier 46. Although, in the first embodiment, individual blanking control for each beam is controlled by a control signal of several bits (e.g., ten bits), it is controlled in the second embodiment by a control signal of one bit, for example. That is, a one-bit control signal is input/output to/from the shift register 40 and the register 43. Since the information amount of the control signal is small, the installation area of the control circuit 41 can be made small. In other words, even when the control circuit 41 is disposed in the blanking aperture array mechanism 204 whose installation space is small, more beams can be arranged at a smaller beam pitch.

Moreover, in the logic circuit 131 for common blanking, there are disposed a register 50, a counter 52, and a common amplifier 54. These do not simultaneously perform several different controls, and therefore, it is sufficient to use one circuit to perform ON/OFF control. Accordingly, even when a circuit for a high speed response is arranged, no problem occurs with respect to restriction on the installation space and the current to be used in the circuit. Therefore, the common amplifier 54 operates at very high speed compared to the amplifier 46 that can be implemented in the blanking aperture array mechanism 204. The common amplifier 54 is controlled by a 10-bit control signal, for example. That is, for example, a 10-bit control signal is input/output to/from the register 50 and the counter 52.

According to the second embodiment, blanking control of each beam is performed using both the beam ON/OFF control by each control circuit 41 for individual blanking control described above, and the beam ON/OFF control by the logic circuit 131 for common blanking control that collectively performs blanking control of all the multiple beams. Moreover, according to the second embodiment, beam irradiation equivalent to one shot of a desired irradiation time is performed by dividing the maximum irradiation time of one shot into a plurality of sub irradiation time periods, and combining a plurality of divided shots based on a plurality of sub irradiation time periods.

The contents of each step up to calculating the irradiation time of each beam in the irradiation time data generating step (S120) and the irradiation time data generating step (S130) are the same as those in the first embodiment. Next, the shot data generation unit 60 processes an irradiation time indicated by irradiation time data of each pixel 36 into a plurality of divided shots. Specifically, it is processed as described below.

FIG. 20 shows an example of digit numbers of a plurality of divided shots and their corresponding irradiation time according to the second embodiment. In the second embodiment, the maximum irradiation time Ttr of one shot is divided into n divided shots, which continuously irradiate the same position and each of which has a different irradiation time. First, a gray-scale level value Ntr is defined by dividing the maximum irradiation time Ttr by a quantization unit $\Delta$ (gray-scale level resolution). For example, when n=10, it is divided into ten divided shots. When defining the gray-scale level value Ntr by an n binary digits, the quantization unit $\Delta$ should be set in advance such that the gray-scale level value Ntr is 1023 (Ntr=1023). By this, the maximum irradiation time Ttr is 1023n, (Ttr=1023$\Delta$). As shown in FIG. 20, each of the n divided shots has one of the irradiation time of $2^{k'}\Delta$, where the digit number k' is one of 0 to 9 (k'=0 to 9). In other words, it has the irradiation time of one of 512$\Delta$ (=$2^9\Delta$), 256$\Delta$(=$2^8\Delta$), 128$\Delta$ (=$2^7\Delta$), 64$\Delta$ (=$2^6\Delta$), 32$\Delta$ (=$2^5\Delta$), 16$\Delta$ (=$2^4\Delta$), 8$\Delta$ (=$2^3\Delta$), 4$\Delta$ (=$2^2\Delta$), 2$\Delta$ (=$2^1\Delta$), and $\Delta$ (=$2^0\Delta$). That is, one shot of the beam array is divided into a divided shot having the irradiation time tk' of 512$\Delta$, a divided shot having the irradiation time tk' of 256$\Delta$, a divided shot having the irradiation time tk' of 128$\Delta$, a divided shot having the irradiation time tk' of 64$\Delta$, a divided shot having the irradiation time tk' of 32$\Delta$, a divided shot having the irradiation time tk' of 16$\Delta$, a divided shot having the irradiation time tk' of 8$\Delta$, a divided shot having the irradiation time tk' of 4$\Delta$, a divided shot having the irradiation time tk' of 2$\Delta$, and a divided shot having the irradiation time tk' of $\Delta$.

Therefore, an arbitrary irradiation time t (=N$\Delta$) for irradiating each pixel 36 can be defined by at least one combination of 512$\Delta$ (=$2^9\Delta$), 256$\Delta$ (=$2^8\Delta$), 128$\Delta$ (=$2^7\Delta$), 64$\Delta$ (=$2^6\Delta$), 32$\Delta$ (=$2^5\Delta$), 16$\Delta$ (=$2^4\Delta$), 8$\Delta$ (=$2^3\Delta$), 4$\Delta$ (=$2^2\Delta$), 2$\Delta$ (=$2^1\Delta$), $\Delta$ (=$2^0\Delta$), and zero (0). For example, when there is a shot whose gray-scale level value N is N=50, since 50=$2^5$+$2^4$+$2^1$, it means a combination of a divided shot having the irradiation time of $2^5\Delta$, a divided shot having the irradiation time of $2^4\Delta$, and a divided shot having the irradiation time of $2^1\Delta$. When converting the gray-scale level value N of an arbitrary irradiation time t for irradiating each pixel 36 into a binary number, it is preferable to define to use a value of a possible larger number of digits.

The shot data generation unit 60 first calculates gray-scale level value N data being integers by dividing the irradiation time t acquired for each pixel 36 by a quantization unit Δ (gray-scale level resolution). The gray-scale level value N data is defined by a gray-scale level value from 0 to 1023, for example. The quantization unit Δ can be set variously, and, for example, it can be defined by 1 ns (nanosecond), etc. It is preferable that a value of 1 to 10 ns, for example, is used as the quantization unit Δ. Here, as described above, the quantization unit Δ is set such that the gray-scale level value Ntr of the maximum irradiation time Ttr per shot is 1023. However, it is not limited thereto. What is necessary is to set the quantization unit Δ such that the gray-scale level value Ntr of the maximum irradiation time Ttr is 1023 or less.

Next, the shot data generation unit 60 determines, for each pixel 36, whether to make each divided shot of a plurality of divided shots beam ON or beam OFF so that the total irradiation time of divided shots to be beam ON may be a combination equivalent to a calculated beam irradiation time. The irradiation time t acquired for each pixel 36 is defined by the following equation (1) using an integer $w_{k'}$ indicating either value 0 or 1, and an irradiation time $t_{k'}$ of the k'-th digit divided shot in n divided shots. The divided shot whose integer $w_{k'}$ is 1 can be determined to be ON, and the divided shot whose integer $w_{k'}$ is 0 (zero) can be determined to be OFF.

$$t = \sum_{k'=0}^{n-1} w_{k'} t_{k'} \quad (1)$$

For example, when N=700, it becomes w9=1, w8=0, w7=1, w6=0, w5=1, w4=1, w3=1, w2=1, w1=0, and w0=0. Therefore, it can be determined that the divided shot of t9 is ON, the divided shot of t8 is OFF, the divided shot of t7 is ON, the divided shot of t6 is OFF, the divided shot of t5 is ON, the divided shot of t4 is ON, the divided shot of t3 is ON, the divided shot of t2 is ON, the divided shot of t1 is OFF, and the divided shot of t0 is OFF.

Next, the shot data generation unit 60 generates irradiation time array data of a divided shot for dividing one shot into a plurality of divided shots which continuously irradiate the same position and each of which has a different irradiation time. The shot data generation unit 60 generates, for each pixel 36, irradiation time array data of a divided shot to be applied to the pixel concerned. For example, when N=50, 50=$2^5$+$2^4$+$2^1$. Therefore, it becomes "0000110010". For example, when N=500, it becomes "0111110100". When N=700, it becomes "1010111100". For example, when N=1023, it becomes "1111111111".

In the data array processing step (S122) and the data array processing step (S132), the array processing unit 62 processes irradiation time array data in order of shot of each beam. Here, in accordance with the writing sequence, the array processing unit 62 processes the order such that irradiation time array data of each pixel 36 is arranged in order of pixel 36 to be shot by the multiple beams 20 sequentially. Also, with respect to each divided shot in each shot, the array processing unit 62 processes the order such that the ON/OFF control signals are arranged in order of the shift registers 40 connected in series. The processed ON/OFF control signal is stored in the storage device 142.

The contents of each of the remaining steps (the maximum dose modulation amount calculating step (S134), the shot cycle calculating step (S136), the shot cycle setting step (S138), the lens control value changing step (S140), the focus checking step (S142), the determining step (S144), the lens control value correcting step (S146), the data transfer step (S150), and the writing step (S152)) are the same as those in the first embodiment. In the writing step (S152), the amplifier 46 for each beam switches the electric potential to be applied to the control electrode 24, in accordance with the ON/OFF control signal stored in the register 43 for the beam concerned. For example, if the ON/OFF control signal is "1", an H electric potential (active potential) is input to the CMOS inverter circuit. By this, the output of the CMOS inverter circuit becomes a ground potential, thereby becoming a beam ON condition. For example, if the ON/OFF control signal is "0", an L electric potential is input to the CMOS inverter circuit. By this, the output of the CMOS inverter circuit becomes a positive potential, thereby becoming a beam OFF condition.

Moreover, at the same time, the deflection control circuit 130 outputs a common ON/OFF control signal indicating the irradiation time of the k-th divided shot to the register 50 of the logic circuit 131 of the common blanking mechanism. Thereby, the common ON/OFF control signal for the k-th divided shot is read into the register 50 for common blanking.

Next, the deflection control circuit 130 outputs a shot signal to the counter 52 of the logic circuit 131 in the common blanking mechanism. Thereby, the counter 44 for common blanking outputs a beam ON signal to the common amplifier 54 only during the time indicated by the common ON/OFF control signal stored in the register 50 for common blanking. Specifically, the number of counts equivalent to the irradiation time of the current divided shot is counted at the clock cycle. Then, only during the counting, the input of the CMOS inverter circuit (not shown) is made to be H (active). After the time indicated by the common ON/OFF control signal has passed, a beam OFF signal is output to the common amplifier 54. Specifically, after completing the counting, the input of the CMOS inverter circuit is made to be L.

Here, for the k-th divided shot, a deflection electric potential for beam ON or beam OFF has already been applied to the control electrode 24 from each amplifier 46, in accordance with the ON/OFF control signal. In such a state, the deflector 212 for common blanking controls the irradiation time of the current divided shot. That is, only while the counter 44 is outputting a beam ON signal, all of the multiple beams 20 can pass through the opening of the limiting aperture substrate 206 without being blanking-deflected. In contrast, during the other time period, all of the multiple beams 20 are blanking-deflected and blocked by the limiting aperture substrate 206. Thus, the irradiation time of each divided shot is controlled by the deflector 212 for common blanking.

As described above, according to the second embodiment, even when performing irradiation of a desired irradiation time by combining a plurality of divided shots, it is possible to make the total current amount per divided shot small and to suppress the influence due to the Coulomb effect, by restricting the use region to the beam array in the region of the central portion, similarly to the first embodiment. Moreover, according to the second embodiment, by restricting the use region to the central portion, similarly to the first embodiment, it is possible to reduce the number of times of clock signals at the data transfer time, to make the maximum irradiation time small, and to shorten the shot cycle. Moreover, similarly to the first embodiment, when reducing the number of beams by restricting the use region to the central portion, the lens control value is switched (changed) based on the number of beams to be used.

As described above, according to the second embodiment, the high-speed writing mode having a high throughput and the high-accuracy writing mode suppressing writing accuracy degradation due to the Coulomb effect can be selectively used. Moreover, according to the second embodiment, writing accuracy degradation due to the Coulomb effect can be inhibited while suppressing degradation the throughput even when performing irradiation of a desired irradiation time by combining a plurality of divided shots.

Third Embodiment

Although the first and second embodiments describe the case where the beam current amount is reduced by restricting the irradiation region of the beam array to be used to the central portion of the irradiation region of all the multiple beams 20 implemented to be emittable by the writing mechanism 150, the method for suppressing the Coulomb effect is not limited thereto. A third embodiment describes the configuration in which the beam current amount is reduced by performing region division by dividing the irradiation region of all the multiple beams 20 implemented to be emittable by the writing mechanism 150. The structure of the writing apparatus 100 of the third embodiment may be the same as that of FIG. 1.

Figure 21:
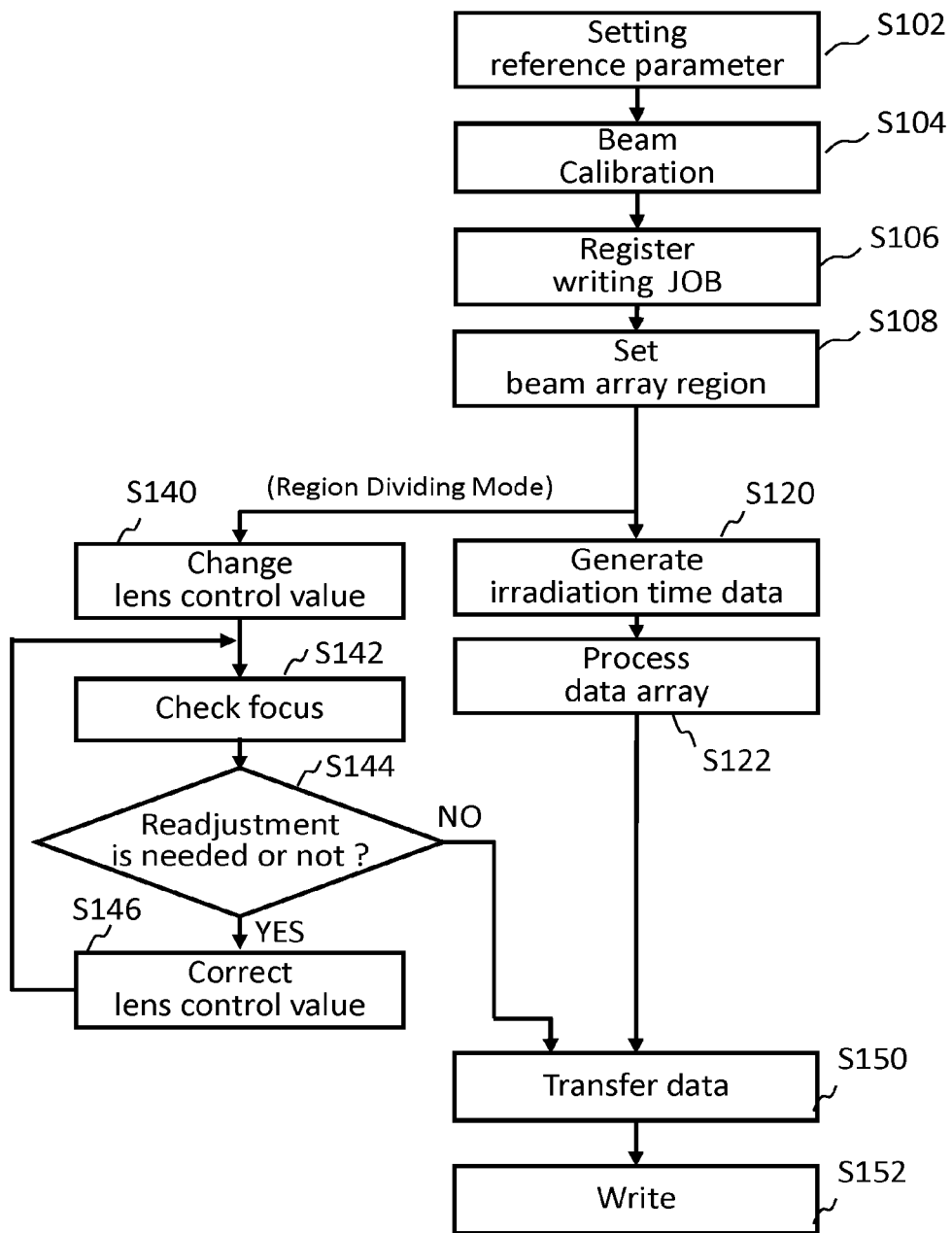
FIG. 21 is a flowchart showing main steps of a writing method according to a third embodiment.

FIG. 21 is a flowchart showing main steps of a writing method according to the third embodiment. The contents of FIG. 21 are the same as those of FIG. 9 except that the data generation method setting step (S110), the data transfer method setting step (S112), the irradiation time data generating step (S130), the data array processing step (S132), the maximum dose modulation amount calculating step (S134), the shot cycle calculating step (S136), and the shot cycle setting step (S138) are not included.

The contents of the reference parameter setting step (S102), the beam calibration step (S104), and the writing job registration step (S106) are the same as those of the first embodiment.

In the beam array region setting step (S108), the region setting unit 72 (region dividing unit) divides the irradiation region of the multiple beams 20 implemented to be emittable by the writing mechanism 150 into a plurality of regions to be set.

Figure 22:
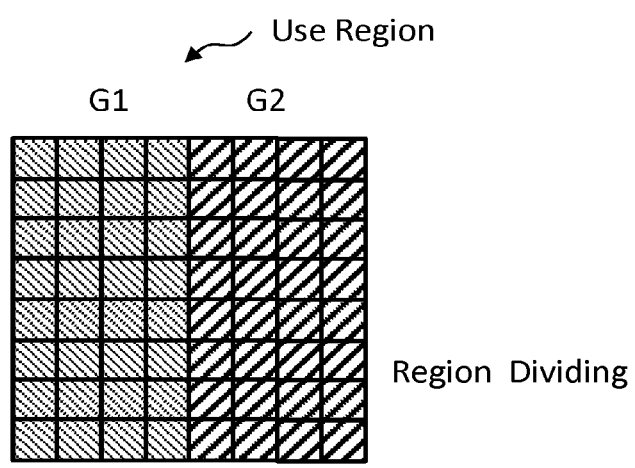
FIG. 22 shows an example of a method for region division according to the third embodiment.

FIG. 22 shows an example of a method for region division according to the third embodiment. FIG. 22 shows the case of 8×8 multiple beams 20 implemented to be emittable by the writing mechanism 150. When using the high-speed writing mode, the region setting unit 72 sets the region of all the multiple beams 20 implemented to be emittable by the writing mechanism 150, as an irradiation region (use region) of the beam array to be used. In the example of FIG. 22, the region setting unit 72 sets the region of all the 8×8 multiple beams 20. In contrast, in the case of using the high-accuracy writing mode, as shown in FIG. 22, the region setting unit 72 divides the irradiation region of all the p×q multiple beams 20 implemented to be emittable by the writing mechanism 150 into two groups (G1 and G2), and sets the region for each group. In the example of FIG. 22, they are divided into a group G1 of the beam array of 4×8 beams in the left half, and a group G2 of the beam array of 4×8 beams in the right half. Thus, the use region of the beam array is divided. Then, in each shot processing of the multiple beams 20, the shot timing is shifted for each group. Thereby, the total current amount per shot can be made small. As a result, it is possible to suppress degradation of writing accuracy due to the Coulomb effect. In the example of FIG. 22, since the multiple beams 20 of 8×8 beams is divided into beam arrays each of 4×8 beams, the amount of current can be reduced to around ½ in a simple calculation.

The contents of the irradiation time data generating step (S120) and the data array processing step (S122) are same as those of the first embodiment. Specifically, the shot data generation unit 60 generates an ON/OFF control signal (shot data) for each shot of all the multiple beams 20 implemented to be emittable by the writing mechanism 150. The array processing unit 62 rearranges the ON/OFF control signal for each pixel 36 in order of shot and in order of beam transfer.

In the lens control value changing step (S140), the lens control unit 74 outputs, to the lens control circuit 137, a lens control value for exciting the reducing lens 205 and the objective lens 207, which are used to refract the multiple beams 20, employed in the case of using the beam array in the use range having been set. The lens control circuit 137 switches (changes) the lens control value currently set to the one newly input.

Specifically, referring to the lens control value table shown in FIG. 16, the lens control unit 74 reads each lens control value in accordance with the number of beams of the beam array in the use range having been set. According to the third embodiment, since region dividing has been performed into a plurality of groups, the lens control value in accordance with the number of beams per group may be read. Then, the lens control circuit 137 changes (switches) the lens control values to the ones obtained with reference to the table and based on the number of beams of the beam array in the region having been set. Thereby, deviation of the focus position due to restriction of the beam array region can be corrected.

In the focus checking step (S142), it is checked whether the focus position of the beam array focused (converged) by the objective lens 207 which is excited corresponding to the changed lens control value matches the height position of the surface of the target object 101.

In the determining step (S144), the lens control unit 74 determines whether the focus position based on the set (changed) lens control value is within an acceptable value (that is, whether readjustment is needed or not). When readjustment is unnecessary, it proceeds to the data transfer step (S150). When readjustment is needed, it proceeds to the lens control value correcting step (S146).

In the lens control value correcting step (S146), the lens control unit 74 corrects the set (changed) lens control value, and outputs it to the lens control circuit 137. The lens control circuit 137 changes the set value to the corrected lens control value. For example, the lens control value can be corrected by adding or subtracting a predetermined value to/from the set (changed) lens control value. Then, it returns to the focus checking step (S142), and repeats from the focus checking step (S142) to the lens control value correcting step (S146) until readjustment becomes unnecessary.

Thereby, lens controlling can be performed in accordance with the total current amount of the beams to be used. Therefore, focal deviation resulting from having changed the number of beams can be suppressed, and higher writing accuracy can be acquired.

In the data transfer step (S150), for each shot, the transfer processing unit 76 collectively transfers the ON/OFF control signals each for the shot concerned to the deflection control circuit 130. Then, for each shot, the deflection control circuit 130 collectively transmits the ON/OFF control signals each for each beam of the multiple beams 20 to the blanking aperture array mechanism 204 (blanking apparatus). Specifically, for each shot, the deflection control circuit 130 transmits, in a batch, the ON/OFF control signals to the control circuits 41 each for each beam of the blanking aperture array mechanism 204. In other words, the ON/OFF control signals for a plurality of groups G1 and G2 are transferred collectively.

Figure 23:
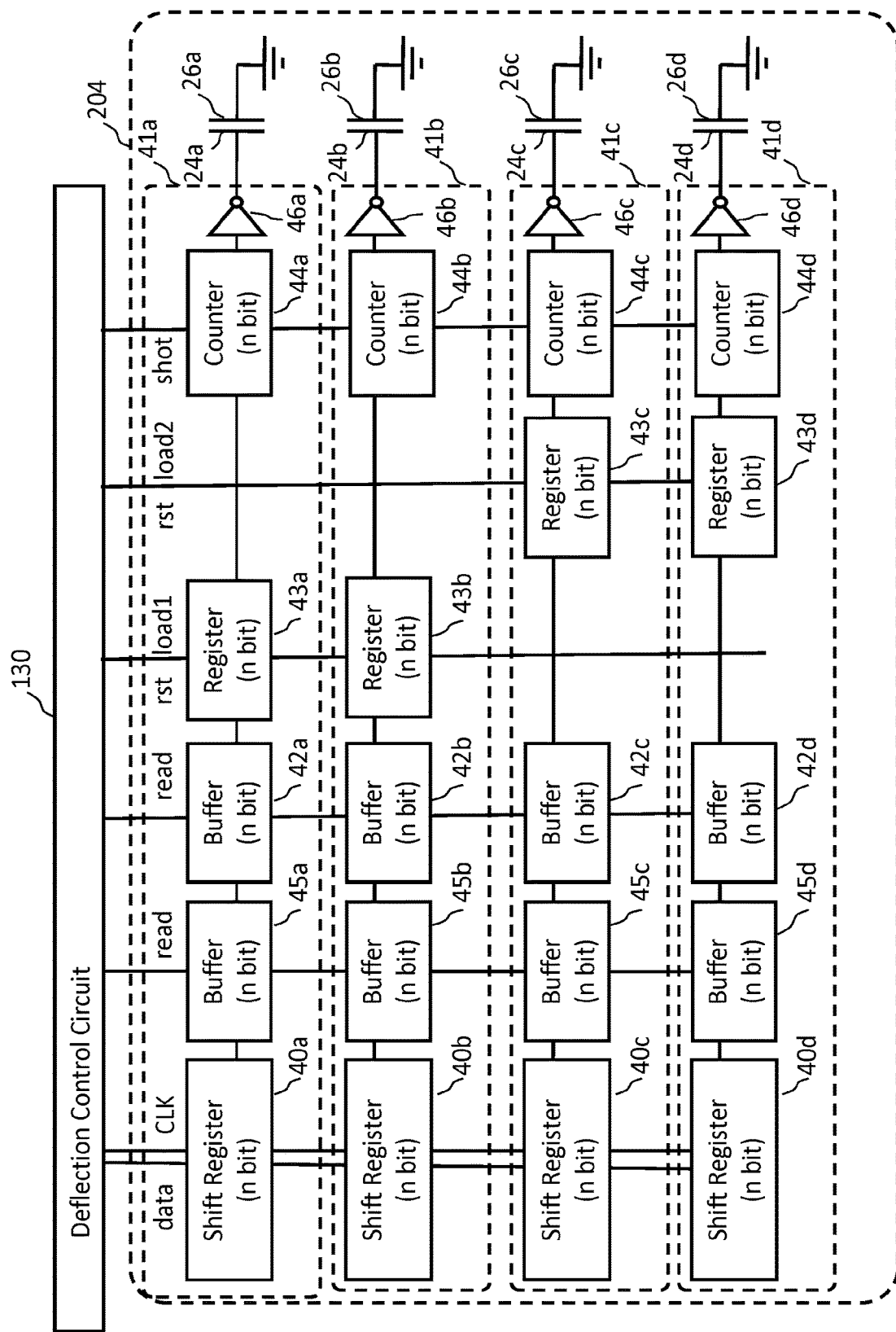
FIG. 23 is a schematic diagram showing the internal configuration of an individual blanking control circuit according to the third embodiment.

FIG. 23 is a schematic diagram showing the internal configuration of an individual blanking control circuit according to the third embodiment. As shown in FIG. 23, in each control circuit 41 for individual blanking control disposed in the blanking aperture array mechanism 204 inside the body of the writing apparatus 100, there are arranged the shift register 40, a buffer register 45, a buffer register 42, the register 43, the counter 44, and the amplifier 46. According to the third embodiment, individual blanking control for each beam is performed by an n-bit (e.g., ten bit) control signal. Here, for example, with respect to the multiple beams 20 composed of p×q beams in an array (matrix), the shift registers 40 in the control circuits 41 for p beams in the same row, for example, are connected in series. The example of FIG. 23 shows the case where the shift registers 40a, 40b, 40c, and 40d of the control circuits 41 for four beams in the same row are connected in series. According to the third embodiment, the p×q multiple beams 20 are grouped into a plurality of groups as shown in FIG. 22. For example, they are grouped into two groups of G1 in the left half and G2 in the right half. The registers 43 (storage devices) in the same group are connected with each other. In other words, a plurality of registers 43 (storage devices) disposed inside the substrate 31 perform grouping of the multiple beams 20 into a plurality of groups. In the example of FIG. 23, with respect to control circuits 41a to 41d for four beams arranged in the same row, where the shift registers 40 are connected in series, the registers 43a and 43b are connected as the same group G1, and the registers 43c and 43d are connected as the same group G2. Then, according to the third embodiment, a plurality of registers 43 (storage devices) arranged inside the substrate 31 output ON/OFF control signals, each stored in the register 43 concerned, to the corresponding amplifiers 46 (switching circuits) while shifting the timing for each group. Hereinafter, it will be described specifically.

Figure 24:
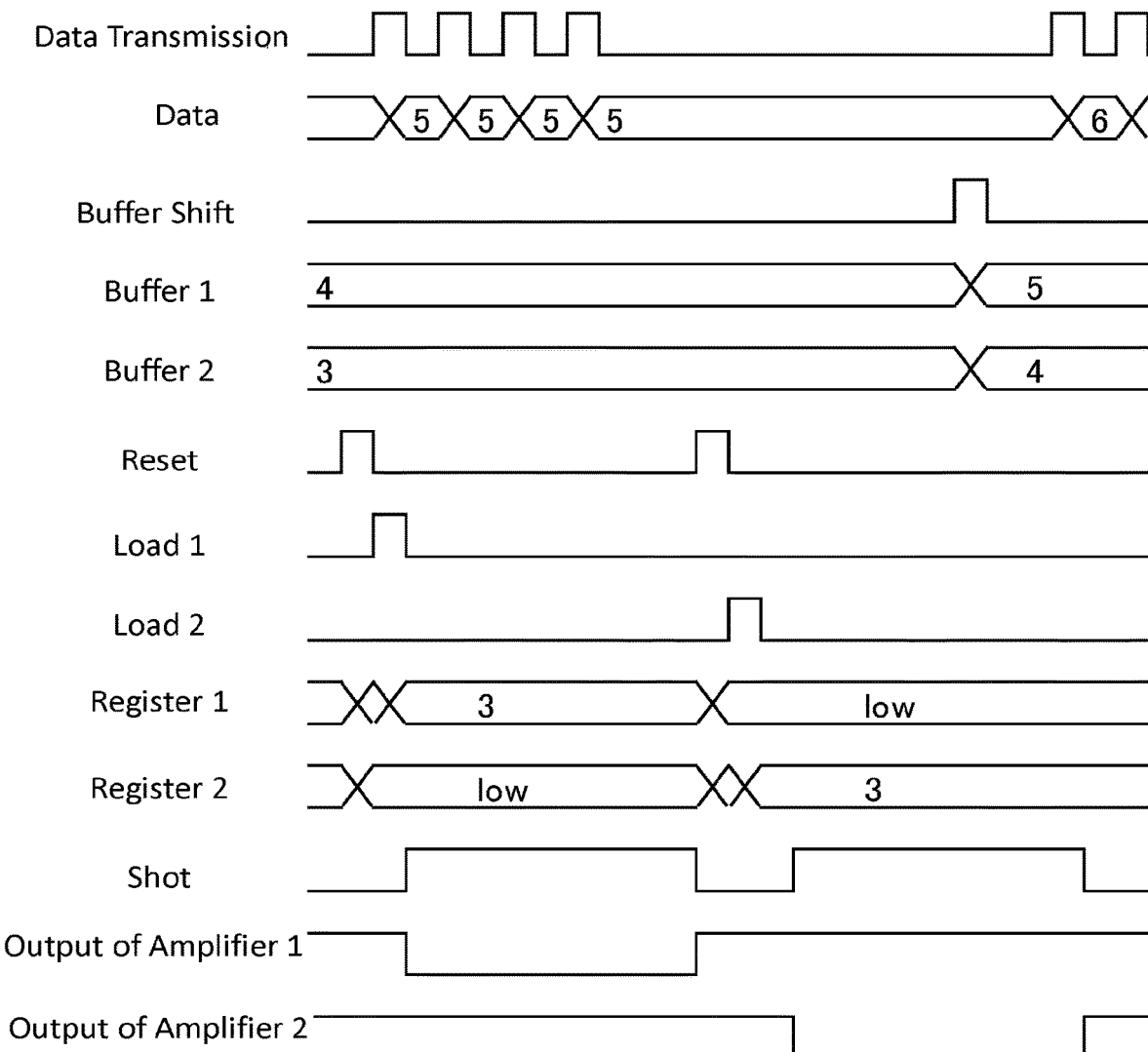
FIG. 24 shows transfer processing of an ON/OFF control signal for multiple beams and operations in a control circuit according to the third embodiment.

FIG. 24 shows transfer processing of an ON/OFF control signal for multiple beams and operations in a control circuit according to the third embodiment. As described above, according to the third embodiment, there are serially connected the shift registers 40a, 40b, 40c, 40d, and so on for p beams in the same row, for example, in the p×q multiple beams 20 implemented to be emittable by the writing mechanism 150. Therefore, in one shot of the multiple beams, there are n-bit ON/OFF control signals grouped for each row of the multiple beams, where the number of the grouped ON/OFF control signals is the number of beams of each column of the multiple beams. Such data group is transmitted in a batch to the blanking aperture array mechanism 204 from the deflection control circuit 130, for each shot of the multiple beams. For example, the data groups are collectively transferred in parallel. When the ON/OFF control signals for the n-th shot are transmitted in a batch, the ON/OFF control signal for each beam is stored in the corresponding shift register 40 by p clock signals, for example. The example of FIG. 24 shows the case where the ON/OFF control signals for the fifth shot are collectively transmitted. In the case of FIG. 24, the ON/OFF control signals for four beams are stored in the corresponding shift registers 40a, 40b, 40c, and 40d by four clock signals. It should be understood that, as described in the first embodiment, with respect to the multiple beams 20 composed of p×q beams, the shift registers 40 in the control circuits 41 for the left half (first to p/2th beams in the x direction) of p beams in the same row are connected in series from the peripheral side toward the center side (in the x direction), and the shift registers 40 in the control circuits 41 for the right half ((p/2+1)th to pth beams in the x direction) of p beams in the x direction and in the same row are connected in series from the peripheral side toward the center side (in the −x direction), for example.

In the writing step (S152), the writing mechanism 150 writes a pattern on the target object 101 by performing irradiation with the beam array in the region concerned, using electromagnetic lenses, such as the reducing lens 205 and the objective lens 207 whose lens control value has been changed based on the number of beams, while shifting the irradiation timing for each divided region (group). Specifically, it operates as follows.

The ON/OFF control signal for the (k+1)th shot has been stored in a buffer register 45a (buffer 1) for each beam at the time when the ON/OFF control signals for the (k+2)th shot are being transmitted in a batch. Moreover, at the same time, the ON/OFF control signal for the k-th shot has been stored in a buffer register 42a (buffer 2) for each beam. In the case of FIG. 24, the ON/OFF control signal for the fourth shot, being the last (previous, most recent) shot, has been stored in the buffer register 45a (buffer 1) for each beam at the time when the ON/OFF control signals for the fifth shot are being transmitted in a batch. The ON/OFF control signal for the last-but-one shot, that is the third shot, has been stored in the buffer register 42a (buffer 2) for each beam.

While the ON/OFF control signals for the (k+2)th shot are being transmitted in a batch, a reset signal is output to each register 43 from the deflection control circuit 130. Thereby, the ON/OFF control signals stored in the registers 43 for all the beams are eliminated.

Next, as the shot of G1, first, the deflection control circuit 130 outputs a read 1 signal (load 1) of the group 1 to the registers 43 in the group 1. Accordingly, the ON/OFF control signal for the k-th shot stored in the buffer register 42a (buffer 2) is read into the register 43 (register 1) of the group G1. On the other hand, since the registers 43 (register 2) in the group G2 have been in a reset state, no ON/OFF control signal for the shot is read. Therefore, in such a state, the ON/OFF control signals for the k-th shot (the third shot in the example of FIG. 24) have been stored only in the registers 43 (register 1) of the group 1.

Next, the deflection control circuit 130 outputs first shot signals (for group G1) to the counters 44 of all the beams. Accordingly, the counter 44 for each beam outputs a beam ON signal to the amplifier 46 only during the time indicated by the ON/OFF control signal stored in the register 43 for the beam concerned. Specifically, the number of counts equivalent to the irradiation time of the beam concerned indicated by the ON/OFF control signal is counted at the clock cycle. Then, only during the counting, the input of the CMOS inverter circuit (amplifier 46) is made to be H (active). After the time indicated by the ON/OFF control signal has passed, a beam OFF signal is output to the amplifier 46. Specifically, after completing the counting, the input of the CMOS inverter circuit (amplifier 46) is made to be L. Here, since the ON/OFF control signals for the k-th shot have been stored in the registers 43 in the group G1, the counters 44 of the group G1 output beam ON signals to the amplifiers 46 only during the time indicated by the ON/OFF control signals. On the other hand, since the ON/OFF control signals for the k-th shot have not been stored in the registers 43 in the group G2, the counters 44 of the group G2 output beam OFF signals to the amplifiers 46.

Therefore, the amplifier 46 of the group G1 makes the beam concerned pass through the opening of the limiting aperture substrate 206 without deflecting it, by applying a ground potential to the control electrode 24 only during the beam ON signal being input from the counter 44. On the other hand, since a beam ON signal is not input from the counter 44, the amplifier 46 of the group G2 blocks the beam concerned by the limiting aperture substrate 206 by providing blanking deflection to the beam concerned, by applying a positive electric potential (Vdd) to the control electrode 24. Thereby, the k-th shot (shot k1) of the group G1 is executed. With respect to the shot k1, the operation of the writing mechanism 150 is the same as that described above. However, here, only the beams of the group G1 are in a beam ON condition during the irradiation time having been set.

When the shots (shot 1) of the group G1 have been completed, while the ON/OFF control signals for the (k+2)th shot are transmitted in a batch, the deflection control circuit 130 outputs a reset signal to each register 43. Thereby, the ON/OFF control signals stored in the registers 43 for all the beams are eliminated.

Next, as the shot of the group G2, first, the deflection control circuit 130 outputs a read 2 signal (load 2) of the group G2 to the register 43 of the group G2. Accordingly, the ON/OFF control signal for the k-th shot stored in the buffer register 42a (buffer 2) is read into the register 43 (register 2) of the group G2. On the other hand, since the register 43 (register 1) of the group G1 has been in a reset state, the ON/OFF control signal for the shot is not read. Therefore, in such a state, the ON/OFF control signals for the k-th shot (the third shot in the example of FIG. 24) have been stored only in the registers 43 (register 2) of the group G2.

Next, the deflection control circuit 130 outputs second shot signals (for group G2) to the counters 44 of all the beams. Accordingly, the counter 44 for each beam outputs a beam ON signal to the amplifier 46 only during the time indicated by the ON/OFF control signal stored in the register 43 for the beam concerned. Since the ON/OFF control signals for the k-th shot have been stored in the registers 43 of the group G2, the counters 44 of the group G2 output beam ON signals to the amplifiers 46 only during the time indicated by the ON/OFF control signals. On the other hand, since the ON/OFF control signals for the k-th shot are not stored in the registers 43 of the group G1, the counters 44 of the group G1 output beam OFF signals to the amplifiers 46.

Therefore, the amplifier 46 of the group G2 makes the beam concerned pass through the opening of the limiting aperture substrate 206 without deflecting it, by applying a ground potential to the control electrode 24 only during the beam ON signal being input from the counter 44. On the other hand, since a beam ON signal is not input from the counter 44, the amplifier 46 of the group G1 blocks the beam concerned by the limiting aperture substrate 206 by providing blanking deflection to the beam concerned, by applying a positive electric potential (Vdd) to the control electrode 24. Thereby, the k-th shot (shot k2) of the group G2 is executed. The operation of the writing mechanism 150 is the same as that described above. However, here, only the beams of the group G2 are in a beam ON condition during the irradiation time having been set.

As described above, a plurality of CMOS inverter circuits (amplifiers 46) (an example of a switching circuit) for the multiple beams 20 are arranged inside the substrate 31, and individually connected to a plurality of registers 43, and each of the CMOS inverter circuits switches the electric potential of binary values, in accordance with the ON/OFF control signal stored in the corresponding register 43. Then, during the ON/OFF control signal being transmitted, the CMOS inverter circuit continuously performs shots k1 and k2 of each group while shifting the irradiation timing.

After the load 2 signal has been output and the ON/OFF control signals for the (k+2)th shot have been transmitted in a batch, the deflection control circuit 130 outputs buffer shift signals to the buffer registers 45 and 42. By this, the ON/OFF control signals for the (k+2)th shot stored in the shift registers 40 are shifted to the buffer registers 45 (buffer 1) each for each beam. Simultaneously, the ON/OFF control signals for the (k+1)th shot stored in the buffer registers 45 are shifted to the buffer registers 42 (buffer 2) each for each beam.

After the buffer shift signals have been output, ON/OFF control signals for the next (k+3)th shot are begun to be transmitted in a batch. Hereinafter, it is repeated similarly. Thus, storage devices, such as the shift registers 40, the buffer registers 45, the buffer registers 42, and the registers 43 are arranged inside the substrate 31, and temporarily store the respective ON/OFF control signals for the multiple beams 20 having been transmitted in a batch. Specifically, a plurality of registers 43 (storage device) for the multiple beams 20 perform grouping of the multiple beams 20, and temporarily store the respective ON/OFF control signals for the multiple beams 20 having been transmitted in a batch.

FIG. 24 illustrates the case where the current shot is performed while data transmission for the shot after the next one is being performed using the two buffer registers 45 and 42. However, it is not limited thereto. It is also preferable that the current shot is performed while data transmission for the next shot is being performed using the one buffer register 42. In either case, shots being performed during data transmission should be completed within the data transmission, while shifting the shot timing for each group.

As described above, according to the third embodiment, it is not necessary to divide data transmission for each group. Therefore, degradation of the throughput can be inhibited. Moreover, according to the third embodiment, the ON/OFF control signal to be transmitted has no information to identify the group for which shot timing should be shifted. Nonetheless, as shown in FIGS. 23 and 24, by the circuit configuration in the blanking aperture array mechanism 204, beam irradiation is performed while shifting the shot timing for each group, based on data having been transmitted as the same shot. Thereby, it becomes unnecessary to define special information for the ON/OFF control signal. Moreover, according to the third embodiment, it is not necessary to perform controlling while particularly identifying beam groups by the control mechanism, such as the control computer 110 and the deflection control circuit 130.

Figure 25:
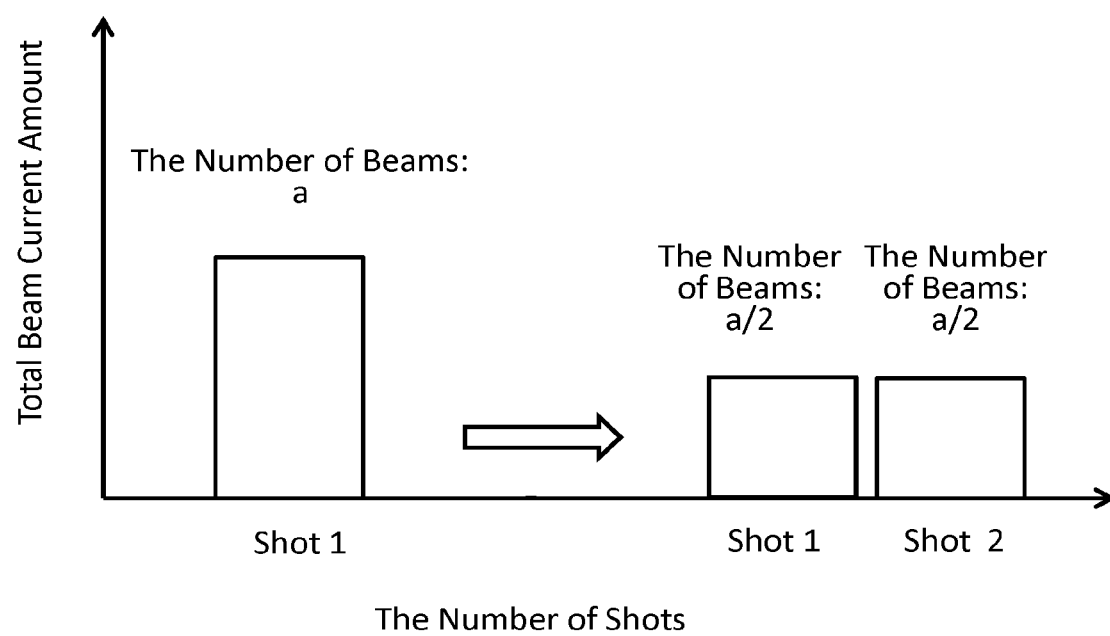
FIG. 25 shows an example of a relation between the total beam current amount and the number of times of shots according to the third embodiment.

FIG. 25 shows an example of a relation between the total beam current amount and the number of times of shots according to the third embodiment. FIG. 25 shows the case where, in the high-speed writing mode, since all of the multiple beams 20 implemented to be emittable by the writing mechanism 150 are used, irradiation is performed with all the multiple beams 20 at the same irradiation timing for each shot. In such a case, since the irradiation time differs depending on each beam, the influence of the Coulomb effect is greatest at the time of starting irradiation (exposure). On the other hand, since a part of beam irradiation has already been finished at around the maximum exposure time, the Coulomb effect affects less. Accordingly, it is desirable to decrease the total current amount of all the beams at the time of starting irradiation (exposure) in order to inhibit the influence of the Coulomb effect. In the high-accuracy writing mode of the third embodiment, since the multiple beams 20 are grouped into a plurality of groups, and, at each shot time, the irradiation timing is shifted for each group, the total beam current amount of the group concerned at the time of staring irradiation (exposure) of each group can be made smaller than that of all the beams at the staring time of simultaneous irradiation (exposure) of all the multiple beams 20. Therefore, the influence of Coulomb effect can be reduced. Moreover, since data transmission of each shot can be completed by one-time transmission, degradation of the throughput due to increase of transmission time can be avoided. In the high-speed writing mode, since all of the multiple beams 20 implemented to be emittable by the writing mechanism 150 are used, the total beam current amount of one shot is large, which gives influence such as blurring due to the Coulomb effect. In contrast, in the high-accuracy writing mode, since the beam array region is divided, although the number of times of shots for writing the same area increases, it is possible to make the total beam current amount of one shot small, and the influence such as blurring due to the Coulomb effect can be inhibited. In the example of FIG. 22, since the use region is restricted such that the beam array of 8×8 beams is divided into two beam arrays each of 4×8 (½ of 8×8) beams, the number of times of shots for writing the same area increases twice.

Figure 26:
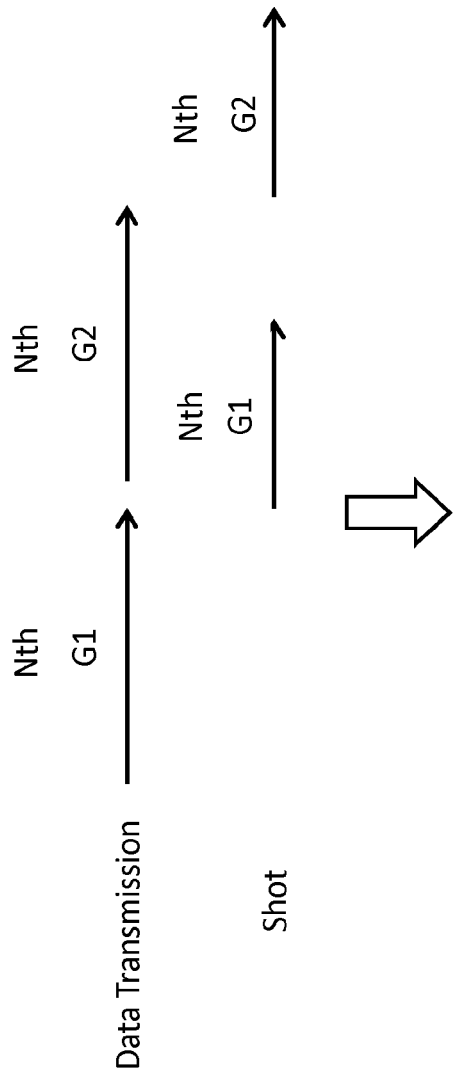
FIGS. 26A and 26B show examples of a time chart according to the third embodiment and a comparative example.
Figure 26:
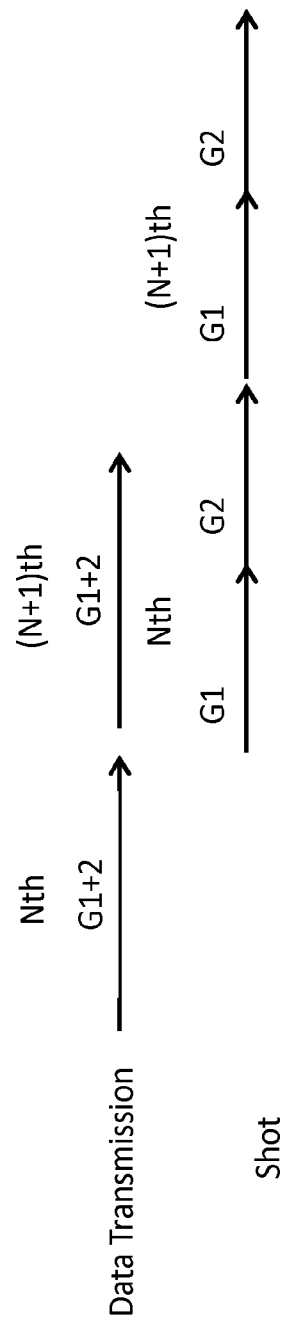

FIGS. 26A and 26B show examples of a time chart according to the third embodiment and a comparative example. As a comparative example, FIG. 26A shows an example of data transmission time and shot time in the case of simply dividing one shot into two shots of a group G1 shot and a group G2 shot. As the third embodiment, FIG. 26B shows an example of data transmission time and shot time in the case of collectively transmitting the ON/OFF control signals (shot data) of the same shot, and performing irradiation while shifting the irradiation timing for each group. In the comparative example, since one shot is simply divided into two shots, as shown in FIG. 26A, the exposure time simply becomes twice the one in the high-speed writing mode shown in FIG. 15A. On the other hand, in the high-accuracy writing mode according to the third embodiment, as shown in FIG. 26B, the shot cycle can be approximately half by collectively transmitting data and performing writing while shifting the irradiation timing.

Figure 27A:
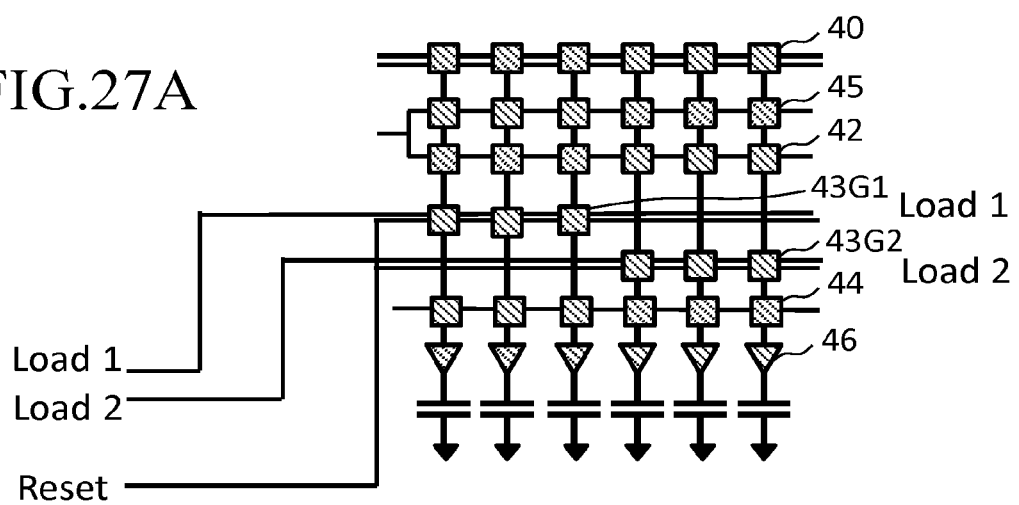
FIGS. 27A and 27B are conceptual diagrams showing another example of the internal configuration of an individual blanking control circuit according to the third embodiment.
Figure 27B:
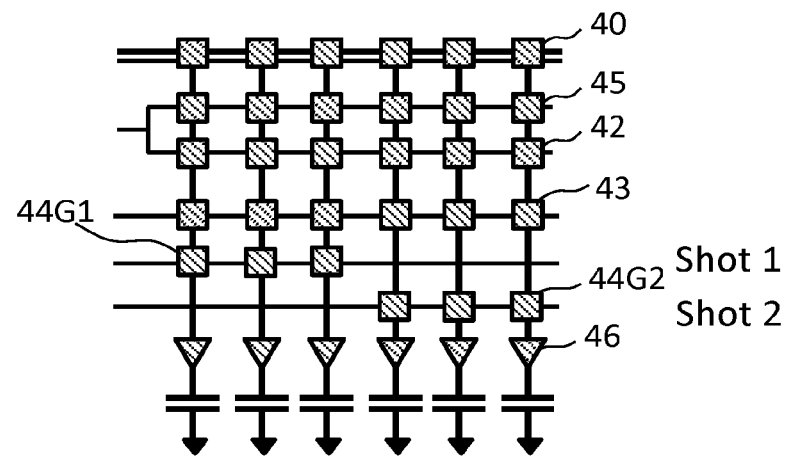

FIGS. 27A and 27B are conceptual diagrams showing another example of the internal configuration of an individual blanking control circuit according to the third embodiment. The example described above, as shown in FIG. 27A, explains the case where grouping is performed by the register 43 such as the register 43 G1 and the register 43 G2, but it is not limited thereto. It is also preferable to group the counter 44 into the counter 44 G1 and the counter 44 G2 as shown in FIG. 27B, and to output shot signals, such as a shot 1 and a shot 2, to the counter 44 in a corresponding group.

As described above, according to the third embodiment, the total beam current amount can be reduced without increasing the data transmission amount. Therefore, it is possible to inhibit the Coulomb effect while inhibiting throughput degradation of the multi-beam writing. Accordingly, so-called blurring and/or positional deviation of an image of multiple beams due to the Coulomb effect can be avoided or reduced. Furthermore, focal deviation resulting from having changed the number of beams can be suppressed, and therefore, higher writing accuracy can be acquired.

Fourth Embodiment

Although the third embodiment describes the case where the counter 44 is mounted in the blanking aperture array mechanism 204, and the irradiation time of an individual beam is controlled by the counter 44 in the individual blanking mechanism 47, it is not limited thereto. A fourth embodiment describes the case of controlling the irradiation time of an individual beam by using a common blanking mechanism.

The configuration of a writing apparatus according to the fourth embodiment may be the same as that of FIG. 18. The flowchart showing main steps of a writing method according to the fourth embodiment is the same as that of FIG. 21. The contents of the fourth embodiment are the same as those of the third embodiment except what is particularly described below.

Figure 28:
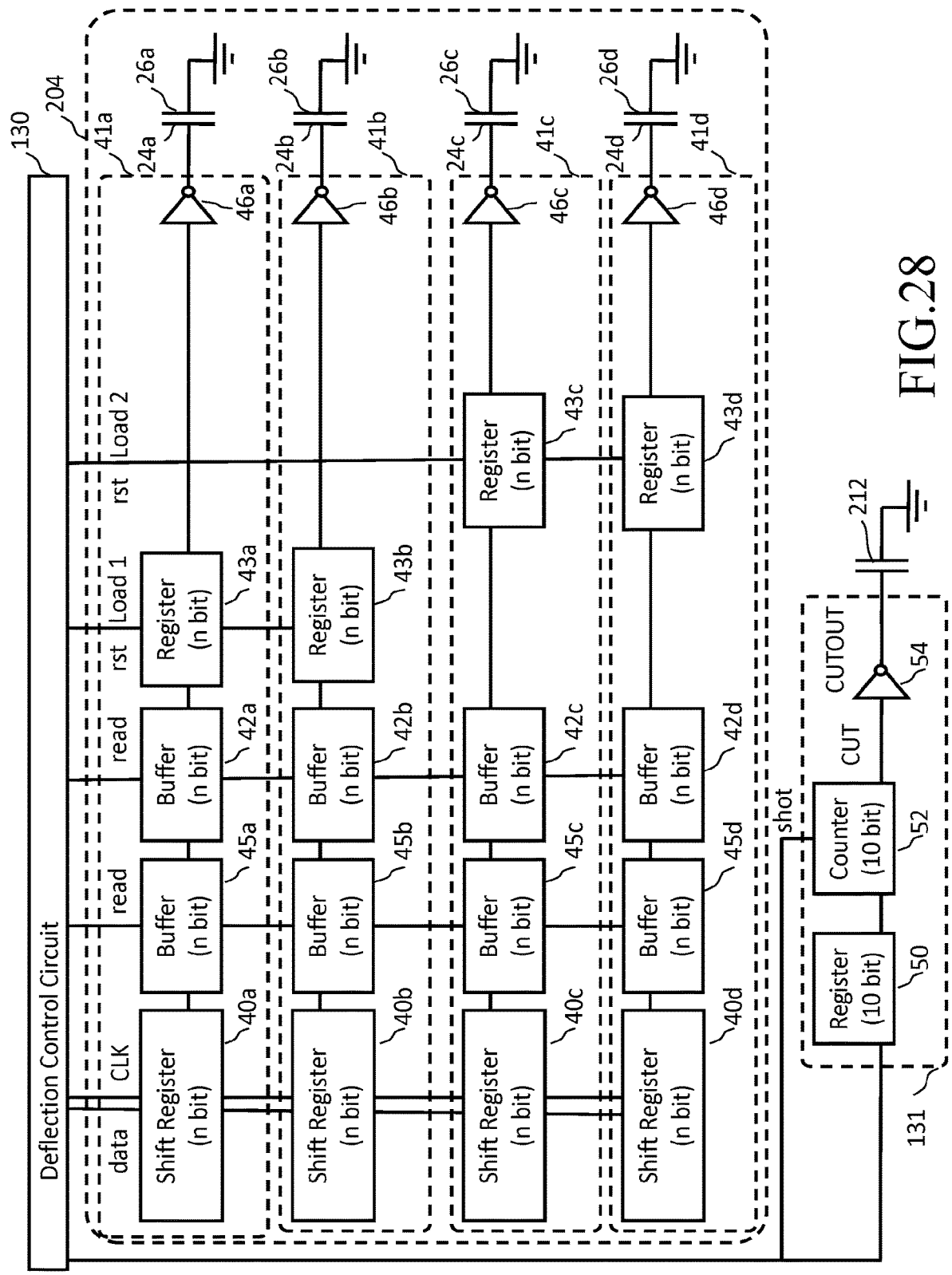
FIG. 28 is a schematic diagram showing the internal configuration of an individual blanking control circuit and a common blanking control circuit according to a fourth embodiment.

FIG. 28 is a schematic diagram showing the internal configuration of an individual blanking control circuit and a common blanking control circuit according to the fourth embodiment. As shown in FIG. 28, in each control circuit 41 for individual blanking control disposed in the blanking aperture array mechanism 204 inside the body of the writing apparatus 100, there are arranged the shift register 40, the buffer register 45, the buffer register 42, the register 43, and the amplifier 46. Although, in the third embodiment, individual blanking control for each beam is controlled by a control signal of several bits (e.g., ten bits), it is controlled in the fourth embodiment by a control signal of one to three bits (e.g., one bit). That is, a one-bit control signal is input/output to/from the shift register 40, the buffer register 45, the buffer register 42, and the register 43. Since the information amount of the control signal is small, the installation area of the control circuit 41 can be made small. In other words, even when the control circuit 41 is disposed in the blanking aperture array mechanism 204 whose installation space is small, more beams can be arranged at a smaller beam pitch.

Moreover, in the logic circuit 131 for common blanking, there are disposed the register 50, the counter 52, and the common amplifier 54. These do not simultaneously perform several different controls, and therefore, it is sufficient to use one circuit to perform ON/OFF control. Accordingly, even when a circuit for a high speed response is arranged, no problem occurs with respect to restriction on the installation space and the current to be used in the circuit. Therefore, the common amplifier 54 operates at very high speed compared to the amplifier 46 that can be implemented in the blanking aperture array mechanism 204. The common amplifier 54 is controlled by a ten-bit control signal, for example. That is, for example, a ten-bit control signal is input/output to/from the register 50 and the counter 52.

According to the fourth embodiment, similarly to the second embodiment, blanking control of each beam is performed using both the beam ON/OFF control by each control circuit 41 for individual blanking control described above, and the beam ON/OFF control by the logic circuit 131 for common blanking control that collectively performs blanking control of all the multiple beams. Moreover, according to the fourth embodiment, similarly to the second embodiment, beam irradiation equivalent to one shot of a desired irradiation time is performed by dividing the maximum irradiation time of one shot into a plurality of sub irradiation time periods, and combining a plurality of divided shots based on a plurality of sub irradiation time periods.

The contents of each step up to calculating the irradiation time of each beam in the irradiation time data generating step (S120) are the same as those in the third embodiment. Next, similarly to the second embodiment, the shot data generation unit 60 processes an irradiation time indicated by irradiation time data of each pixel 36 into a plurality of divided shots. The maximum irradiation time Ttr of one shot is divided into n divided shots, which continuously irradiate the same position and each of which has a different irradiation time. First, a gray-scale level value Ntr is defined by dividing the maximum irradiation time Ttr by a quantization unit Δ (gray-scale level resolution). For example, when n=10, it is divided into ten divided shots. When defining the gray-scale level value Ntr by an n binary digits, the quantization unit Δ should be set in advance such that the gray-scale level value Ntr is 1023 (Ntr=1023). By this, as shown in FIG. 20, each of the n divided shots has one of the irradiation time of $2^{k'}\Delta$, where the digit number k' is one of 0 to 9 (k'=0 to 9). That is, one shot of the beam array is divided into a divided shot having the irradiation time tk' of 512Δ, a divided shot having the irradiation time tk' of 256Δ, a divided shot having the irradiation time tk' of 128Δ, a divided shot having the irradiation time tk' of 64Δ, a divided shot having the irradiation time tk' of 32Δ, a divided shot having the irradiation time tk' of 16Δ, a divided shot having the irradiation time tk' of 8Δ, a divided shot having the irradiation time tk' of 4Δ, a divided shot having the irradiation time tk' of 2Δ, and a divided shot having the irradiation time tk' of Δ.

Therefore, an arbitrary irradiation time t (=NΔ) for irradiating each pixel 36 can be defined by at least one combination of 512Δ ($=2^9\Delta$), 256Δ ($=2^9\Delta$), 128Δ ($=2^7\Delta$), 64Δ ($=2^6\Delta$), 32Δ ($=2^5\Delta$), 16Δ ($=2^4\Delta$), 8Δ ($=2^3\Delta$), 4Δ ($=2^2\Delta$), 2Δ ($=2^1\Delta$), Δ($=2^0\Delta$), and zero (0). When converting the gray-scale level value N of an arbitrary irradiation time t for irradiating each pixel 36 into a binary number, it is preferable to define to use a value of a possible larger number of digits.

The shot data generation unit 60 first calculates gray-scale level value N data being integers by dividing the irradiation time t acquired for each pixel 36 by a quantization unit Δ (gray-scale level resolution). The gray-scale level value N data is defined by a gray-scale level value from 0 to 1023, for example. The quantization unit Δ can be set variously, and, for example, it can be defined by 1 ns (nanosecond), etc. It is preferable that a value of 1 to 10 ns, for example, is used as the quantization unit Δ.

Next, the shot data generation unit 60 determines, for each pixel 36, whether to make each divided shot of a plurality of divided shots beam ON or beam OFF so that the total irradiation time of divided shots to be beam ON may be a combination equivalent to a calculated beam irradiation time. The irradiation time t acquired for each pixel 36 is defined by the equation (1) described above, using an integer $w_{k'}$ indicating either value 0 or 1, and an irradiation time $t_{k'}$ of the k'-th digit divided shot in n divided shots. The divided shot whose integer $w_{k'}$ is 1 can be determined to be ON, and the divided shot whose integer $w_{k'}$ is 0 (zero) can be determined to be OFF.

Next, the shot data generation unit 60 generates irradiation time array data of a divided shot for dividing one shot into a plurality of divided shots which continuously irradiate the same position and each of which has a different irradiation time. The shot data generation unit 60 generates, for each pixel 36, irradiation time array data of a divided shot to be applied to the pixel concerned.

In the data array processing step (S122), the array processing unit 62 processes irradiation time array data in order of shot of each beam. Here, in accordance with the writing sequence, the array processing unit 62 processes the order such that irradiation time array data of each pixel 36 is arranged in order of pixel 36 to be shot by the multiple beams 20 sequentially. Also, with respect to each divided shot in each shot, the array processing unit 62 processes the order such that the ON/OFF control signals are arranged in order of the shift registers 40 connected in series. The processed ON/OFF control signal is stored in the storage device 142.

The contents of each of the lens control value changing step (S140), the focus checking step (S142), the determining step (S144), and the lens control value correcting step (S146) are the same as those of the third embodiment.

In the data transfer step (S150), for each divided shot, the transfer processing unit 76 collectively transfers the ON/OFF control signals each for the divided shot concerned to the deflection control circuit 130. Then, for each divided shot, the deflection control circuit 130 collectively transmits the ON/OFF control signals each for each beam of the multiple beams 20 to the blanking aperture array mechanism 204 (blanking apparatus). Specifically, for each divided shot, the deflection control circuit 130 transmits, in a batch, the ON/OFF control signals to the control circuits 41 each for each beam of the blanking aperture array mechanism 204. In other words, the ON/OFF control signals for a plurality of groups G1 and G2 are transferred collectively.

In the writing step (S152), the writing mechanism 150 irradiates the writing substrate 101 with the multiple beams 20 in accordance with the ON/OFF control signal of each beam having been transferred in a batch, while changing the irradiation timing for each group obtained by grouping the multiple beams 20 into a plurality of groups by a plurality of individual blanking mechanisms 47 mounted in the blanking aperture array mechanism 204. Specifically, it operates as follows:

According to the fourth embodiment, individual blanking control for each beam is performed by an n-bit (e.g., one bit) control signal. In the fourth embodiment, p×q multiple beams 20 are grouped into a plurality of groups as shown in FIG. 22. For example, they are grouped into two groups of G1 in the left half and G2 in the right half. The registers 43 (storage devices) in the same group are connected with each other. In other words, a plurality of registers 43 (storage devices) disposed inside the substrate 31 perform grouping of the multiple beams 20 into a plurality of groups. In the example of FIG. 28, with respect to control circuits 41a to 41d for four beams arranged in the same row, where the shift registers 40 are connected in series, the registers 43a and 43b are connected as the same group G1, and the registers 43c and 43d are connected as the same group G2. Then, according to the fourth embodiment, a plurality of registers 43 (storage devices) arranged inside the substrate 31 output ON/OFF control signals, each stored in the register 43 concerned, to the corresponding amplifiers 46 (switching circuits) while shifting the timing for each group. Hereinafter, it will be described specifically.

Figure 29:
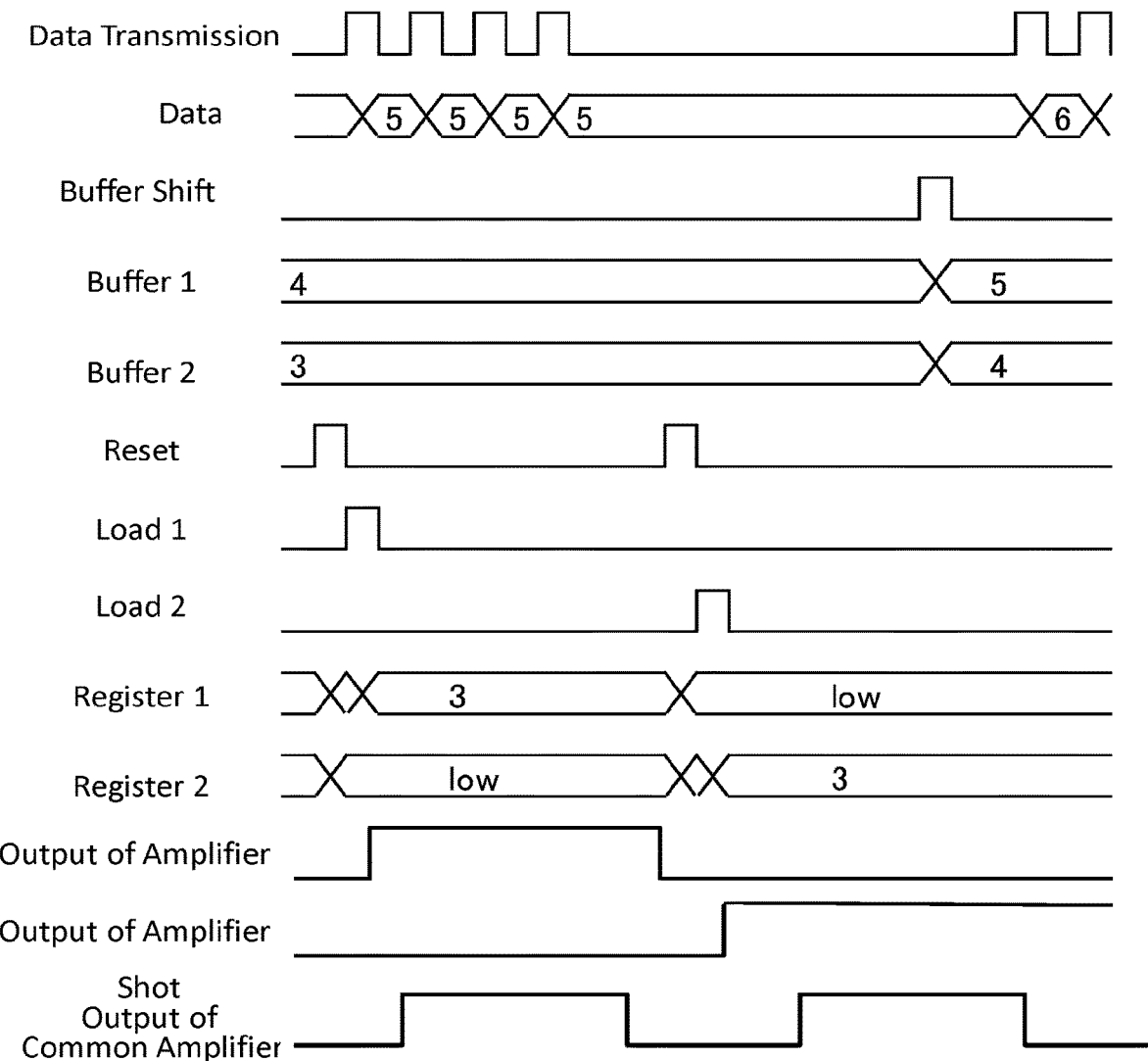
FIG. 29 shows transfer processing of an ON/OFF control signal for multiple beams and operations in a control circuit according to the fourth embodiment.

FIG. 29 shows transfer processing of an ON/OFF control signal for multiple beams and operations in a control circuit according to the fourth embodiment. As described above, according to the fourth embodiment, there are serially connected the shift registers 40a, 40b, 40c, 40d, and so on for p beams in the same row, for example, in the p×q multiple beams 20. Therefore, in one shot of the multiple beams, there are one bit ON/OFF control signals grouped for each row of the multiple beams, where the number of the grouped ON/OFF control signals is the number of beams of each column of the multiple beams. Such data group is transmitted in a batch to the blanking aperture array mechanism 204 from the deflection control circuit 130, for each divided shot of the multiple beams. For example, the data groups are collectively transferred in parallel. As shown in FIG. 29, when the ON/OFF control signals for the (k+2)th divided shot are transmitted in a batch, the ON/OFF control signal for each beam is stored in the corresponding shift register 40 by p clock signals, for example. The example of FIG. 29 shows the case where the ON/OFF control signals for the fifth divided shot (k'=fifth digit divided shot) are collectively transmitted. In the case of FIG. 29, the ON/OFF control signals for four beams are stored in the corresponding shift registers 40a, 40b, 40c, and 40d by four clock signals.

The ON/OFF control signals for the (k+1)th divided shot have been stored in the buffer register 45a (buffer 1) for each beam at the time when the ON/OFF control signals for the (k+2)th divided shot are being transmitted in a batch. Moreover, at the same time, the ON/OFF control signals for the k-th divided shot have been stored in the buffer register 42a (buffer 2) for each beam. In the case of FIG. 29, the ON/OFF control signals for the fourth divided shot (k'=sixth digit divided shot), being the last (previous, most recent) divided shot, haven been stored in the buffer register 45a (buffer 1) for each beam at the time when the ON/OFF control signals for the fifth divided shot (k'=fifth digit divided shot) are being transmitted in a batch.
The ON/OFF control signals for the third divided shot (k'=seventh digit divided shot), being the last-but-one divided shot, have been stored in the buffer register 42a (buffer 2) for each beam.

While the ON/OFF control signals for the (k+2)th divided shot are being transmitted in a batch, a reset signal is output to each register 43 and register 50 from the deflection control circuit 130. Thereby, the ON/OFF control signals stored in the registers 43 for all the beams are eliminated. Similarly, the ON/OFF control signals stored in the registers 50 for common blanking are eliminated.

Next, firstly, the deflection control circuit 130 outputs a read 1 signal (load 1) of the group 1 to the register 43 of the group 1. Accordingly, the ON/OFF control signal for the k-th divided shot stored in the buffer register 42a (buffer 2) is read into the register 43a (register 1) of the group 1. On the other hand, since the register 43c (register 2) of the group 2 has been in a reset state, the ON/OFF control signal for the divided shot is not read. Therefore, in such a state, the ON/OFF control signals for the k-th divided shot (the third divided shot in the example of FIG. 29) have been stored only in the registers 43 (register 1) of the group 1. Thereby, the amplifier 46 for each beam switches the electric potential to be applied to the control electrode 24, in accordance with the ON/OFF control signal stored in the register 43 for the beam concerned. For example, if the ON/OFF control signal is "1", an H electric potential (active potential) is input to the CMOS inverter circuit. By this, the output of the CMOS inverter circuit becomes a ground potential, thereby becoming a beam ON condition. For example, if the ON/OFF control signal is "0", an L electric potential is input to the CMOS inverter circuit. By this, the output of the CMOS inverter circuit becomes a positive potential, thereby becoming a beam OFF condition.

Moreover, at the same time, the deflection control circuit 130 outputs a common ON/OFF control signal indicating the irradiation time of the k-th divided shot to the register 50 of the logic circuit 131 of the common blanking mechanism. Thereby, the common ON/OFF control signal for the k-th divided shot is read into the register 50 for common blanking.

Next, the deflection control circuit 130 outputs a first shot signal (for group 1) to the counter circuit 52 of the logic circuit 131 in the common blanking mechanism. Accordingly, the counter 44 for common blanking outputs a beam ON signal to the common amplifier 54 only during the time indicated by the common ON/OFF control signal stored in the register 50 for common blanking. Specifically, the number of counts equivalent to the irradiation time of the current divided shot is counted at the clock cycle. Then, only during the counting, the input of the CMOS inverter circuit (not shown) is made to be H (active). After the time indicated by the common ON/OFF control signal has passed, a beam OFF signal is output to the common amplifier 54. Specifically, after completing the counting, the input of the CMOS inverter circuit is made to be L.

Here, for the k-th divided shot, the amplifier 46 for the beam of the group 1 has already applied a deflection electric potential for beam ON or beam OFF to the control electrode 24, in accordance with the ON/OFF control signal. On the other hand, the amplifier 46 for the beam of the group 2 has already applied a deflection electric potential (positive potential) for beam OFF to the control electrode 24. In such a state, the irradiation time of the current divided shot is controlled by the deflector 212 for common blanking. That is, only while the counter 44 is outputting a beam ON signal, all the multiple beams 20 can pass through the opening of the limiting aperture substrate 206 without being blanking-deflected. In contrast, during the other time period, all the multiple beams 20 are blanking-deflected and blocked by the limiting aperture substrate 206. Thereby, the k-th divided shot (shot k1) of the group 1 is executed.

When the divided shots (shot 1) of the group 1 have been completed, the deflection control circuit 130 outputs a reset signal to each register 43. By this, the ON/OFF control signals stored in the registers 43 for all the beams are eliminated.

Next, the deflection control circuit 130 outputs a read 2 signal (load 2) of the group 2 to the register 43 of the group 2. Accordingly, the ON/OFF control signal for the k-th divided shot stored in the buffer register 42c (buffer 2) is read into the register 43c (register 2) of the group 2. On the other hand, since the registers 43 (register 1) of the group 1 have been in a reset state, the ON/OFF control signal for the divided shot is not read. Therefore, in such a state, the ON/OFF control signal for the k-th divided shot (the third shot in the example of FIG. 29) has been stored only in the register 43c (register 2) of the group 2. Thereby, the amplifier 46 for each beam switches the electric potential to be applied to the control electrode 24, in accordance with the ON/OFF control signal stored in the register 43 for the beam concerned. For example, if the ON/OFF control signal is "1", an H electric potential (active potential) is input to the CMOS inverter circuit. By this, the output of the CMOS inverter circuit becomes a ground potential, thereby becoming a beam ON condition. For example, if the ON/OFF control signal is "0", an L electric potential is input to the CMOS inverter circuit. By this, the output of the CMOS inverter circuit becomes a positive potential, thereby becoming a beam OFF condition.

Moreover, at the same time, the deflection control circuit 130 outputs a common ON/OFF control signal indicating the irradiation time of the k-th divided shot to the register 50 of the logic circuit 131 of the common blanking mechanism. Thereby, the common ON/OFF control signal for the k-th divided shot is read into the register 50 for common blanking.

Next, the deflection control circuit 130 outputs a second shot signal (for group 2) to the counter circuit 52 of the logic circuit 131 in the common blanking mechanism. Accordingly, the counter 44 for common blanking outputs a beam ON signal to the common amplifier 54 only during the time indicated by the common ON/OFF control signal stored in the register 50 for common blanking. After the time indicated by the common ON/OFF control signal has passed, a beam OFF signal is output to the common amplifier 54.

Here, for the k-th divided shot, the amplifier 46 for the beam of the group 2 has already applied a deflection electric potential for beam ON or beam OFF to the control electrode 24, in accordance with the ON/OFF control signal. On the other hand, the amplifier 46 for the beam of the group 1 has already applied a deflection electric potential (positive potential) for beam OFF to the control electrode 24. In such a state, the irradiation time of the current divided shot is controlled by the deflector 212 for common blanking. That is, only while the counter 44 is outputting a beam ON signal, all the multiple beams 20 can pass through the opening of the limiting aperture substrate 206 without being blanking-deflected. In contrast, during the other time period, all the multiple beams 20 are blanking-deflected and blocked by the limiting aperture substrate 206. Thereby, the k-th divided shot (shot k2) of the group 2 is executed.

As described above, in the fourth embodiment, as in the third embodiment, a plurality of CMOS inverter circuits (amplifiers 46) (an example of a switching circuit) for the multiple beams 20 are arranged inside the substrate 31, individually connected to a plurality of registers 43, and each switches the electric potential of binary values, in accordance with the ON/OFF control signal stored in the corresponding register 43. Then, during the ON/OFF control signal being transmitted, the CMOS inverter circuit continuously performs shots k1 and k2 of each group while shifting the irradiation timing.

After the load 2 signal has been output and the ON/OFF control signals for the (k+2)th divided shot have been transmitted in a batch, the deflection control circuit 130 outputs buffer shift signals to the buffer registers 45 and 42. By this, the ON/OFF control signals for the (k+2)th divided shot stored in the shift registers 40 are shifted to the buffer registers 45 (buffer 1) each for each beam. Simultaneously, the ON/OFF control signals for the (k+1)th divided shot stored in the buffer registers 45 are shifted to the buffer registers 42 (buffer 2) each for each beam.

After the buffer shift signals have been output, ON/OFF control signals for the next (k+3)th divided shot are begun to be transmitted in a batch. Hereinafter, it is repeated similarly. Thus, storage devices, such as the shift registers 40, the buffer registers 45, the buffer registers 42, and the registers 43 are arranged inside the substrate 31, and temporarily store the respective ON/OFF control signals for the multiple beams 20 having been transmitted in a batch. Specifically, a plurality of registers 43 (storage device) for the multiple beams 20 perform grouping of the multiple beams 20, and temporarily store the respective ON/OFF control signals for the multiple beams 20 having been transmitted in a batch.

FIG. 29 illustrates the case where the current divided shot is performed while data transmission for the divided shot after the next one is being performed using the two buffer registers 45 and 42. However, it is not limited thereto. It is also preferable that the current divided shot is performed while data transmission for the next divided shot is being performed using the one buffer register 42.

As described above, according to the fourth embodiment, it is not necessary to divide data transmission for each group. Therefore, degradation of the throughput can be inhibited. Moreover, according to the fourth embodiment, the ON/OFF control signal to be transmitted has no information to identify the group for which the timing of divided shot should be shifted. Nonetheless, as shown in FIGS. 28 and 29, by the circuit configuration in the blanking aperture array mechanism 204, beam irradiation is performed while shifting the timing of divided shot for each group, based on data having been transmitted as the same divided shot. Thereby, it becomes unnecessary to define special information for the ON/OFF control signal. Moreover, according to the fourth embodiment, it is not necessary to perform controlling while particularly identifying beam groups by the control mechanism, such as the control computer 110 and the deflection control circuit 130.

Figure 30:
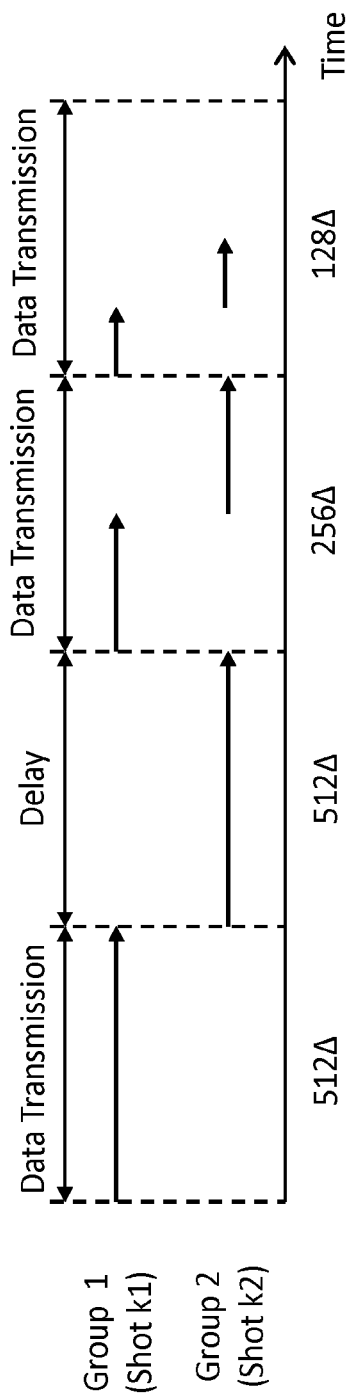
FIG. 30 shows an example of a relation between data transmission time and divided shot time according to the fourth embodiment.

FIG. 30 shows an example of a relation between data transmission time and divided shot time according to the fourth embodiment. Since the control circuit 41 of the individual blanking mechanism 47 is controlled by a 1-bit to 3-bit (e.g., 1-bit) control signal in the fourth embodiment, it is possible to shorten data transmission time of each divided shot. Therefore, as shown in FIG. 30, with respect to a divided shot whose irradiation time is longer (e.g., a divided shot having the irradiation time of 512Δ) in n divided shots, the case occurs where divided shots of all the groups cannot be completed within data transmission time. On the other hand, with respect to a divided shot whose irradiation time is shorter (e.g., a divided shot having the irradiation time of 128Δ or below), divided shots of three or more groups (in the case of FIG. 30, four or more groups) can be performed within data transmission time. Therefore, in the fourth embodiment, writing time takes longer by one divided shot, for example, than the total time of n divided shots. However, since it is sufficient for data transmission to be performed once for each divided shot, delay time of writing time can be kept minimum.

As described above, according to the fourth embodiment, the total beam current amount can be reduced without increasing the data transmission amount. Therefore, it is possible to inhibit the Coulomb effect while inhibiting throughput degradation of the multi-beam writing. Accordingly, so-called blurring and/or positional deviation of an image of multiple beams due to the Coulomb effect can be avoided or reduced. Furthermore, focal deviation resulting from having changed the number of beams can be suppressed, and therefore, higher writing accuracy can be acquired.

Embodiments have been explained referring to specific examples described above. However, the present invention is not limited to these specific examples. Although the above examples describe the case where a shot or a plurality of divided shots is performed once for each pixel, it is not limited thereto. Further, it is also preferable to perform multiple writing of L passes. For example, a shot or a plurality of divided shots may be performed for each pass of multiple (L) pass writing.

In negative resist, since a region irradiated by a beam remains as a resist pattern, not only a substantial pattern but also a region where no substantial pattern exists is written. Therefore, preferably, the number of groups is set to be one for a region where no substantial pattern exists (where low dimensional accuracy is acceptable), and to be two or more for a region where a substantial pattern exists (where high dimensional accuracy is required).

The number of beams of each group may not be the one obtained by dividing the number of all the beams by the number of groups. For example, in FIGS. 12A to 12D, the use region being the beam array of 4×4 beams may be changed to the one of 6×6 beams. In that case, the register for the beam array outside the use region cannot maintain all the data of the beam array in the use region. However, data of the beam array which cannot be maintained therein can be newly transmitted to the register for the beam array in the use region, together with data d in the register for the beam array outside the use region.

Moreover, in the examples described above, although the register is used as a storage device, such as the buffer register 45, the buffer register 42, and the register 43, it is not limited thereto. A memory can be used instead of the register.

While the apparatus configuration, control method, and the like not directly necessary for explaining the present invention are not described, some or all of them can be appropriately selected and used on a case-by-case basis when needed. For example, although description of the configuration of the control unit for controlling the writing apparatus 100 is omitted, it should be understood that some or all of the configurations of the control unit can be selected and used appropriately when necessary.

In addition, any other multi-charged particle beam writing apparatus and multi-charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-charged particle beam writing apparatus comprising:
   a region setting circuit configured to set, as an irradiation region for a beam array to be used, a region of a central portion of an irradiation region for all of multiple beams of charged particle beams implemented to be emittable by a multiple beam irradiation mechanism;
   a writing mechanism that includes the multiple beam irradiation mechanism, configured to write a pattern on a target object with the beam array in the region of the central portion having been set in the multiple beams implemented; and
   a shot cycle calculation circuit configured to calculate a shot cycle time based on the region of said central portion having been set in the irradiation region of the all of the multiple beams,
   wherein the writing mechanism writes the pattern on the target object based on the shot cycle time calculated.

2. The apparatus according to claim 1 further comprising:
   an electromagnetic lens configured to refract the multiple beams;
   a lens control circuit configured to control the electromagnetic lens, using a lens control value; and
   a storage device configured to store a table defining the lens control value for controlling the electromagnetic lens, and related to a number of beams to be used in the multiple beams,
   wherein, referring to the table, the lens control circuit changes the lens control value based on the number of beams of the beam array in the region having been set.

3. The apparatus according to claim 1, wherein
   the multiple beams being emittable is divided into effective column multiple beams composed of a plurality of beam columns on a central side, and ineffective column multiple beams composed of beam columns located on both end sides of the effective column multiple beams, and
   irradiation time data of beam OFF is always generated as irradiation time data of beams located on both end sides of each beam column of the plurality of beam columns in the effective column multiple beams on the central side.

4. A multi-charged particle beam writing method comprising:
   setting, as an irradiation region of a beam array to be used, a region of a central portion of an irradiation region of all of multiple beams of charged particle beams implemented to be emittable by a multiple beam irradiation mechanism;
   writing a pattern on a target object with the beam array in the region of the central portion having been set in the multiple beams implemented; and
   calculating a shot cycle time based on the region of said central portion having been set in the irradiation region of the all of the multiple beams,
   wherein the pattern is written on the target object based on the shot cycle time calculated.

* * * * *